US012763117B2

(12) United States Patent
Lee et al.

(10) Patent No.: US 12,763,117 B2
(45) Date of Patent: Oct. 13, 2026

(54) IMPEDANCE CALIBRATION CIRCUITS AND SEMICONDUCTOR MEMORY DEVICES INCLUDING THE SAME

(71) Applicant: Samsung Electronics Co., Ltd., Suwon-si (KR)

(72) Inventors: Junha Lee, Suwon-si (KR); Kyoungtae Kang, Suwon-si (KR); Jehoon Kim, Suwon-si (KR); Dongho Shin, Suwon-si (KR); Kangyoon Lee, Seoul (KR)

(73) Assignees: Samsung Electronics Co., Ltd., Suwon-si (KR); Research & Business Foundation Sungkyunkwan University, Suwon-si (KR)

( * ) Notice: Subject to any disclaimer, the term of this patent is extended or adjusted under 35 U.S.C. 154(b) by 25 days.

(21) Appl. No.: 18/936,744

(22) Filed: Nov. 4, 2024

(65) Prior Publication Data

US 2025/0239280 A1 Jul. 24, 2025

(30) Foreign Application Priority Data

Jan. 19, 2024 (KR) ........................ 10-2024-0008511

(51) Int. Cl.
*H03K 19/00* (2006.01)
*G11C 7/10* (2006.01)

(52) U.S. Cl.
CPC ....... *G11C 7/1048* (2013.01); *H03K 19/0005* (2013.01); *G11C 2207/2254* (2013.01)

(58) Field of Classification Search
CPC ............. H03K 19/0005; H03K 19/017; H03K 19/01721; H03K 19/0175; H03K 19/017545; H03K 19/019557
See application file for complete search history.

(56) References Cited

U.S. PATENT DOCUMENTS

| | | | | |
|---|---|---|---|---|
| 7,528,626 | B2 | 5/2009 | Kim | |
| 7,626,416 | B2 | 12/2009 | Kim | |
| 8,004,308 | B2 | 8/2011 | Santurkar et al. | |
| 9,825,631 | B1 * | 11/2017 | Cho | G11C 29/021 |
| 10,020,808 | B2 | 7/2018 | Jang | |
| 10,347,358 | B2 | 7/2019 | Kim et al. | |
| 10,497,412 | B2 | 12/2019 | Lee et al. | |
| 11,088,676 | B1 * | 8/2021 | Lee | H03K 19/0005 |
| 11,115,021 | B2 * | 9/2021 | Kim | G11C 7/1084 |
| 11,482,262 | B1 | 10/2022 | Lee et al. | |

(Continued)

*Primary Examiner* — Jason M Crawford
(74) *Attorney, Agent, or Firm* — Fish & Richardson P.C.

(57) ABSTRACT

An impedance calibration circuit includes a calibration controller and a calibration circuit. The calibration controller generates a calibration enable signal based on an impedance calibration command. The calibration circuit, connected to an external resistor through an impedance pad, generates, in response to the calibration enable signal, a first reference voltage code when a voltage level of a selected reference voltage becomes the same as a first voltage of a first node, coupled to the impedance pad. The calibration circuit generates a pull-up control code based on the first reference voltage code, generates a second reference voltage code when the voltage level of the selected reference voltage becomes the same as a second voltage of a second node, and generates a pull-down control code based on the second reference voltage code.

18 Claims, 31 Drawing Sheets

(56) References Cited

U.S. PATENT DOCUMENTS

| | | | | |
|---|---|---|---|---|
| 12,518,808 | B2 * | 1/2026 | Park | G11C 7/1048 |
| 2013/0182513 | A1 * | 7/2013 | Eom | G11C 7/1057 365/189.09 |
| 2015/0270010 | A1 * | 9/2015 | Kang | G11C 29/022 365/185.22 |
| 2016/0359484 | A1 * | 12/2016 | Fujisawa | G11C 29/028 |
| 2017/0162238 | A1 * | 6/2017 | Lee | G11C 29/021 |
| 2021/0242870 | A1 * | 8/2021 | Kim | G11C 7/1057 |
| 2022/0148630 | A1 * | 5/2022 | Kavala | H03K 19/0005 |
| 2022/0165321 | A1 * | 5/2022 | Seo | G11C 7/04 |
| 2024/0223187 | A1 * | 7/2024 | Lee | H03K 19/01721 |
| 2024/0290378 | A1 * | 8/2024 | Chung | G11C 11/4093 |
| 2025/0166677 | A1 * | 5/2025 | Jeong | G11C 7/1057 |
| 2025/0239280 | A1 * | 7/2025 | Lee | H03K 19/0005 |

* cited by examiner

BLKi

IMPEDANCE CALIBRATION CIRCUITS AND SEMICONDUCTOR MEMORY DEVICES INCLUDING THE SAME

CROSS-REFERENCE TO RELATED APPLICATION

This US application claims priority under 35 U.S.C. § 119 to Korean Patent Application No. 10-2024-0008511, filed on Jan. 19, 2024 in the Korean Intellectual Property Office, the disclosure of which is incorporated by reference herein in its entirety.

BACKGROUND

Example implementations described herein relate to memory devices, and more particularly, to impedance calibration circuits and semiconductor memory devices including the same.

As the operating speed of semiconductor memory devices has increased, swing width of signals interfaced between a semiconductor memory device and a memory controller has generally decreased. However, as swing width has decreased, signals transferred between the semiconductor memory device and the memory controller may be more easily distorted by impedance mismatch caused by process, voltage, and temperature (PVT) variations. An impedance calibration operation for adjusting output impedance and/or a termination impedance of the semiconductor memory device may be employed at transmitting and/or receiving stages of the semiconductor memory device. The impedance calibration operation may be referred to as an input/output (I/O) offset cancellation operation or a ZQ calibration operation.

SUMMARY

Some examples provide an impedance calibration circuit capable of increasing operating speed.

Some example implementations provide a semiconductor memory device that includes an impedance calibration circuit capable of increasing operating speed.

According to some examples, an impedance calibration circuit includes a calibration controller and a calibration circuit. The calibration controller receives an impedance calibration command and generates a calibration enable signal based on the impedance calibration command. The calibration circuit is connected to an external resistor provided in a board through an impedance pad, and, in response to the calibration enable signal, generates a first reference voltage code when a voltage level of a selected reference voltage becomes the same as a first voltage of a first node coupled to the impedance pad by comparing the first voltage with the selected reference voltage, generates a pull-up control code for driving the first node based on the first reference voltage code, generates a second reference voltage code when the voltage level of the selected reference voltage becomes the same as a second voltage of a second node by comparing the second voltage with the selected reference voltage, and generates a pull-down control code for driving the second node based on the second reference voltage code.

According to some examples, a semiconductor memory device includes an external resistor provided in a board and a plurality of memory dies mounted on the board and commonly connected to the external resistor. Each of the plurality of memory dies includes an impedance calibration circuit connected to the external resistor through an impedance pad. The impedance calibration circuit, in response to an impedance calibration command, by generating a first reference voltage code when a voltage level of a selected reference voltage becomes the same as a first voltage of a first node coupled to the impedance pad by comparing the first voltage with the selected reference voltage, generating a pull-up control code for driving the first node based on the first reference voltage code, generating a second reference voltage code when the voltage level of the selected reference voltage becomes the same as a second voltage of a second node by comparing the second voltage with the selected reference voltage, and generating a pull-down control code for driving the second node based on the second reference voltage code.

According to some examples, an impedance calibration circuit includes a calibration controller and a calibration circuit. The calibration controller receives an impedance calibration command and generates a calibration enable signal based on the impedance calibration command. The calibration circuit is connected to an external resistor provided in a board through an impedance pad, and, in response to the calibration enable signal, generates a first reference voltage code when a voltage level of a selected reference voltage becomes the same as a first voltage of a first node coupled to the impedance pad by comparing the first voltage with the selected reference voltage, generates a pull-up control code for driving the first node based on the first reference voltage code, generates a second reference voltage code when the voltage level of the selected reference voltage becomes the same as a second voltage of a second node by comparing the second voltage with the selected reference voltage, and generates a pull-down control code for driving the second node based on the second reference voltage code. The calibration circuit includes a pull-down driver that is coupled between the first node and a ground voltage, and drives the first node with the first voltage based on the initial pull-down control code, a first comparator circuit that generates a comparison signal by comparing the first voltage with the selected reference voltage, a reference voltage generator that generates a plurality of reference voltages and a control/code generation circuit. The control/code generation circuit selects the selected reference voltage from among the plurality of reference voltages, generates the first reference voltage code based on the first comparison signal, generates the pull-down control code based on the first reference voltage code and provides the pull-down control code to the pull-down driver.

Accordingly, the impedance calibration circuit generates a reference voltage code by constituting a reference voltage loop that excludes a ZQ node coupled to an external resistor and generates a pull-up control code and a pull-down control code based on the reference voltage code. Therefore, RC load of the ZQ node is not associated with an impedance calibration operation and thus, operating speed of the impedance calibration circuit does not decrease even when a number of the memory dies increases.

BRIEF DESCRIPTION OF THE DRAWINGS

The above and other features of the present disclosure will be more clearly understood by describing in detail example implementations thereof with reference to the accompanying drawings.

DETAILED DESCRIPTION

Figure 1:
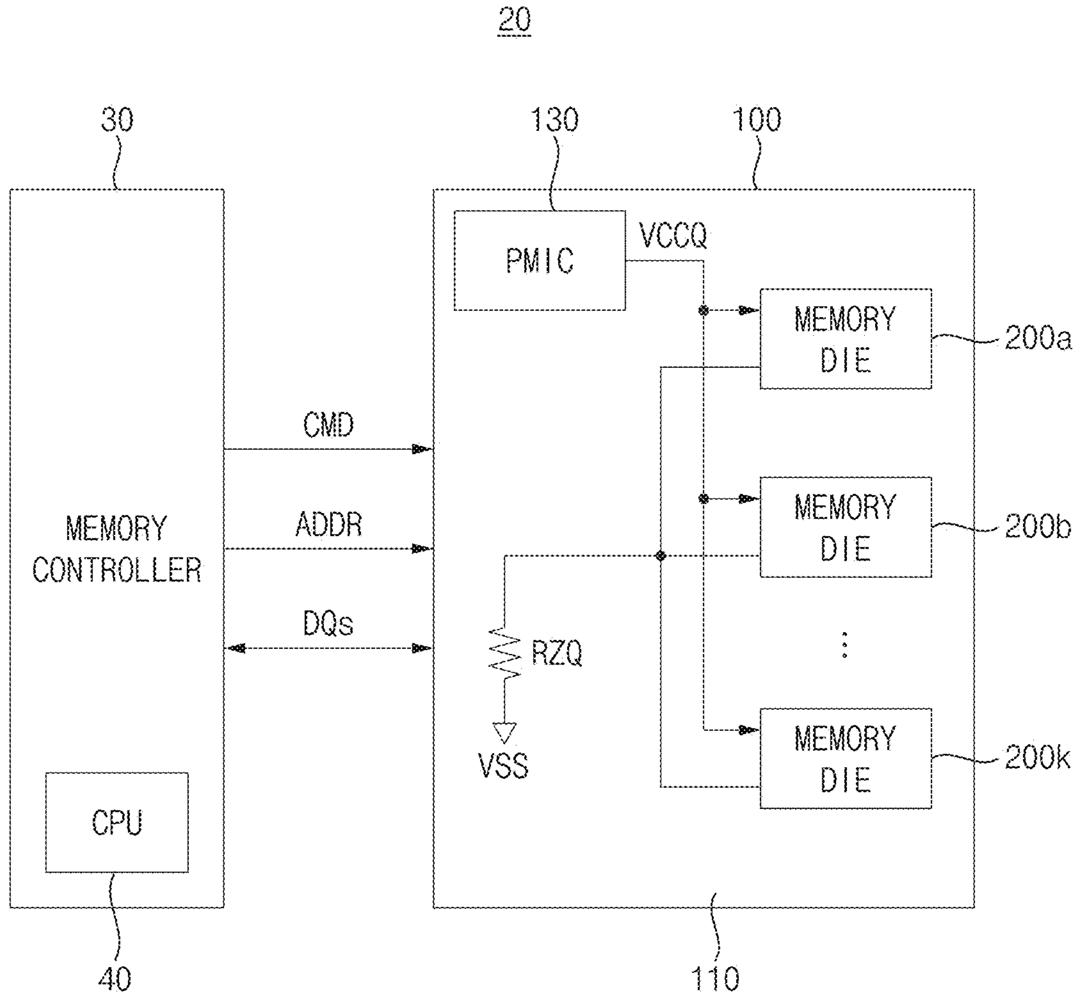
FIG. 1 is a block diagram illustrating a memory system according to example implementations.

Example implementations of the present disclosure will be described more fully hereinafter with reference to the accompanying drawings. Like reference numerals may refer to like elements throughout this application.

FIG. 1 is a block diagram illustrating a memory system according to example implementations.

Referring to FIG. 1, a memory system 20 may include a memory controller 30 and a semiconductor memory device 100. The semiconductor memory device 100 may include a plurality of memory dies 200*a*, 200*b*, . . . , 200*k* (which are denoted as 200*a*~200*k*, hereinafter), where k is an integer greater than two. In example implementations, each of the memory dies 200*a*~200*k* may be referred to as a memory chip.

The memory controller 30 may control an overall operation of the memory system 20. The memory controller 30 may control an overall data exchange between an external host and the plurality of memory dies 200*a*~200*k*. For example, the memory controller 30 may write data in the plurality of memory dies 200*a*~200*k* or read data from the plurality of memory dies 200*a*~200*k* in response to a request from the host. In addition, the memory controller 30 may issue operation commands to the plurality of memory dies 200*a*~200*k* for controlling the plurality of memory dies 200*a*~200*k*.

The memory controller 30 may transmit, to the memory dies 200*a*~200*k*, control signals such as a clock signal HCLK, a command CMD, an address ADDR, and data signals DQs. The memory controller 30 may also receive the data signals DQs from the memory dies 200*a*~200*k*. The memory controller 30 may transmit a write command, a read command, and an impedance calibration command to each of the memory dies 200*a*~200*k*. Each of the memory dies 200*a*~200*k* may perform a write operation in response to the write command, a read operation in response to the read command, and an impedance calibration operation in response to the impedance calibration command.

In example implementations, each of the plurality of memory dies 200*a*~200*k* may be a nonvolatile memory device. In example implementations, each of the plurality of memory dies 200*a*~200*k* may be a dynamic random access memory (DRAM), such as a double data rate synchronous dynamic random access memory (DDR SDRAM), a low power double data rate synchronous dynamic random access memory (LPDDR SDRAM), or the like.

The plurality of memory dies 200*a*~200*k* may be commonly connected to an external resistor RZQ provided (or, formed) in a board 110. The external resistor RZQ may be connected to a ground voltage VSS. In example implementations, the external resistor RZQ may be connected to a power supply voltage.

The semiconductor memory device 100 may further include a power management integrated circuit (PMIC) 130. The PMIC 130 may generate a power supply voltage VCCQ based on an input voltage (not illustrated) from the memory controller 30 and may provide the power supply voltage VCCQ to the memory dies 200*a*~200*k*.

The memory controller 30 may include a central processing unit (CPU) 40 to control operation of the memory controller 30.

The memory controller 30 may provide an impedance calibration command to each of the memory dies 200*a*~200*k*. Each of the memory dies 200*a*~200*k* may perform an impedance calibration operation in response to the impedance calibration command. Each of the memory dies 200*a*~200*k*, in response to the impedance calibration command, may perform the impedance calibration operation by generating a first reference voltage code when a voltage level of a selected reference voltage becomes the same as a first voltage, which is based on an initial pull-up control code, of a first node coupled to the impedance pad by comparing the first voltage with the selected reference voltage, generating a pull-up control code for driving the first node based on the first reference voltage code, generating a second reference voltage code when the voltage level of the selected reference voltage becomes the same as a second voltage, which is based on the pull-up control code, of a second node by comparing the second voltage with the selected reference voltage, and generating a pull-down control code for driving the second node based on the second reference voltage code.

Figure 2:
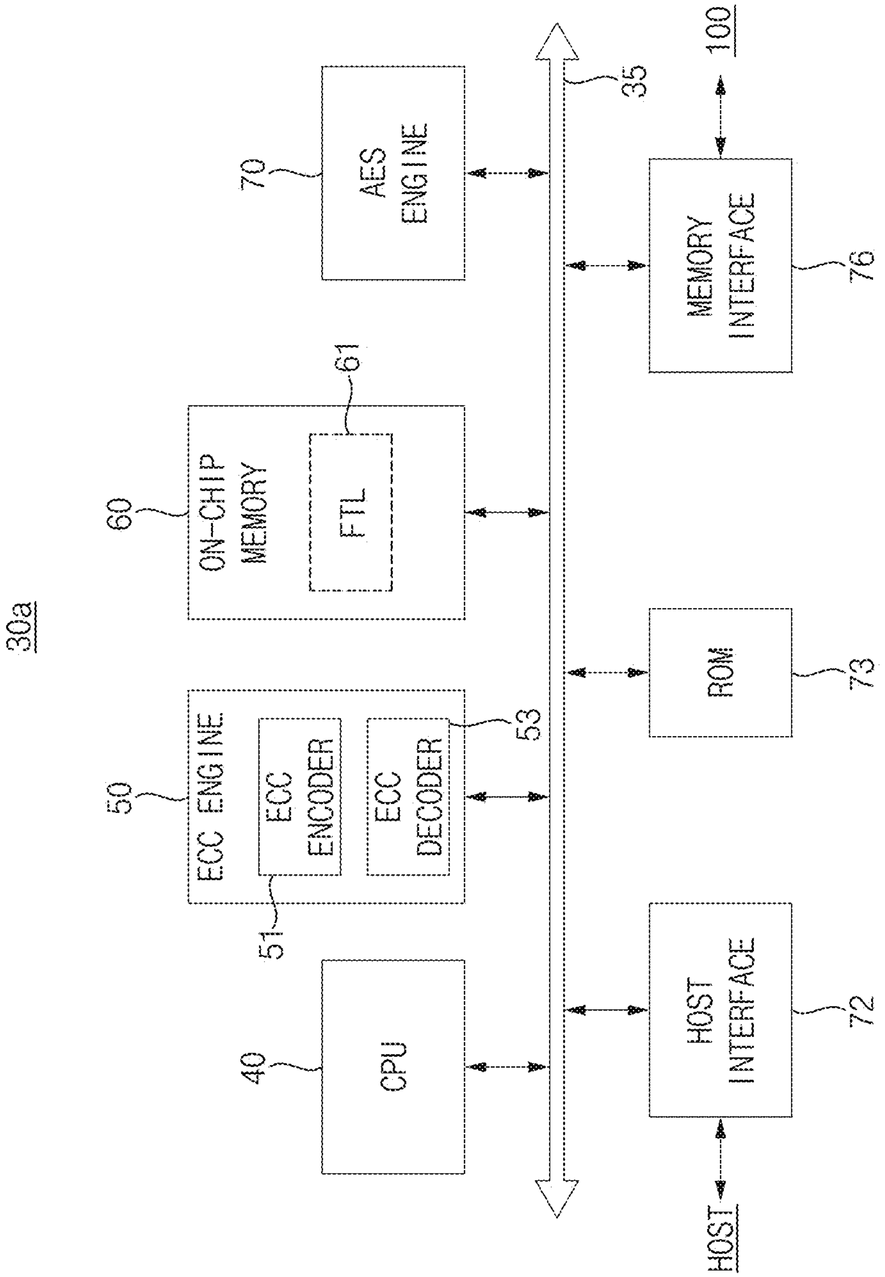
FIG. 2 is a block diagram illustrating an example of the memory controller in the memory system of FIG. 1 according to example implementations.

FIG. 2 is a block diagram illustrating an example of the memory controller in the memory system of FIG. 1 according to example implementations.

In FIG. 2, assuming that each of the memory dies 200*a*~200*k* in FIG. 1 is a nonvolatile memory device.

Referring to FIG. 2, a memory controller 30*a* may include the CPU 40, an error correction code (ECC) engine 50, an on-chip memory 60, an advanced encryption standard (AES) engine 70, a host interface 72, a ROM 73 and a memory interface 76 which are connected via a bus 35.

The CPU 40 may control an overall operation of the memory controller 30. The CPU 40 may control the ECC engine 50, the on-chip memory 60, the AES engine 70, the host interface 72, the ROM 73 and the memory interface 76. The CPU 40 may include one or more cores (e.g., a homogeneous multi-core or a heterogeneous multi-core). The CPU 40 may be or include, for example, at least one of an image signal processing unit (ISP), a digital signal processing unit (DSP), a graphics processing unit (GPU), a vision processing unit (VPU), and a neural processing unit (NPU). The CPU 40 may execute various application programs (e.g., a flash translation layer (FTL) 61 and firmware) loaded onto the on-chip memory 60.

The on-chip memory 60 may store various application programs that are executable by the CPU 40. The on-chip memory 60 may operate as a cache memory adjacent to the CPU 40. The on-chip memory 60 may store a command, an address, and data to be processed by the CPU 40 or may store a processing result of the CPU 40. The on-chip memory 60 may be, for example, a storage medium or a working memory including a latch, a register, a static random access memory (SRAM), a dynamic random access memory (DRAM), a thyristor random access memory (TRAM), a tightly coupled memory (TCM), etc.

The CPU 40 may execute the FTL 61 loaded onto the on-chip memory 60. The FTL 61 may be loaded onto the on-chip memory 60 as firmware or a program stored in the memory dies 200*a*~200*k*. The FTL 61 may manage mapping between a logical address provided from a host and a physical address of one of the memory dies 200*a*~200*k* and may include an address mapping table manager managing and updating an address mapping table. The FTL 61 may further perform a garbage collection operation, a wear leveling operation, and the like, as well as the address mapping described above. The FTL 61 may be executed by the CPU 40 for addressing one or more of the following aspects of the memory dies 200*a*~200*k*: overwrite- or in-place write-impossible, a life time of a memory cell, a limited number of program-erase (PE) cycles, and an erase speed slower than a write speed.

Memory cells of the memory dies 200*a*~200*k* may have the physical characteristic that a threshold voltage distribution varies due to causes, such as a program elapsed time, a temperature, program disturbance, read disturbance and etc. For example, data stored in the memory dies 200*a*~200*k* becomes erroneous due to the above causes.

The memory controller 30*a* may utilize a variety of error correction techniques to correct such errors. For example, the memory controller 30*a* may include the ECC engine 50. The ECC engine 50 may correct errors which occur in the data stored in the memory dies 200*a*~200*k*. The ECC engine 50 may include an ECC encoder 51 and an ECC decoder 53. The ECC encoder 51 may perform an ECC encoding operation on data to be stored in the memory dies 200*a*~200*k*. The ECC decoder 53 may perform an ECC decoding operation on data read from the memory dies 200*a*~200*k*.

The ROM 73 may store a variety of information, needed for the memory controller 30 to operate, in firmware.

The AES engine 70 may perform at least one of an encryption operation and a decryption operation on data input to the memory controller 30*a* by using a symmetric-key algorithm. Although not illustrated in detail, the AES engine 70 may include an encryption module and a decryption module. For example, the encryption module and the decryption module may be implemented as separate modules. For another example, one module capable of performing both encryption and decryption operations may be implemented in the AES engine 70.

The memory controller 30*a* may communicate with the host through the host interface 72. For example, the host interface 72 may include Universal Serial Bus (USB), Multimedia Card (MMC), embedded-MMC, peripheral component interconnection (PCI), PCI-express, Advanced Technology Attachment (ATA), Serial-ATA, Parallel-ATA, small computer small interface (SCSI), enhanced small disk interface (ESDI), Integrated Drive Electronics (IDE), Mobile Industry Processor Interface (MIPI), Nonvolatile memory express (NVMe), Universal Flash Storage (UFS), and etc. The memory controller 30*a* may communicate with the memory dies 200*a*~200*k* through the memory interface 76.

Figure 3:
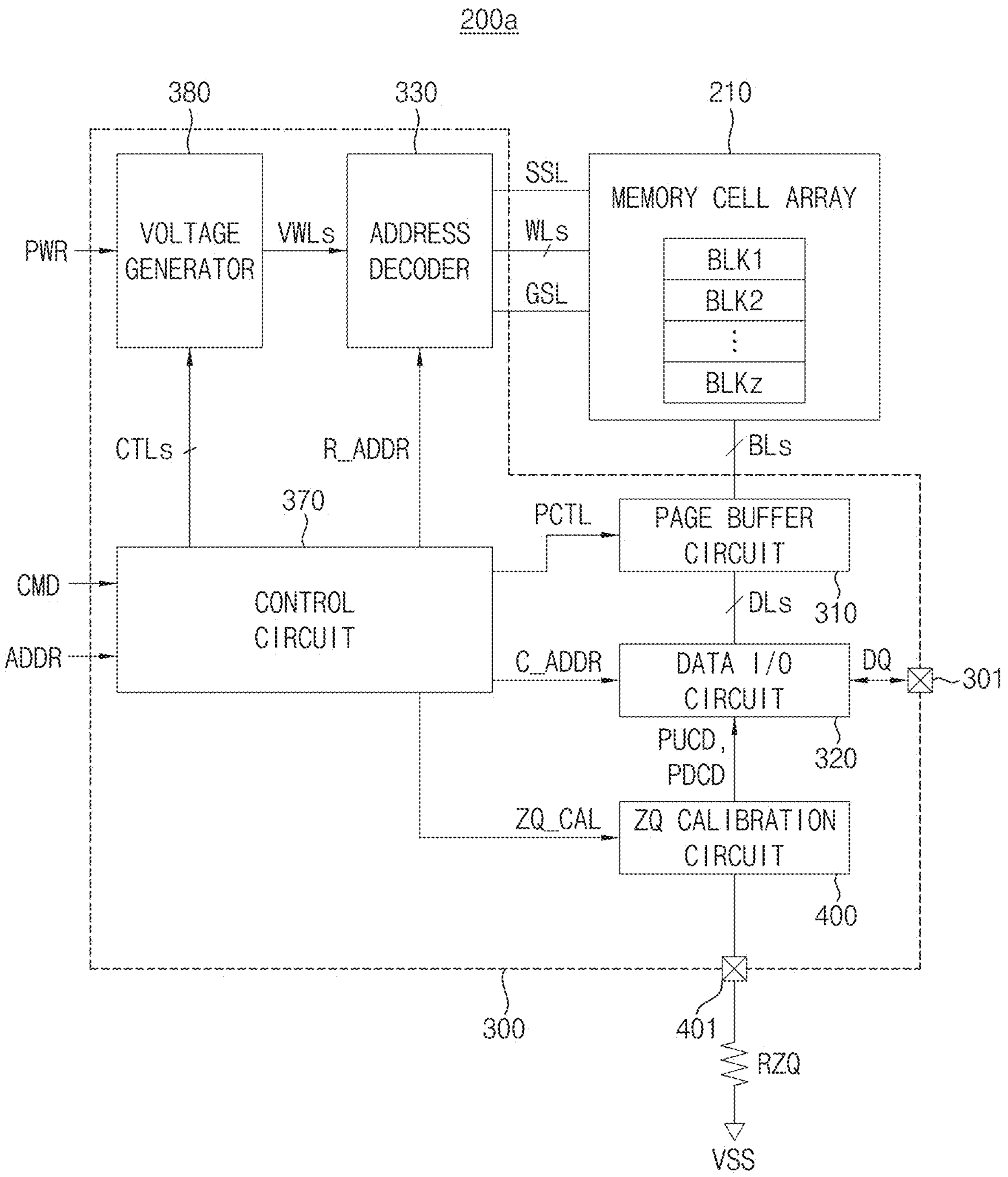
FIG. 3 is a block diagram illustrating an example of one of the memory dies in the memory system of FIG. 1 according to example implementations.

FIG. 3 is a block diagram illustrating an example of one of the memory dies in the memory system of FIG. 1 according to example implementations.

Although FIG. 3 illustrates a configuration of the memory die 200*a*, each configuration of the memory die 200*a*~200*k* may be substantially the same as the configuration of the memory die 200*a*.

Referring to FIG. 3, the memory die 200*a* may include a memory cell array 210 and a peripheral circuit 300. The peripheral circuit 300 may include an address decoder 330, a page buffer circuit 310, a data input/output (I/O) circuit 320, a control circuit 370, a voltage generator 380 and an impedance ZQ calibration circuit 400.

The memory cell array 210 may be coupled to the address decoder 330 through a string selection line SSL, a plurality of word-lines WLs, and a ground selection line GSL. In addition, the memory cell array 210 may be coupled to the page buffer circuit 310 through a plurality of bit-lines BLs. The memory cell array 310 may include a plurality of nonvolatile memory cells coupled to the plurality of word-lines WLs and the plurality of bit-lines BLs. The memory cell array 310 may include a plurality of memory blocks BLK1, BLK2, . . . , BLKz. Here, z is an integer greater than two. Each of the plurality of memory blocks BLK1, BLK2, . . . , BLKz may include a plurality of nonvolatile memory cells.

In some example implementations, the memory cell array 210 may be a three-dimensional memory cell array, which is formed on a substrate in a three-dimensional structure (or a vertical structure). In this case, the memory cell array 210 may include vertical cell strings that are vertically oriented such that at least one memory cell is located over another memory cell.

The control circuit 370 may receive the command (signal) CMD and the address (signal) ADDR from the memory controller 30*a* and control an erase loop, a program loop and a read operation of the memory die 200*a* based on the command CMD and the address ADDR. The program loop may include a program operation and a program verification operation. The erase loop may include an erase operation and an erase verification operation.

For example, the control circuit 370 may generate control signals CTLs to control the voltage generator 380 and may generate a page buffer control signal PCTL to control the page buffer circuit 310 based on the command CMD. The control circuit 370 may generate a row address R_ADDR and a column address C_ADDR based on the address ADDR. The control circuit 370 may provide the row address R_ADDR to the address decoder 330 and provide the column address C_ADDR to the data I/O circuit 320.

The address decoder 330 may be coupled to the memory cell array 210 through the string selection line SSL, the plurality of word-lines WLs, and the ground selection line GSL. During the program operation or the read operation, the address decoder 330 may determine one of the plurality of word-lines WLs as a selected word-line and determine rest of the plurality of word-lines WLs except for the selected word-line as unselected word-lines based on the row address R_ADDR.

The voltage generator 380 may generate word-line voltages VWLs, which are required for the operation of the memory die 200*a*, based on the control signals CTLs. The voltage generator 380 may receive a power PWR from the memory controller 30*a*. The word-line voltages VWLs may be applied to the plurality of word-lines WLs through the address decoder 330.

For example, during the erase operation, the voltage generator 380 may apply an erase voltage to a channel of cell strings of the memory block and may apply a ground voltage to word-lines of a memory block to be erased. During the erase verification operation, the voltage generator 500 may apply an erase verification voltage to the word-lines of the memory block to be erased or sequentially apply the erase verification voltage to word-lines on a word-line basis.

For example, during the program operation, the voltage generator 380 may apply a program voltage to the selected word-line and may apply a program pass voltage to the unselected word-lines. In addition, during the program verification operation, the voltage generator 380 may apply a program verification voltage to the selected word-line and may apply a verification pass voltage to the unselected word-lines. In addition, during the read operation, the voltage generator 380 may apply a read voltage to the selected word-line and may apply a read pass voltage to the unselected word-lines.

The page buffer circuit 310 may be coupled to the memory cell array 210 through the plurality of bit-lines BLs. The page buffer circuit 310 may include a plurality of page buffers. The page buffer circuit 310 may temporarily store data to be programmed in a selected page or data read out from the selected page.

The data I/O circuit 320 may be coupled to the page buffer circuit 310 through a plurality of data lines DLs. During the program operation, the data I/O circuit 320 may receive a data signal DQ from the memory controller 30*a* through a data I/O pad 301, may convert the data signal DQ into a data and may provide the program data to the page buffer circuit 310 based on the column address C_ADDR received from the control circuit 370. During the read operation, the data I/O circuit 320 may receive a read data, which are stored in the page buffer circuit 310 based on the column address C_ADDR received from the control circuit 370, may convert the data into the data signal DQ and may provide the data signal DQ to the memory controller 30*a* through the data I/O pad 301.

The data I/O circuit 320 may drive bits of the data DTA based on a pull-up control code PUCD and a pull-down control code PDCD from the impedance calibration circuit 400 (labelled ZQ calibration circuit in the figure) to generate the data signal DQ having a target output high level (VOH) voltage and provide the data signal DQ to the memory controller 30*a* through the data I/O pad 301.

The impedance calibration circuit 400 may be connected to the external resistor RZQ through an impedance (ZQ) pad 401 and the external resistor RZQ may be coupled to the ground voltage VSS.

The impedance calibration circuit 400 may generate a pull-up control code PUCD and a pull-down control code PDCD during an impedance calibration interval, in response to an impedance calibration command ZQ_CAL from the control circuit 370 and may provide the pull-up control code PUCD and a pull-down control code PDCD to a data output circuit in the data I/O circuit 320.

The impedance calibration circuit 400, in response to the impedance calibration command ZQ_CAL, may perform the impedance calibration operation by generating a first reference voltage code when a voltage level of a selected reference voltage becomes the same as a first voltage, which is based on an initial pull-up control code, of a first node coupled to the impedance pad 401 by comparing the first voltage with the selected reference voltage, generating the pull-up control code PUCD for driving the first node based on the first reference voltage code, generating a second reference voltage code when the voltage level of the selected reference voltage becomes the same as a second voltage, which is based on the pull-up control code PUCD, of a second node by comparing the second voltage with the selected reference voltage, and generating the pull-down control code PDCD for driving the second node based on the second reference voltage code.

Figure 4:
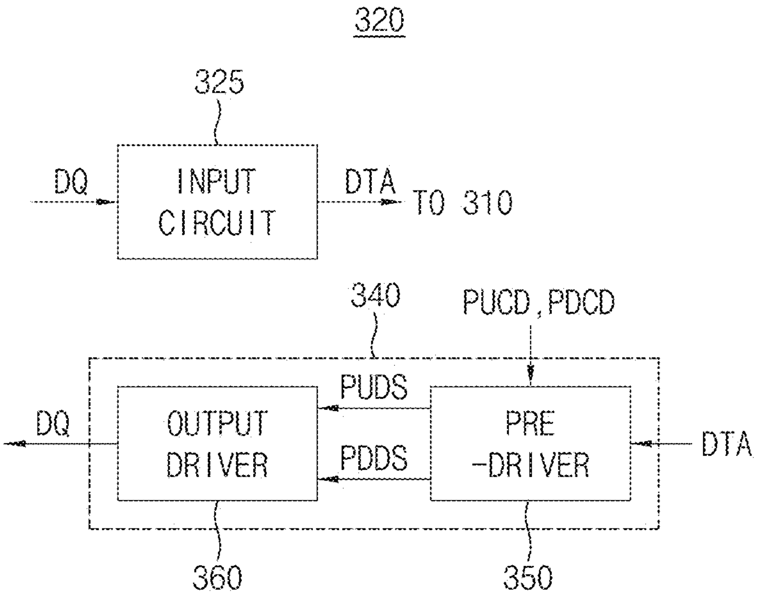
FIG. 4 illustrates an example of the data I/O circuit in the memory die of FIG. 3 according to example implementations.

FIG. 4 illustrates an example of the data I/O circuit in the memory die of FIG. 3 according to example implementations.

Referring to FIG. 4, the data I/O circuit 320 may include a data input circuit 325 and a data output circuit 340. The data output circuit 340 may include a pre-driver 350 and an output driver 360.

The data input circuit 325 may receive the data signal DQ from the memory controller 30*a*, may convert the data signal DQ to a data DTA, and may provide the data DTA to the page buffer circuit 310. The data output circuit 340 may convert data DTA from the page buffer circuit 310 to the data signal DQ and provide the data signal DQ to the memory controller 30*a*.

The pre-driver 350 may receive the data DTA, may generate a pull-up driving signal PUDS and a pull-down driving signal PDDS based on the pull-up control code PUCD and the pull-down control code PDCD, and may provide the pull-up driving signal PUDS and the pull-down driving signal PDDS to the output driver 360.

For example, when the data DTA is at a high level, the pre-driver 350 may buffer the pull-up control code PUCD and generate the pull-up driving signal PUDS to be substantially the same as the pull-up control code PUCD, and may generate the pull-down driving signal PDDS for turning off all transistors included in a pull-down driver (such as a pull-down driver 363 shown in FIG. 5) of the output driver 360. Contrarily, when the data DTA is at a low level, the pre-driver 350 may buffer the pull-down control code PDCD and generate the pull-down driving signal PDDS to be substantially the same as the pull-down control code PDCD, and generate the pull-up driving signal PUDS for turning off all transistors included in a pull-up driver (such as a pull-up driver 361 shown in FIG. 5) of the output driver 360. The pre-driver 350 may determine a current generated by the pull-up driver 361 and a resistance of the pull-down driver 363 (shown in FIG. 5) when the output driver 360 outputs the data signal DQ.

Figure 5:
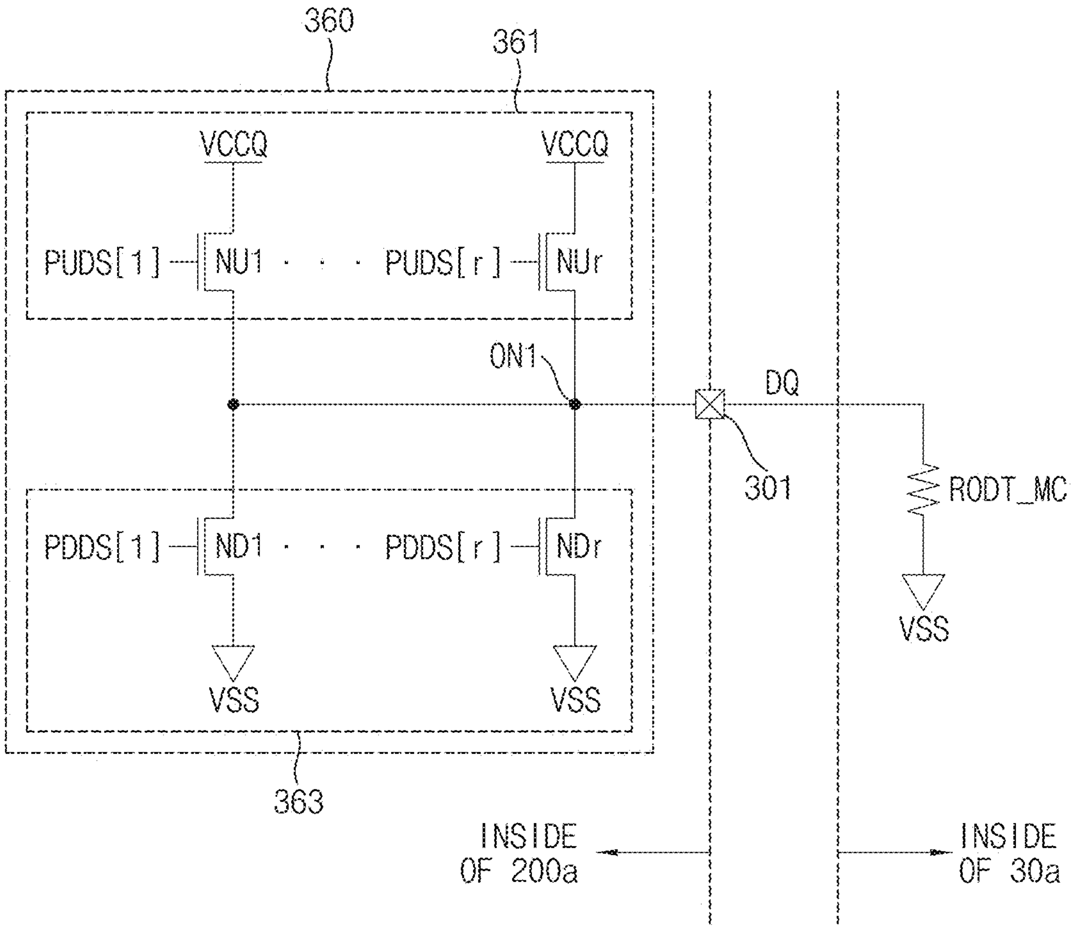
FIG. 5 is a circuit diagram illustrating an output driver in the data I/O circuit in FIG. 4 according to example implementations.

FIG. 5 is a circuit diagram illustrating an output driver in the data I/O circuit in FIG. 4 according to example implementations.

Referring to FIG. 5, the output driver 360 may include the pull-up driver 361 and the pull-down driver 363.

The pull-up driver 361 may include first through r-th (r is a natural number greater than one) pull-up transistors NU1 through NUr connected between the power supply voltage VCCQ and an output node ON1. Each of the first through r-th pull-up transistors NU1 through NUr may be an n-channel metal oxide semiconductor (NMOS) transistor.

The pull-down driver 363 may include first through r-th pull-down transistors ND1 through NDr connected between the output node ON1 and the ground voltage VSS. Each of the first through r-th pull-down transistors ND1 through NDr may be an NMOS transistor.

When the data DTA is at the high level, the pull-up driver 361 may receive the pull-up driving signal PUDS (e.g., PUDS[1] through PUDS[r]) corresponding to the pull-up control code PUCD from the pre-driver 350 and generate the current determined by the pull-up control code PUCD. The pull-down transistors ND1 through NDr included in the pull-down driver 363 may all be turned off according to the pull-down driving signal PDDS (e.g., PDDS[1] through PDDS[r]).

At this time, when the data DTA is at the high level, the current generated by the pull-up driver 361 may be transmitted to an on-die termination (ODT) resistor RODT_MC in the memory controller 30 via the data I/O pad 301. The data signal DQ that the ODT resistor RODT_MC receives is determined by the current generated by the pull-up driver 361 and the ODT resistor RODT_MC, and has the target VOH voltage that has been adjusted according to the pull-up control code PUCD generated by the impedance calibration circuit 400. The target VOH voltage may be referred to as a reference VOH voltage.

When the data DTA is at the low level, the pull-up transistors NU1 through NUr included in the pull-up driver 361 may all be turned off according to the pull-up driving signal PUDS. The pull-down driver 363 may receive the pull-down driving signal PDDS corresponding to the pull-down control code PDCD from the pre-driver 350 and may have a resistance determined by the pull-down control code PDCD.

At this time, when the data DTA is at the low level, no current is generated by the pull-up driver 361, and therefore, the data signal DQ that the ODT resistor RODT_MC receives has an output low level (VOL) voltage which is substantially the same as the ground voltage VSS.

According to example implementations, the total resistance, e.g., a termination resistance (RTT), of the pull-up driver 361 or the pull-down driver 363 may be changed in response to a particular pull-up or pull-down driving signal PUDS or PDDS. At this time, single loading or double loading can be implemented by changing the number of memory modules inserted into a memory slot and an RTT appropriate to conditions can be selected.

Figure 6:
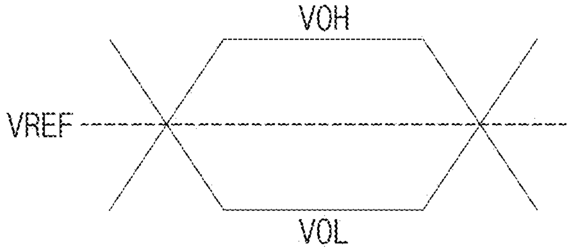
FIG. 6 illustrates a diagram for explaining an operation of a data output circuit in FIG. 5 according to example implementations.

FIG. 6 illustrates a diagram for explaining an operation of a data output circuit in FIG. 5 according to example implementations.

Referring to FIG. 6, the data signal DQ may have a high level or a low level according to the data DTA. The data signal DQ is an alternating current (AC) signal that swings between VOH and VOL.

The memory controller 30*a* may receive the data signal DQ from each of the memory dies 200*a*~200*k*, may determine the VOH and VOL voltages, and determine a reference voltage VREF from the VOH and VOL voltages. The memory controller 30*a* may compare the data signal DQ with the reference voltage VREF and may determine a received data value (e.g., 0 or 1).

Various process-voltage-temperature (PVT) conditions may be applied to each of the memory dies 200*a*~200*k*. The PVT conditions may include non-uniform doping in a wafer process, a voltage drop as current passes through different elements when power is supplied, and a temperature along a path through which a signal passes. AC on-resistance (hereinafter, referred to as "Ron AC") at the output side of the memory dies 200*a*~200*k* may vary with the PVT conditions, and the VOH voltage of the data signal DQ may vary with the Ron AC.

Various operating frequencies may be applied to each of the memory dies 200*a*~200*k*. When the operating frequency is changed, the VOH voltage of the data signal DQ may vary. Therefore, signal integrity of each of the memory dies 200a~200k may be enhanced by generating the pull-up control code PUCD and the pull-down control code PDCD according to the PVT conditions (e.g., operating parameters) and the operating frequency, such that the data signal DQ has an optimum VOH voltage.

The impedance calibration circuit 400 may generate the pull-up control code PUCD and the pull-down control codes PDCD for various target VOH voltages, in response to the impedance calibration command ZQ_CAL during the impedance calibration interval.

During a normal operation period, the impedance calibration circuit 400 may provide the data output circuit 360 with the pull-up control code PUCD and the pull-down control code PDCD for the target VOH voltage, and the data output circuit 360 may transmit the data signal DQ to the memory controller 30*a* based on the pull-up control code PUCD and the pull-down control code PDCD. A mode register set signal may include information about the impedance of the ODT resistor RODT_MC of the memory controller 30*a* and may include information indicating whether to increase or decrease the VOH voltage of the data signal DQ.

Figure 7:
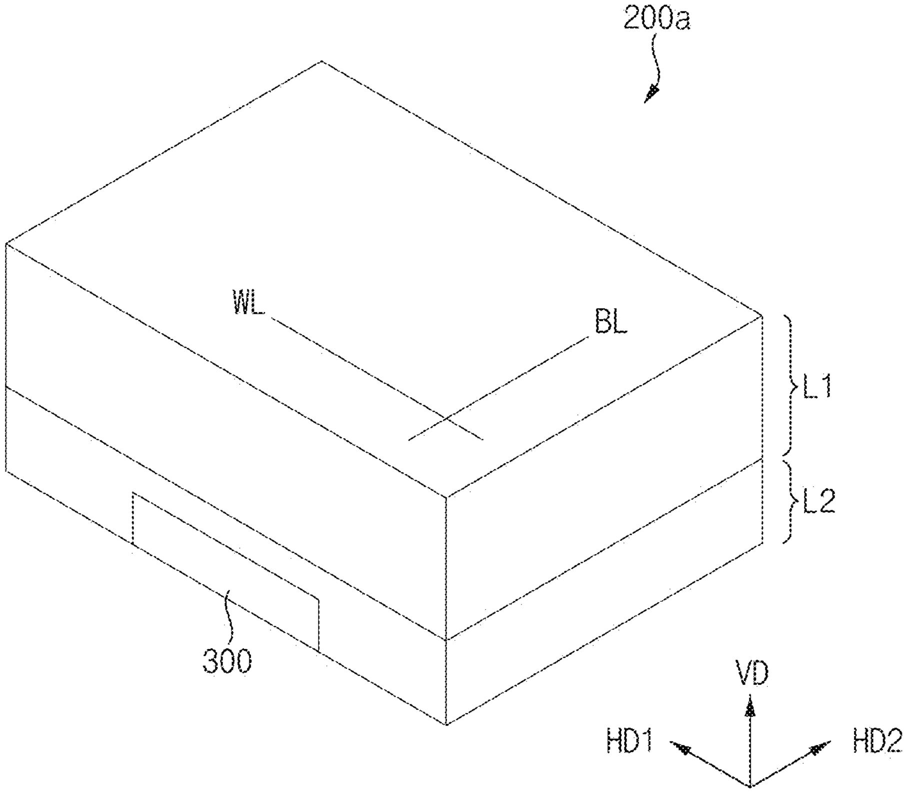
FIG. 7 schematically illustrates a structure of the memory die of FIG. 3 according to example implementations.

FIG. 7 schematically illustrates a structure of the memory die of FIG. 3 according to example implementations.

Referring to FIG. 7, the memory die 200*a* may include a first semiconductor layer L1 and a second semiconductor layer L2, and the first semiconductor layer L1 may be stacked in a vertical direction VD with respect to the second semiconductor layer L2. The second semiconductor layer L2 may be under the first semiconductor layer L1 in the vertical direction VD, and accordingly, the second semiconductor layer L2 may be close to a substrate.

Figure 13:
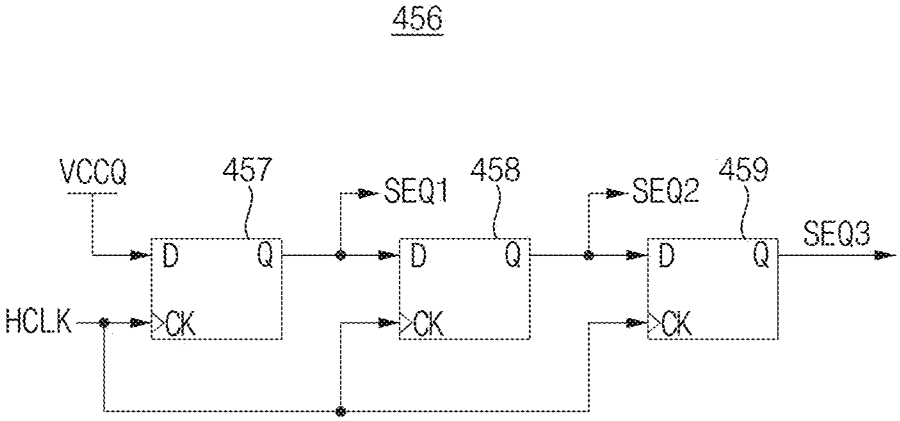
FIG. 13 is a circuit diagram illustrating an example of the sequence generator in the selection signal generator in FIG. 12 according to example implementations.

In example implementations, the memory cell array 210 in FIG. 13 may be formed (or, provided) on the first semiconductor layer L1, and the peripheral circuit 300 in FIG. 3 may be formed (or, provided) on the second semiconductor layer L2. Accordingly, the memory die 200*a* may have a structure in which the memory cell array 210 is on the peripheral circuit 300, that is, a cell over periphery (COP) structure. The COP structure may effectively reduce an area in a horizontal direction and improve the degree of integration of the memory die 200*a*.

In example implementations, the second semiconductor layer L2 may include the substrate, and by forming transistors on the substrate and metal patterns for wiring transistors, the peripheral circuit 300 may be formed in the second semiconductor layer L2. After the peripheral circuit 300 is formed on the second semiconductor layer L2, the first semiconductor layer L1 including the memory cell array 210 may be formed, and the metal patterns for connecting word-lines WL and bit-lines BL of the memory cell array 210 to the peripheral circuit 300 formed in the second semiconductor layer L2 may be formed. For example, the word-lines WL may extend in a first horizontal direction HD1 and the bit-lines BL may extend in a second horizontal direction HD2.

As the number of stages of memory cells in the memory cell array 210 increases with the development of semiconductor processes, that is, as the number of stacked word-lines WL increases, an area of the memory cell array 210 may decrease, and accordingly, an area of the peripheral circuit 300 may also be reduced. According to some implementations, to reduce an area of a region occupied by the page buffer circuit 310, the page buffer circuit 310 may have a structure in which a page buffer unit and a cache latch are separated from each other, and may connect sensing nodes included in each of the page buffer units common to a combined sensing node.

Figure 8:
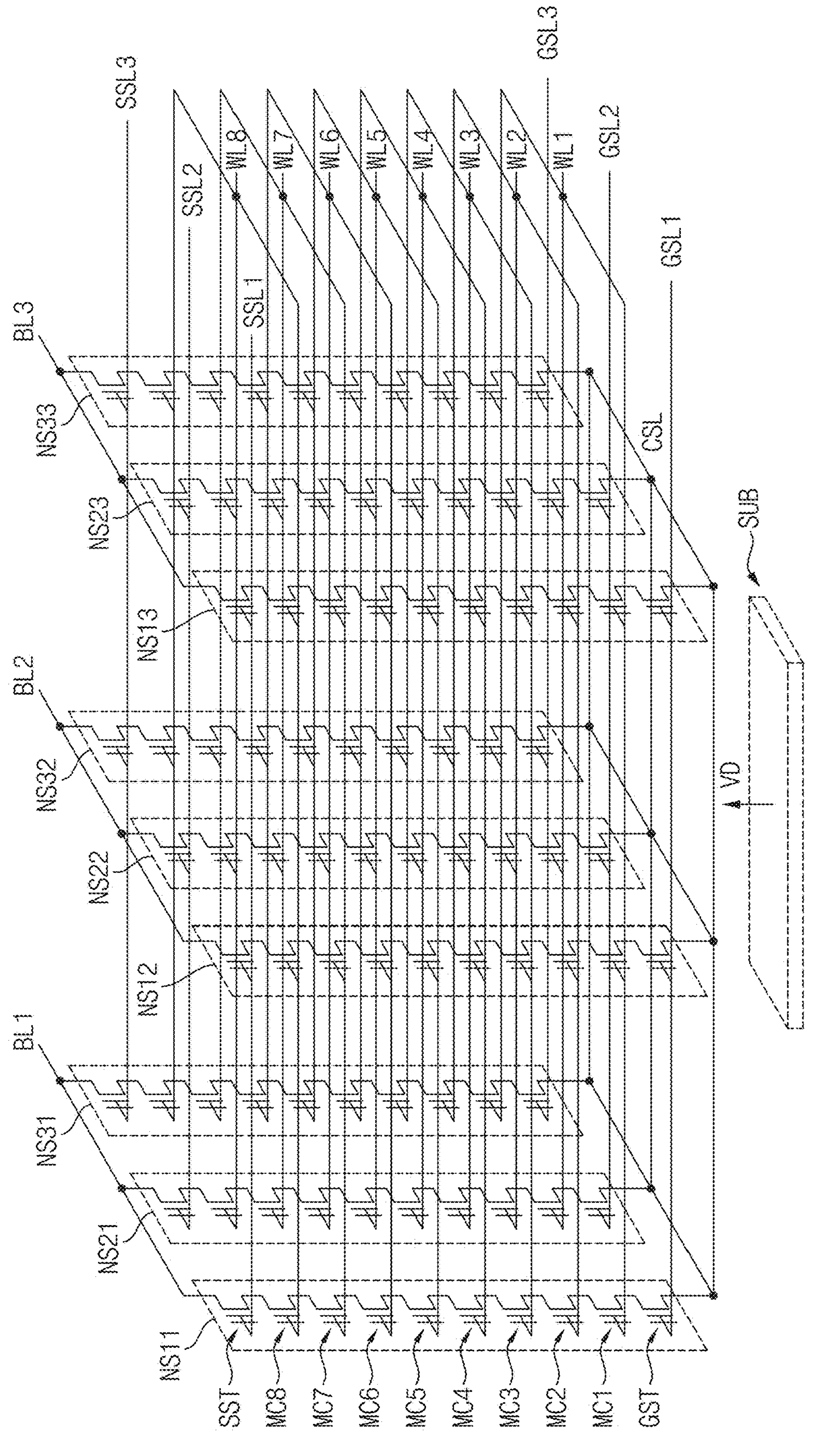
FIG. 8 is a circuit diagram illustrating one of the memory blocks in the memory cell array in FIG. 3 according to example implementations.

FIG. 8 is a circuit diagram illustrating one of the memory blocks in the memory cell array in FIG. 3 according to example implementations.

A memory block BLKi of FIG. 8 may be formed on a substrate SUB in a three-dimensional structure (or a vertical structure). Here, i may be one of 1 to z. For example, a plurality of cell strings included in the memory block BLKi may be formed in the vertical direction VD perpendicular to the substrate SUB.

Referring to FIG. 8, the memory block BLKi may include a plurality of (memory) cell strings NS11, NS21, NS31, NS12, N22, NS32, NS13, NS23 and NS33 (which are denoted by NS11 to NS33, hereinafter) coupled between bit-lines BL1, BL2 and BL3 and a common source line CSL. Each of the cell strings NS11 to NS33 may include a string selection transistor SST, a plurality of memory cells MC1 to MC8, and a ground selection transistor GST. In FIG. 8, each of the cell strings NS11 to NS33 is illustrated to include eight memory cells MC1, MC2, MC3, MC4, MC5, MC6, MC7 and MC8 (which are denoted as MC1 to MC8, hereinafter). However, implementations are not limited thereto. In some example implementations, each of the cell strings NS11 to NS33 may include any number of memory cells.

The string selection transistor SST may be connected to corresponding string selection lines SSL1, SSL2 and SSL3 (which are denoted as SSL1 to SSL3, hereinafter). The plurality of memory cells MC1 to MC8 may be connected to corresponding word-lines WL1, WL2, WL3, WL4, WL5, WL6, WL7 and WL8 (which are denoted as WL1 to WL8, hereinafter), respectively. The ground selection transistor GST may be connected to corresponding ground selection lines GSL1, GSL2 and GSL3 (which are denoted as GSL1 to GSL3, hereinafter). The string selection transistor SST may be connected to corresponding bit-lines BL1, BL2 and BL3, and the ground selection transistor GST may be connected to the common source line CSL.

Word-lines (e.g., word-line WL1) having the same height may be commonly connected, and the ground selection lines GSL1 to GSL3 and the string selection lines SSL1 to SSL3 may be separated.

Figure 9:
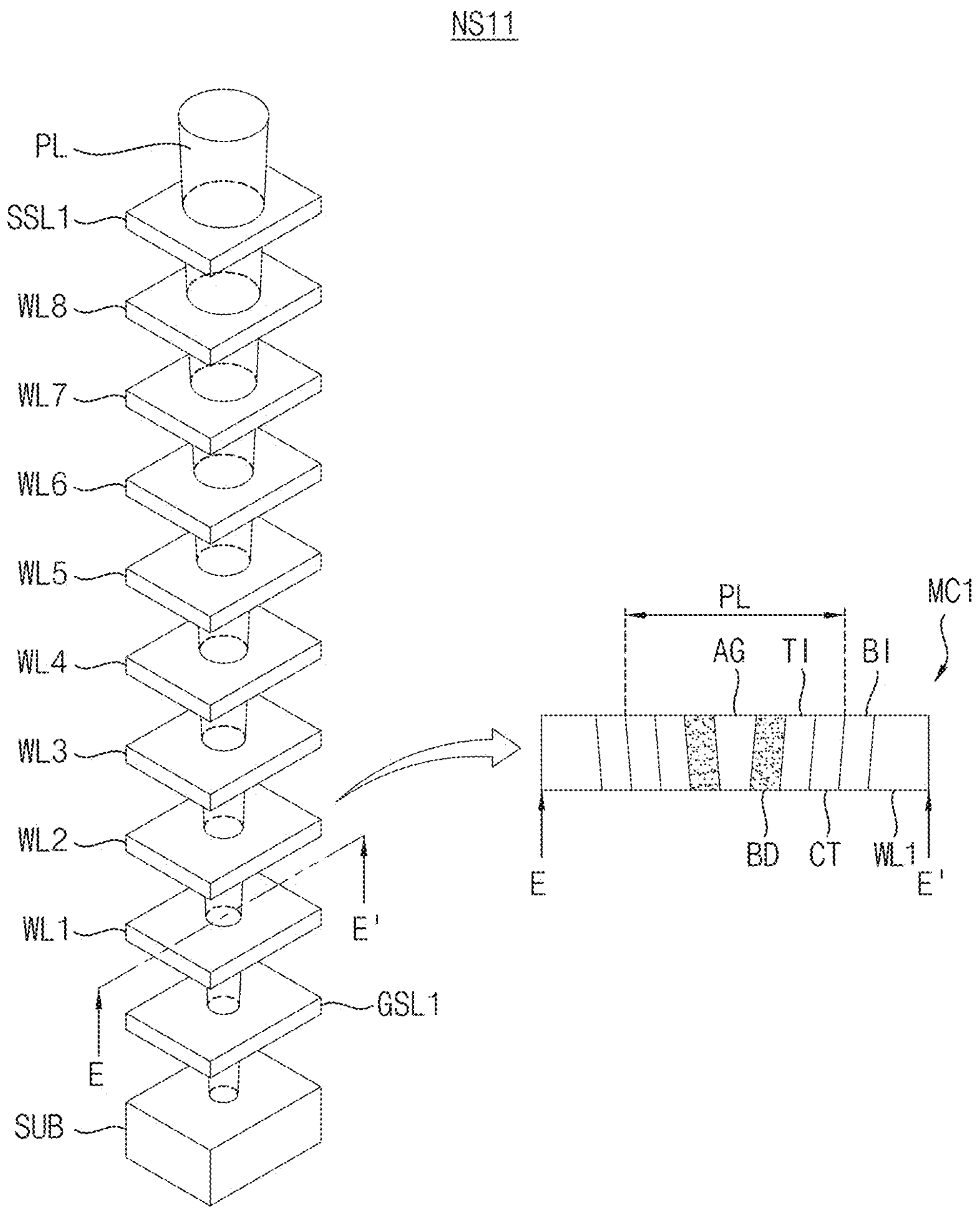
FIG. 9 illustrates an example of a structure of a cell string NS11 in the memory block of FIG. 8.

FIG. 9 illustrates an example of a structure of a cell string NS11 in the memory block of FIG. 8.

Referring to FIGS. 8 and 9, a pillar PL is provided on the substrate SUB such that the pillar PL extends in a direction perpendicular to the substrate SUB to make contact with the substrate SUB. Each of the ground selection line GSL, the word-lines WL1 to WL8, and the string selection lines SSL illustrated in FIG. 9 may be formed of a conductive material parallel with the substrate SUB, for example, a metallic material. The pillar PL may be in contact with the substrate SUB through the conductive materials forming the string selection lines SSL, the word-lines WL1 to WL8, and the ground selection line GSL.

A sectional view taken along a line E-E' is also illustrated in FIG. 9. In some example implementations, a sectional view of a first memory cell MC1 corresponding to a first word-line WL1 is illustrated. The pillar PL may include a cylindrical body BD. An air gap AG may be defined in the interior of the body BD.

The body BD may include P-type silicon and may be an area where a channel will be formed. The pillar PL may further include a cylindrical tunnel insulating layer TI surrounding the body BD and a cylindrical charge trap layer CT surrounding the tunnel insulating layer TI. A blocking insulating layer BI may be provided between the first word-line WL1 and the pillar PL. The body BD, the tunnel insulating layer TI, the charge trap layer CT, the blocking insulating layer BI, and the first word-line WL1 may constitute or be included in a charge trap type transistor that is formed in a direction perpendicular to the substrate SUB or to an upper surface of the substrate SUB. A string selection transistor SST, a ground selection transistor GST, and other memory cells may have the same structure as the first memory cell MC1.

Figure 10:
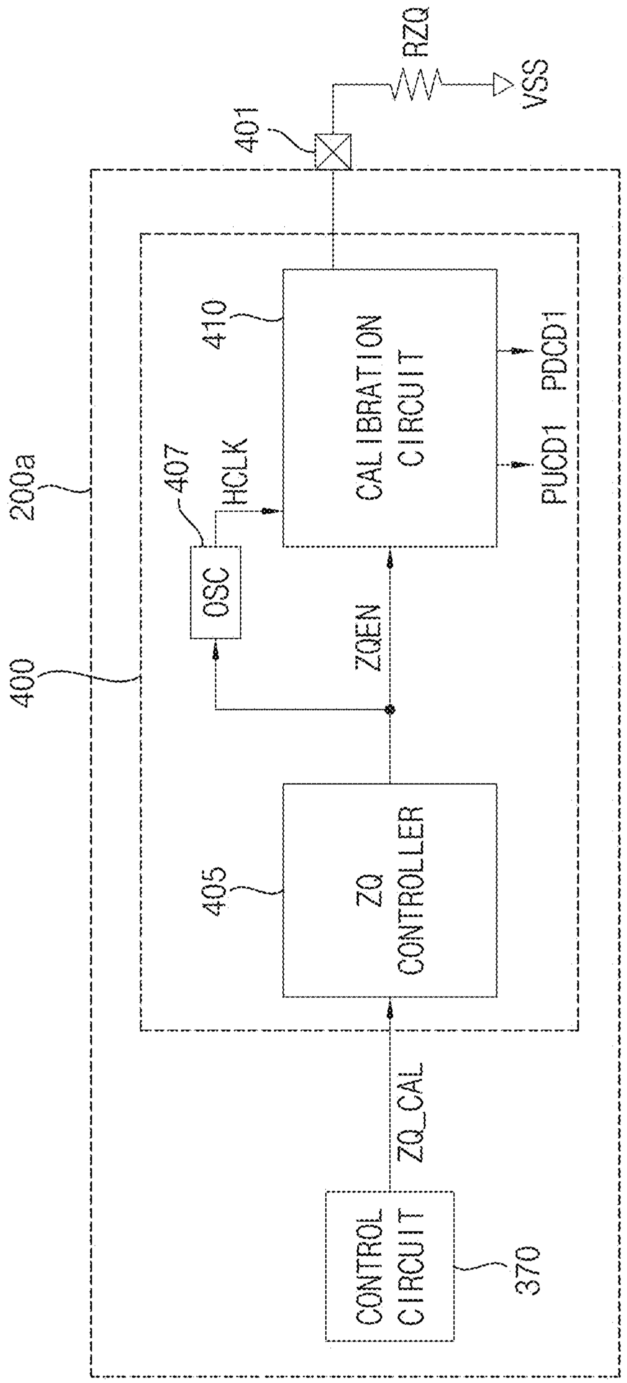
FIG. 10 illustrates a block diagram illustrating an impedance calibration circuit in the memory die of FIG. 3 according to example implementations.

FIG. 10 illustrates a block diagram illustrating an impedance calibration circuit in the memory die of FIG. 3 according to example implementations.

Referring to FIG. 10, the impedance calibration circuit 400 may include a calibration ZQ controller 405, a calibration circuit 410 and an oscillator OSC 407.

The calibration controller 405 may receive the impedance calibration command ZQ_CAL from control circuit 370 in the memory die 200*a* and may provide a calibration enable signal ZQEN to the oscillator 407 and the calibration circuit 410 in response to the impedance calibration command ZQ_CAL.

The oscillator 407 may generate a clock signal HCLK to the calibration circuit 410 in response to the calibration enable signal ZQEN.

The calibration circuit 410 may be connected to the external resistor RZQ through the impedance pad 401, may generate a first reference voltage code when a voltage level of a selected reference voltage becomes the same as a first voltage, which is based on an initial pull-up control code, of a first node coupled to the impedance pad 401 by comparing the first voltage with the selected reference voltage, may generate the pull-up control code PUCD for driving the first node based on the first reference voltage code, may generate a second reference voltage code when the voltage level of the selected reference voltage becomes the same as a second voltage which is based on the pull-up control code PUCD, of a second node by comparing the second voltage with the selected reference voltage, and may generate the pull-down control code PDCD for driving the second node based on the second reference voltage code. The calibration circuit 410 may provide the pull-up control code PUCD and the pull-down control code PDCD to the output driver 360 in FIG. 4.

Figure 11:
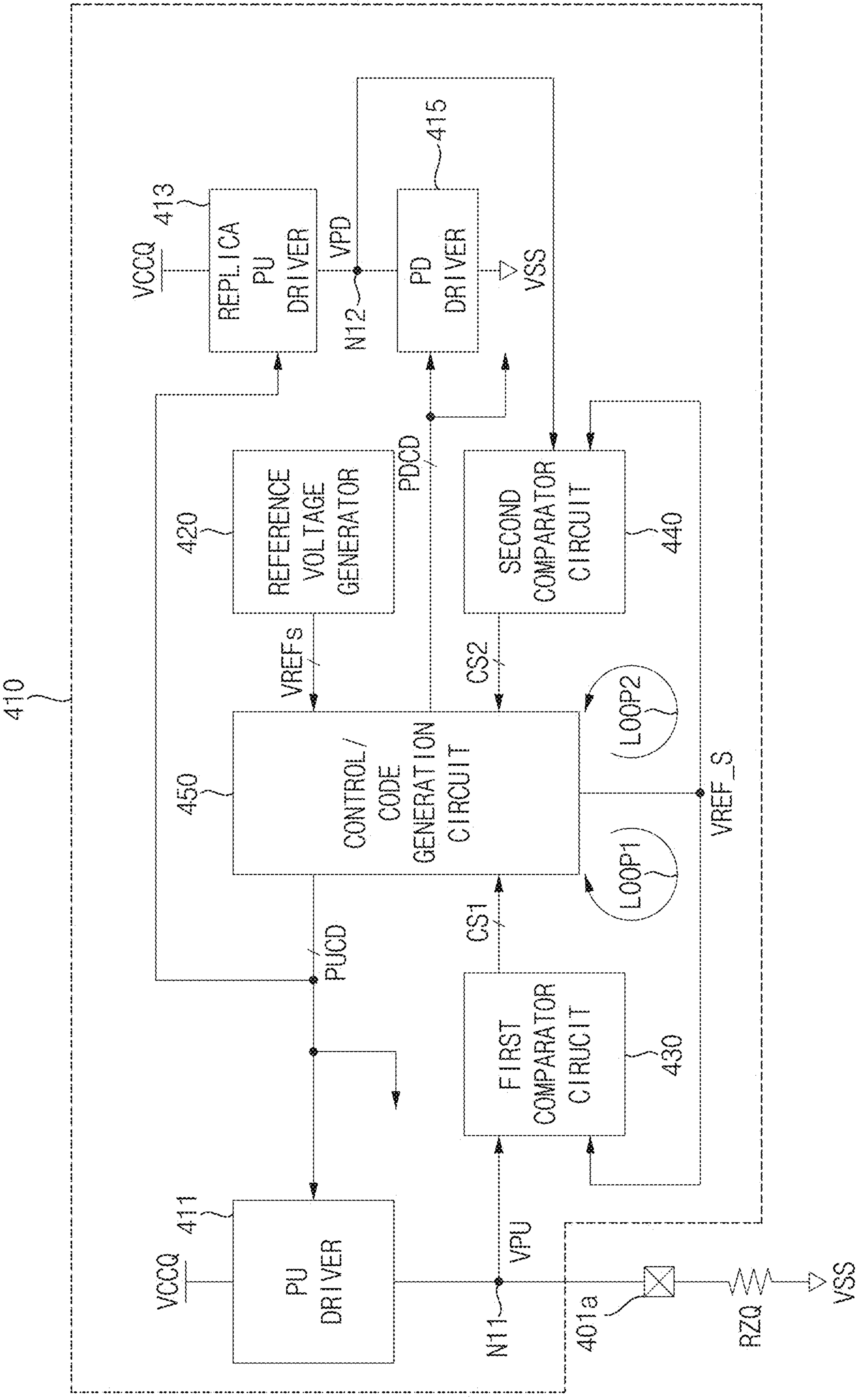
FIG. 11 illustrates a block diagram illustrating a calibration circuit in the impedance calibration circuit of FIG. 10 according to example implementations.

FIG. 11 illustrates a block diagram illustrating a calibration circuit in the impedance calibration circuit of FIG. 10 according to example implementations.

Referring to FIG. 11, the calibration circuit 410 may include a pull-up PU driver 411, a replica pull-up PU driver 413, a pull-down PD driver 415, a reference voltage generator 420, a first comparator circuit 430, a second comparator circuit 440 and a control/code generation circuit 450.

The pull-up driver 411 may be connected between the power supply voltage VCCQ and a first node N11 coupled to the impedance pad 401*a*, and may drive the first node N11 with a first voltage VPU based on a preset initial pull-up control code. The impedance pad 401*a* may be connected to the external resistor RZQ and the external resistor RZQ may be connected to the ground voltage VSS.

The reference voltage generator 420 may generate a plurality of reference voltages VREFs and may provide the plurality of reference voltages VREFs to the control/code generation circuit 450.

The control/code generation circuit 450 may provide a selected reference voltage VERF_S to the first comparator circuit 430 and the second comparator circuit 440 by selecting at least a portion from the plurality of reference voltages VREFs.

The first comparator circuit 430 may generate a first comparison signal CS1 by comparing the first voltage VPU at the first node N11 with the selected reference voltage VREF_S and may provide the first comparison signal CS1 to the control/code generation circuit 450.

The control/code generation circuit 450 may generate a first reference voltage code when a voltage level of the selected reference voltage VREF_S becomes the same as the first voltage VPU based on the first comparison signal CS1, may generate the pull-up control code PUCD based on the first reference voltage code, and may provide the pull-up control code PUCD to the pull-up driver 411 and the replica pull-up driver 413.

The replica pull-up driver 413 may be connected between the power supply voltage VCCQ and a second node N12 and may drive the second node N12 with a second voltage VPD based on the pull-up control code PUCD.

The second comparator circuit 440 may generate a second comparison signal CS2 by comparing the second voltage VPD at the second node N12 with the selected reference voltage VREF_S and may provide the second comparison signal CS2 to the control/code generation circuit 450.

The control/code generation circuit 450 may generate a second reference voltage code when a voltage level of the selected reference voltage VREF_S becomes the same as the second voltage VPD based on the second comparison signal CS2, may generate the pull-down control code PDCD based on the second reference voltage code, and may provide the pull-down control code PDCD to the pull-down driver 415.

The pull-down driver 415 may drive the second node N12 based on the pull-down control code PDCD.

The control/code generation circuit 450 may provide the pull-up control code PUCD and the pull-down control code PDCD to the output circuit 340 in FIG. 4.

The control/code generation circuit 450 and the first comparator circuit 430 may constitute a first loop LOOP1, may generate the first reference voltage code when the voltage level of the selected reference voltage VREF_S becomes the same as the first voltage VPU, and may generate the pull-up control code PUCD based on the first reference voltage code. In addition, the control/code generation circuit 450 and the second comparator circuit 440 may constitute a second loop LOOP2, may generate the second reference voltage code when the voltage level of the selected reference voltage VREF_S becomes the same as the second voltage VPD, and may generate the pull-down control code PDCD based on the second reference voltage code.

The conventional impedance calibration circuit generates a pull-up control code through a first loop including the pull-up driver 411 and the first node N11 and generates a pull-down control code through a second loop including the second node N12 and the pull-down driver 413. An operating speed of an impedance calibration circuit is determined by an RC load of the first node N11 (i.e., ZQ node) and by an RC load of the second node N12. Because, the first node N11 included in the first loop is coupled to an impedance pad connected to the external resistor RZQ in the conventional impedance calibration circuit, the RC load of the first node N11 increases and thus, the operating speed of the conventional impedance calibration circuit decreases. In addition, the RC load of the first node N11 increases as a number of the memory dies increases.

However, in the calibration circuit 410, because the first loop LOOP1 does not include the first node N11 and the second loop LOOP2 does not include the second node N12, an RC load is not associated with an impedance calibration operation. Therefore, the operating speed of the impedance calibration circuit 400 does not decrease even when a number of the memory dies increases.

Figure 12:
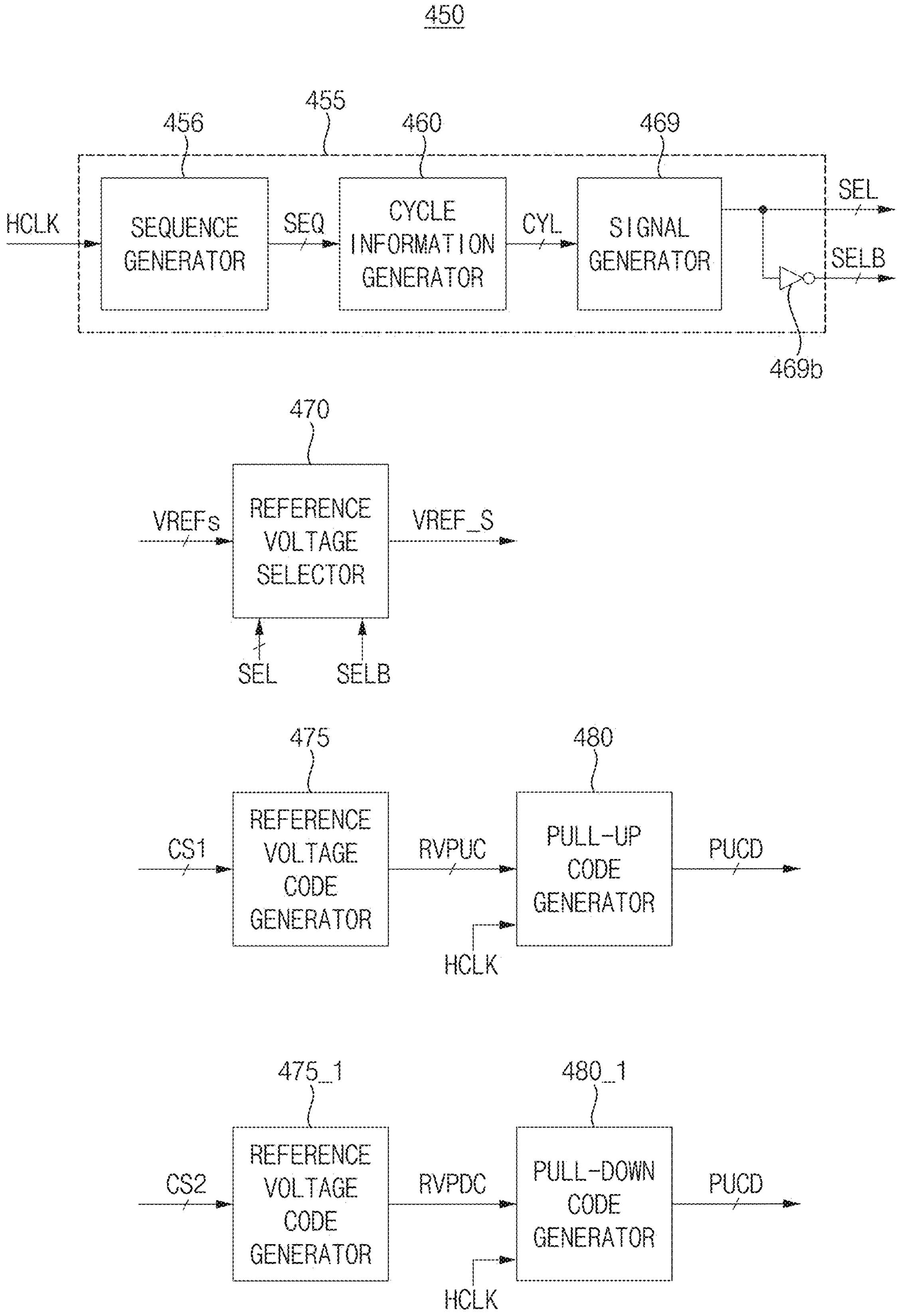
FIG. 12 illustrates a block diagram illustrating a control/code generation circuit in the calibration circuit of FIG. 11 according to example implementations.

FIG. 12 illustrates a block diagram illustrating a control/code generation circuit in the calibration circuit of FIG. 11 according to example implementations.

Referring to FIG. 12, the control/code generation circuit 450 may include a selection signal generator 455, a reference voltage selector 470, a first reference voltage code generator 475, a pull-up code generator 480, a second reference voltage code generator 475_1 and a pull-down code generator 480_1. The pull-up code generator 480 may referred to as a pull-up control code generator and the pull-down code generator 480_1 may be referred to as a pull-down control code generator.

The selection signal generator 455 may receive the clock signal HCLK and may generate selection signals SEL and inverted selection signals SELB based on the clock signal HCLK. The selection signal generator 455 may include a sequence generator 456, a cycle information generator 460, a signal generator 469 and an inverter 469*b*.

The sequence generator 456 may generate a plurality of sequence signals SEQ that are sequentially activated, based on the clock signal HCLK. The cycle information generator 460 may generate a plurality of cycle signals CYL associated with the plurality of cycles, based on the plurality of sequence signals SEQ. The signal generator 469 may generate the selection signals SEL based on the plurality of cycle signals CYL. The inverter 469*b* may generate the inverted selection signals SELB by inverting the selection signals SEL.

The reference voltage selector 470 may output the selected reference voltage VREF_S by selecting at least a portion of the plurality of reference voltages VREFs based on the selection signals SEL and the inverted selection signals SELB during each of a plurality of cycles.

The first reference voltage code generator 475 may receive the first comparison signal CS1, may generate a first reference voltage code RVPUC when the voltage level of the selected reference voltage VREF_S becomes the same as the first voltage VPU based on the first comparison signal CS1 and may provide the first reference voltage code RVPUC to the pull-up code generator 480.

The pull-up code generator 480 may receive the clock signal HCLK and the first reference voltage code RVPUC, may generate the pull-up control code PUCD based on the clock signal HCLK and the first reference voltage code RVPUC and may provide the pull-up control code PUCD to the pull-up driver 411 and the replica pull-up driver 413.

The second reference voltage code generator 475_1 may receive the second comparison signal CS2, may generate a second reference voltage code RVPDC when the voltage level of the selected reference voltage VREF_S becomes the same as the second voltage VPD based on the second comparison signal CS2 and may provide the second reference voltage code RVPDC to the pull-down code generator 480_1.

The pull-down code generator 480_1 may receive the clock signal HCLK and the second reference voltage code RVPDC, may generate the pull-down control code PDCD based on the clock signal HCLK and the second reference voltage code RVPDC and may provide the pull-down control code PDCD to the pull-down driver 415.

FIG. 13 is a circuit diagram illustrating an example of the sequence generator in the selection signal generator in FIG. 12 according to example implementations.

Referring to FIG. 13, the sequence generator 456 may include a plurality of D-flipflops 457, 458 and 459.

The D-flipflop 457 may include a data terminal D coupled to the power supply voltage VCCQ, a clock terminal CK receiving the clock signal HCLK and an output terminal Q outputting a first sequence signal SEQ1.

The D-flipflop 458 may include a data terminal D coupled to the output terminal Q of the D-flipflop 457, a clock terminal CK receiving the clock signal HCLK and an output terminal Q outputting a second sequence signal SEQ2.

The D-flipflop 459 may include a data terminal D coupled to the output terminal Q of the D-flipflop 458, a clock terminal CK receiving the clock signal HCLK and an output terminal Q outputting a third sequence signal SEQ3.

Therefore, the sequence generator 456 may generate the first sequence signal SEQ1, the second sequence signal SEQ2 and the third sequence signal SEQ3 which are activated sequentially.

The first sequence signal SEQ1, the second sequence signal SEQ2 and the third sequence signal SEQ3 may be included in the sequence signals SEQ in FIG. 12.

Figure 14:
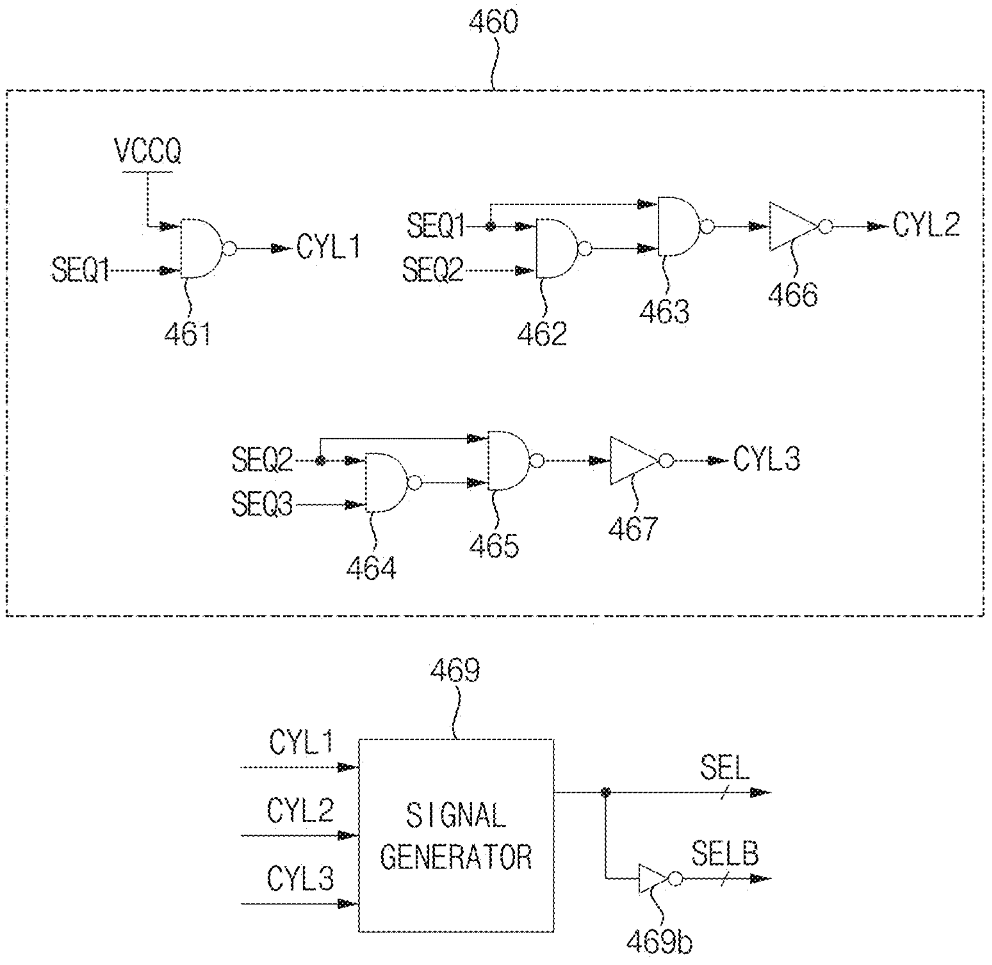
FIG. 14 illustrates examples of the cycle information generator and the signal generator in the selection signal generator in FIG. 12 according to example implementations.

FIG. 14 illustrates examples of the cycle information generator and the signal generator in the selection signal generator in FIG. 12 according to example implementations.

Referring to FIG. 14, the cycle information generator 460 may include a plurality of NAND gates 461, 462, 463, 464 and 465 and inverters 466 and 467.

The NAND gate 461 may output a first cycle signal CYL1 by performing a NAND operation on the power supply voltage VCCQ and the first sequence signal SEQ1. The NAND gate 462 may perform a NAND operation on the first sequence signal SEQ1 and the second sequence signal SEQ2. The NAND gate 463 may perform a NAND operation on the first sequence signal SEQ1 and an output of the NAND gate 462. The inverter 466 may output the second cycle signal CYL2 by inverting an output of the NAND gate 463.

The NAND gate 464 may perform a NAND operation on the second sequence signal SEQ2 and the third sequence signal SEQ3. The NAND gate 465 may perform a NAND operation on the second sequence signal SEQ2 and an output of the NAND gate 464. The inverter 467 may output the third cycle signal CYL3 by inverting an output of the NAND gate 465.

The first cycle signal CYL1, the second cycle signal CYL2 and the third cycle signal CYL3 may be included in the cycle signals CYL in FIG. 12.

The signal generator 469 may generate the selection signals SEL based on the first cycle signal CYL1, the second cycle signal CYL2 and the third cycle signal CYL3 and the inverter 469*b* may output the inverted selection signals SELB by inverting the selection signals SEL.

Figure 15:
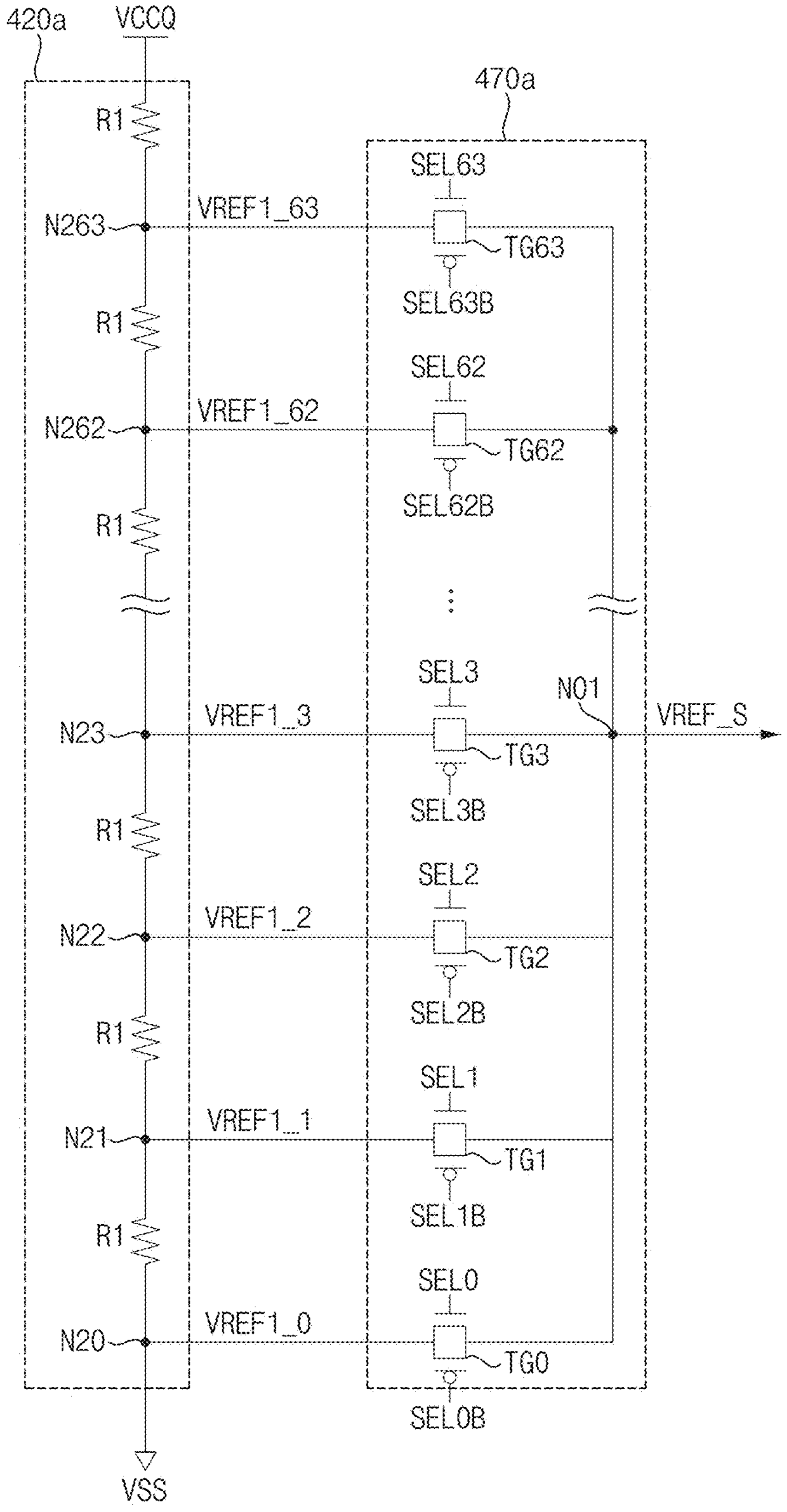
FIG. 15 illustrates a block diagram illustrating an example of a reference voltage generator in the calibration circuit of FIG. 11 and an example of a reference voltage selector in FIG. 12, according to example implementations.

FIG. 15 illustrates a block diagram illustrating an example of a reference voltage generator in the calibration circuit of FIG. 11 and an example of a reference voltage selector in FIG. 12, according to example implementations.

Referring to FIG. 15, a reference voltage generator 420*a* may include a plurality of resistors R1 that are connected in series between the power supply voltage VCCQ and the ground voltage VSS. The reference voltage generator 420*a* may provide a reference voltage selector 470*a* with a plurality of reference voltages VREF1_0, VREF1_1, VREF1_2, VREF1_3, . . . , VREF1_62, VREF1_63. The plurality of reference voltages VREF1_0, VREF1_1, VREF1_2, VREF1_3, . . . , VREF1_62, VREF1_63 are provided at respective nodes N20, N21, N22, N23, . . . , N262, N263 between the power supply voltage VCCQ and the ground voltage VSS, and the plurality of reference voltages VREF1_0, VREF1_1, VREF1_2, VREF1_3, . . . , VREF1_62, VREF1_63 may be obtained by dividing the power supply voltage VCCQ with a specific ratio. Therefore, the reference voltage generator 420*a* may be referred to as a resistor-ladder type.

The reference voltage selector 470*a* may include a plurality of transmission gates TG0, TG1, TG2, TG3, . . . , TG62, TG63. The plurality of transmission gates TG0, TG1, TG2, TG3, . . . , TG62, TG63 may receive the plurality of reference voltages VREF1_0, VREF1_1, VREF1_2, VREF1_3, . . . , VREF1_62, VREF1_63, respectively, and may be commonly connected to an output node NO1.

The plurality of transmission gates TG0, TG1, TG2, TG3, . . . , TG62, TG63 may provide at least one of the plurality of reference voltages VREF1_0, VREF1_1, VREF1_2, VREF1_3, . . . , VREF1_62, VREF1_63 as the selected reference voltage VREF_S at the output node NO1, in response to selection signals SEL0, SEL1, SEL2, SEL3, . . . , SEL62, SEL63 and inverted selection signals SEL0B, SEL1B, SEL2B, SEL3B, . . . , SEL62B, SEL63B.

Figure 16:
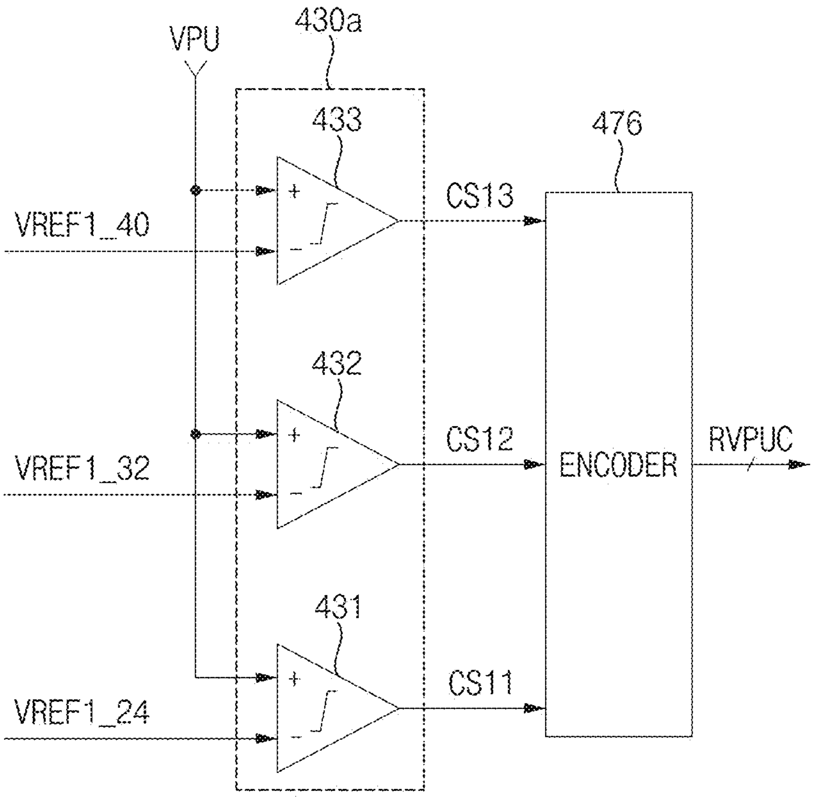
FIG. 16 illustrates an example of a first comparator circuit in the calibration circuit of FIG. 11 and an example of a first reference voltage code generator in FIG. 12, according to example implementations.

FIG. 16 illustrates an example of a first comparator circuit in the calibration circuit of FIG. 11 and an example of a first reference voltage code generator in FIG. 12, according to example implementations.

Referring to FIG. 16, a first comparator circuit 430*a* may include a plurality of comparators 431, 432 and 433 and the first reference voltage code generator 475 in FIG. 12 may include an encoder 476.

The comparator 431 may output a comparison signal CS11 by comparing the first voltage VPU with a reference voltage VREF1_24. The comparator 432 may output a comparison signal CS12 by comparing the first voltage VPU with a reference voltage VREF1_32. The comparator 433 may output a comparison signal CS13 by comparing the first voltage VPU with a reference voltage VREF1_40.

The encoder 476 may receive the comparison signals CS11, CS12 and CS13 and may generate the first reference voltage code RVPUC by encoding the comparison signals CS11, CS12 and CS13.

The reference voltage selector 470*a* in FIG. 15, the first comparator circuit 430*a* and the encoder 476 in FIG. 16 may constitute a flash analog-to-digital converter (ADC) and the flash ADC may convert a portion of the plurality of reference voltages VREF1_0, VREF1_1, VREF1_2, VREF1_3, . . . , VREF1_62, VREF1_63 to the first reference voltage code RVPUC.

Figure 17:
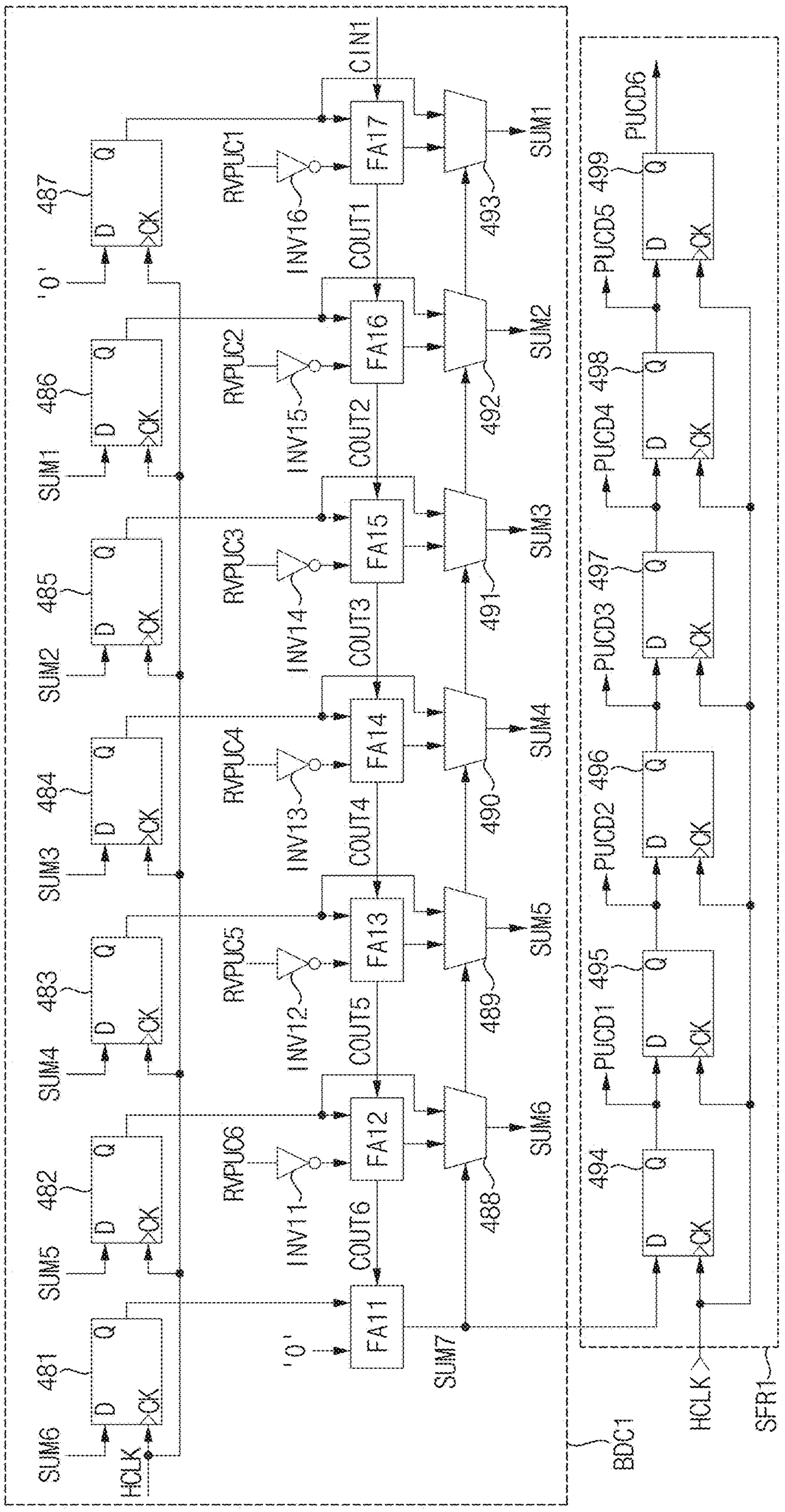
FIG. 17 is a circuit diagram illustrating an example of a pull-up code generator in the control/code generation circuit of FIG. 12 according to example implementations.

FIG. 17 is a circuit diagram illustrating an example of a pull-up code generator in the control/code generation circuit of FIG. 12 according to example implementations.

Referring to FIG. 17, a pull-up code generator 480*a* may include a binary division circuit BDC1 and a shift register SFR1.

The binary division circuit BDC1 may generate a plurality of summed signals SUM7, SUM6, SUM5, SUM4, SUM3, SUM2 and SUM1 based on the clock signal HCLK and the first reference voltage code RVPUC.

The shift register SFR1 may generate bits PUCD1, PUCD2, PUCD3, PUCD4, PUCD5 and PUCD6 of the pull-up control code PUCD sequentially based on the clock signal HCLK and a most significant summed signal SUM7 from the plurality of summed signals SUM7, SUM6, SUM5, SUM4, SUM3, SUM2 and SUM1.

The binary division circuit BDC1 may include a first group of D-flipflops 481, 482, 483, 484, 485, 486 and 487, a plurality of full adders FA11, FA12, FA13, FA14, FA15, FA16 and FA17, a plurality of inverters INV11, INV12, INV13, INV14, INV15 and INV16 and a plurality of multiplexers 488, 489, 490, 491, 492 and 493.

An initial set value of the D-flipflop 481 may be '0' and an initial set value of each of the D-flipflops 482, 483, 484, 485, 486 and 487 may be respective one of '1', '0', '0', '0', '0' and '0' which are the same as respective one of bits of the initial pull-up control code.

Each of the D-flipflops 481, 482, 483, 484, 485 and 486 may include a data terminal D receiving respective one of the summed signals SUM6, SUM5, SUM4, SUM3, SUM2 and SUM1, a clock terminal CK receiving the clock signal HCLK and an output terminal Q. The D-flipflop 487 may include a data terminal D receiving a logic low level '0', a clock terminal CK receiving the clock signal HCLK and an output terminal Q. Therefore, each of the first group of D-flipflops 481, 482, 483, 484, 485, 486 and 487 may output a respective initial set value and then output a respective one of the summed signals SUM6, SUM5, SUM4, SUM3, SUM2 and SUM1 and a logic low level '0' in synchronization of the clock signal HCLK.

Therefore, the first group of D-flipflops 481, 482, 483, 484, 485, 486 and 487 may use the clock signal HCLK and the initial set values which are the same as the bits of the initial pull-up control code.

Each of the plurality of inverters INV11, INV12, INV13, INV14, INV15 and INV16 may invert respective one of bits RVPUC6, RVPUC5, RVPUC4, RVPUC3, RVPUC2 and RVPUC1 of the first reference voltage code RVPUC and may provide respective inverted versions of the bits RVPUC6, RVPUC5, RVPUC4, RVPUC3, RVPUC2 and RVPUC1 to respective one of the plurality of full adders FA12, FA13, FA14, FA15, FA16 and FA17.

The full adder FA17 may output a summed value by summing an output of the inverter INV16 and an output of the D-flipflop 487, and the multiplexer 493 may output one of an output of the full adder FA17 and the output of the D-flipflop 487 as the summed signal SUM1 based on the most significant summed signal SUM7. The full adder FA16 may output a summed value by summing an output of the inverter INV15 and an output of the D-flipflop 486, and the multiplexer 492 may output one of an output of the full adder FA16 and the output of the D-flipflop 486 as the summed signal SUM2 based on the most significant summed signal SUM7.

The full adder FA15 may output a summed value by summing an output of the inverter INV14 and an output of the D-flipflop 485, and the multiplexer 491 may output one of an output of the full adder FA15 and the output of the D-flipflop 485 as the summed signal SUM3 based on the most significant summed signal SUM7. The full adder FA14 may output a summed value by summing an output of the inverter INV13 and an output of the D-flipflop 484, and the multiplexer 490 may output one of an output of the full adder FA14 and the output of the D-flipflop 484 as the summed signal SUM4 based on the most significant summed signal SUM7.

The full adder FA13 may output a summed value by summing an output of the inverter INV12 and an output of the D-flipflop 483, and the multiplexer 498 may output one of an output of the full adder FA13 and the output of the D-flipflop 483 as the summed signal SUM5 based on the most significant summed signal SUM7. The full adder FA12 may output a summed value by summing an output of the inverter INV11 and an output of the D-flipflop 482, and the multiplexer 497 may output one of an output of the full adder FA12 and the output of the D-flipflop 482 as the summed signal SUM6 based on the most significant summed signal SUM7. The full adder FA11 may output the most significant summed signal SUM7 by summing '0' and an output of the D-flipflop 481.

The full adder FA17 may provide a carry-out signal COUT1 to the full adder FA16 based on a carry-in signal CIN1, the full adder FA16 may provide a carry-out signal COUT2 to the full adder FA15, the full adder FA15 may provide a carry-out signal COUT3 to the full adder FA14, the full adder FA14 may provide a carry-out signal COUT4 to the full adder FA13, the full adder FA13 may provide a carry-out signal COUT3 to the full adder FA12, and the full adder FA12 may provide a carry-out signal COUT2 to the full adder FA11.

Therefore, the plurality of full adders FA11, FA12, FA13, FA14, FA15, FA16 and FA17 and the plurality of multiplexers 488, 489, 490, 491, 492 and 493 may generate the plurality of summed signals SUM7, SUM6, SUM5, SUM4, SUM3, SUM2 and SUM1 based on the bits RVPUC6, RVPUC5, RVPUC4, RVPUC3, RVPUC2 and RVPUC1 of the first reference voltage code RVPUC and the outputs of the first group of D-flipflops 481, 482, 483, 484, 485, 486 and 487.

The shift register SFR1 may include a second group of D flipflops 494, 495, 496, 497, 498 and 499 which are connected in series. An initial set value of each of the second group of D-flipflops 494, 495, 496, 497, 498 and 499 may be '0'.

The D-flipflop 494 may include a data terminal D receiving the most significant summed signal SUM7, a clock terminal CK receiving the clock signal HCLK and an output terminal Q outputting a bit PUCD1 of the pull-up control code PUCD. The D-flipflop 495 may include a data terminal D connected to the output terminal Q of the D-flipflop 494, a clock terminal CK receiving the clock signal HCLK and an output terminal Q outputting a bit PUCD2 of the pull-up control code PUCD.

The D-flipflop 496 may include a data terminal D connected to the output terminal Q of the D-flipflop 495, a clock terminal CK receiving the clock signal HCLK and an output terminal Q outputting a bit PUCD3 of the pull-up control code PUCD. The D-flipflop 497 may include a data terminal D connected to the output terminal Q of the D-flipflop 496, a clock terminal CK receiving the clock signal HCLK and an output terminal Q outputting a bit PUCD4 of the pull-up control code PUCD.

The D-flipflop 498 may include a data terminal D connected to the output terminal Q of the D-flipflop 497, a clock terminal CK receiving the clock signal HCLK and an output terminal Q outputting a bit PUCD5 of the pull-up control code PUCD. The D-flipflop 499 may include a data terminal D connected to the output terminal Q of the D-flipflop 498, a clock terminal CK receiving the clock signal HCLK and an output terminal Q outputting a bit PUCD6 of the pull-up control code PUCD.

The D-flipflop 494 from among the second group of D-flipflops 494, 495, 496, 497, 498 and 499 may output a first bit PUCD1 of the pull-up control code PUCD at the output terminal Q based in the clock signal HCLK and the most significant summed signal SUM7, and each of rest D-flipflops 494, 495, 496, 497, 498 and 499 may have the data terminal D connected to the output terminal Q of a previous D-flipflop and may output corresponding one of the bits PUCD2, PUCD3, PUCD4, PUCD5 and PUCD6 of the pull-up control code PUCD.

The pull-up code generator 480*a* in FIG. 17 is a configuration in a case when the output driver 360 in FIG. 4 drives the data I/O pad 301 by center tap termination (CTT) scheme.

When the reference voltage generator 420 in FIG. 11 employs the reference voltage generator 420*a* in FIG. 15 and the pull-up driver 411 is set with an initial pull-up control code of '100000', the reference voltage generator 420*a* may generate a plurality of reference voltages corresponding to K*VCCQ/64. Here, K may be one of 0 to 63. Therefore, the pull-up control code PUCD to be provided to the pull-up driver 411 may be represented by the initial pull-up control code+$(2^5/K)*2^5$ except K=0.

A configuration of the pull-down code generator 480_1 may be substantially the same as a configuration of the pull-up code generator 480*a* of FIG. 17.

Figure 18:
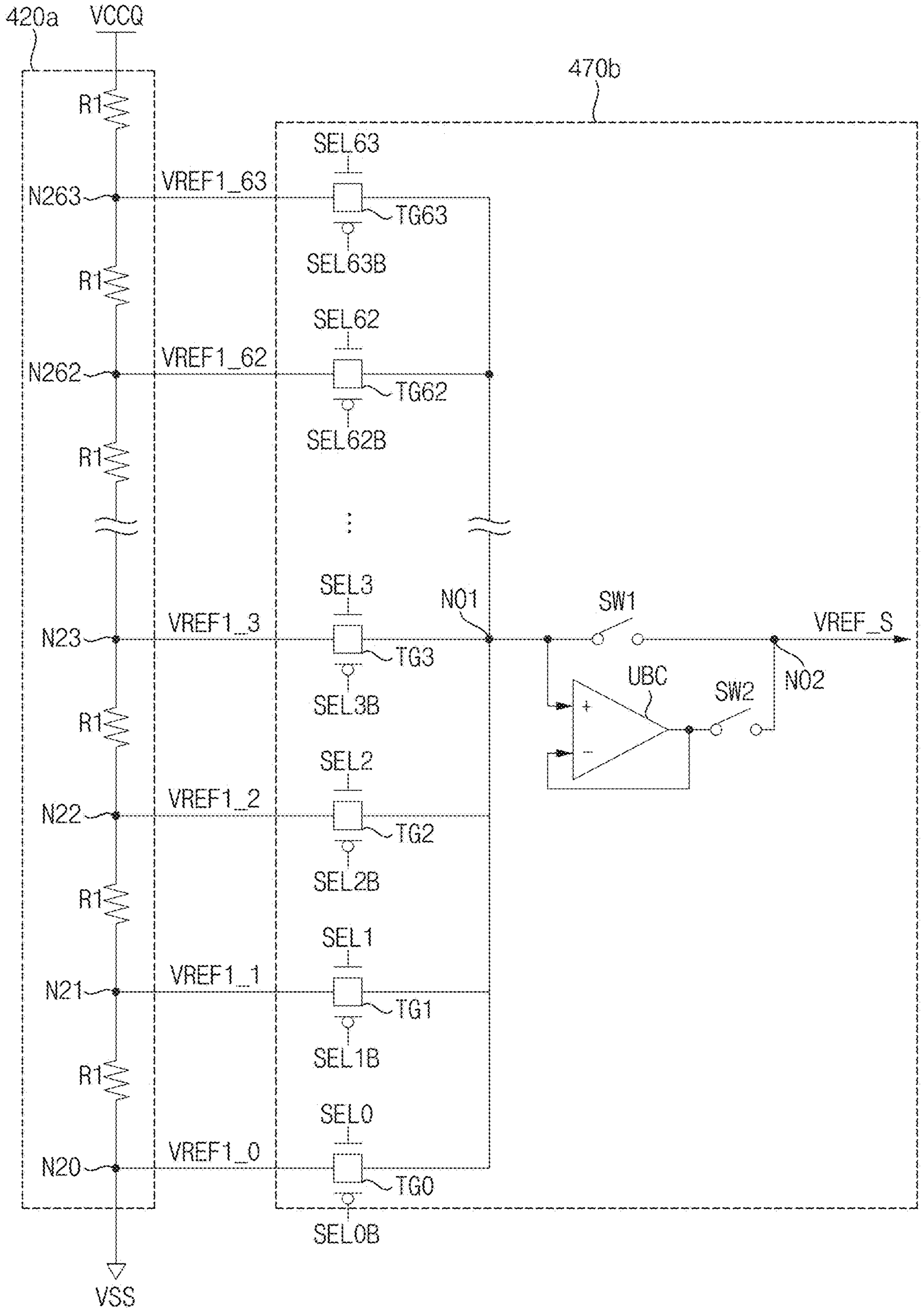
FIG. 18 is a circuit diagram illustrating an example of a reference voltage selector in the control/code generation circuit of FIG. 12 according to example implementations.

FIG. 18 is a circuit diagram illustrating an example of a reference voltage selector in the control/code generation circuit of FIG. 12 according to example implementations.

In FIG. 18, the reference voltage generator 420*a* in FIG. 15 is also illustrated for convenience of explanation.

Referring to FIG. 18, a reference voltage selector 470*b* may include a plurality of transmission gates TG0, TG1, TG2, TG3, . . . , TG62, TG63, a unit gain buffer UBC and switches SW1 and SW2. The plurality of transmission gates TG0, TG1, TG2, TG3, . . . , TG62, TG63 may receive the plurality of reference voltages VREF1_0, VREF1_1, VREF1_2, VREF1_3, . . . , VREF1_62, VREF1_63, respectively, and may be commonly connected to a first output node NO1.

The plurality of transmission gates TG0, TG1, TG2, TG3, . . . , TG62, TG63 may provide at least one of the plurality of reference voltages VREF1_0, VREF1_1, VREF1_2, VREF1_3, . . . , VREF1_62, VREF1_63 as the selected reference voltage VREF_S at the first output node NO1, in response to selection signals SEL0, SEL1, SEL2, SEL3, . . . , SEL62, SEL63 and inverted selection signals SEL0B, SEL1B, SEL2B, SEL3B, . . . , SEL62B, SEL63B.

The switch SW1 may be connected between the first output node NO1 and a second output node NO2, the unit gain buffer UBC may be connected to the first output node NO1 and the switch SW2 may be connected between the unit gain buffer UBC and the second output node NO2.

The unit gain buffer UBC may have a positive input terminal coupled to the first output node NO1, a negative input terminal coupled to the switch SW2 and an output terminal coupled to the switch SW2. Output of the unit gain buffer UBC may be provided as the selected reference voltage VREF_S as the second output node NO2 through switching operations of the switches SW1 and SW2.

Figure 19:
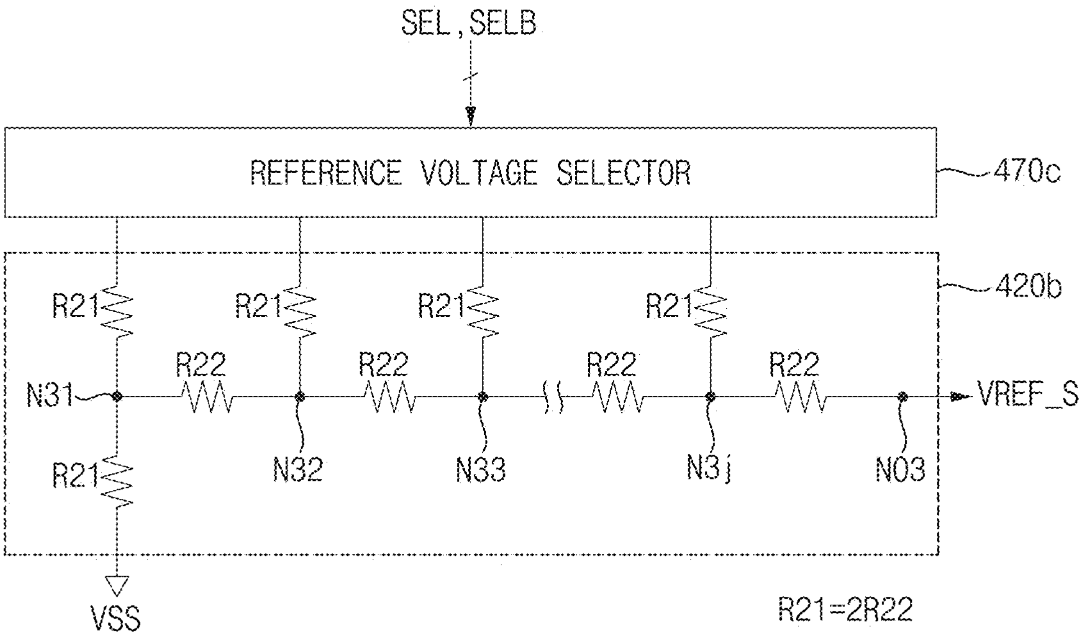
FIG. 19 illustrates a block diagram illustrating an example of a reference voltage generator in the calibration circuit of FIG. 11 and an example of a reference voltage selector in FIG. 12, according to example implementations.

FIG. 19 illustrates a block diagram illustrating an example of a reference voltage generator in the calibration circuit of FIG. 11 and an example of a reference voltage selector in FIG. 12, according to example implementations.

Referring to FIG. 19, a reference voltage generator 420*b* may include a plurality of first resistors R21 connected to a reference voltage selector 470*c* in parallel and a plurality of second resistors R22 connected between the plurality of first resistors R21.

Each of the plurality of second resistors R22 may be connected between nodes N31, N32, N33, . . . , N3*j*, NO3 between the plurality of first resistors R21. In addition, a first resistor R12 may be connected between the node N31 and the ground voltage VSS.

A first resistance value of each of the plurality of first resistors R21 may be twice a second resistance value of each of the plurality of second resistors R22. Therefore, the reference voltage generator 420b may be referred to as R-2R ladder type.

The reference voltage selector 470c may provide a portion of outputs of the reference voltage generator 420b as the selected reference voltage VREF_S at an output node NO3 based on the selection signals SEL and the inverted selection signals SELB.

Figure 20:
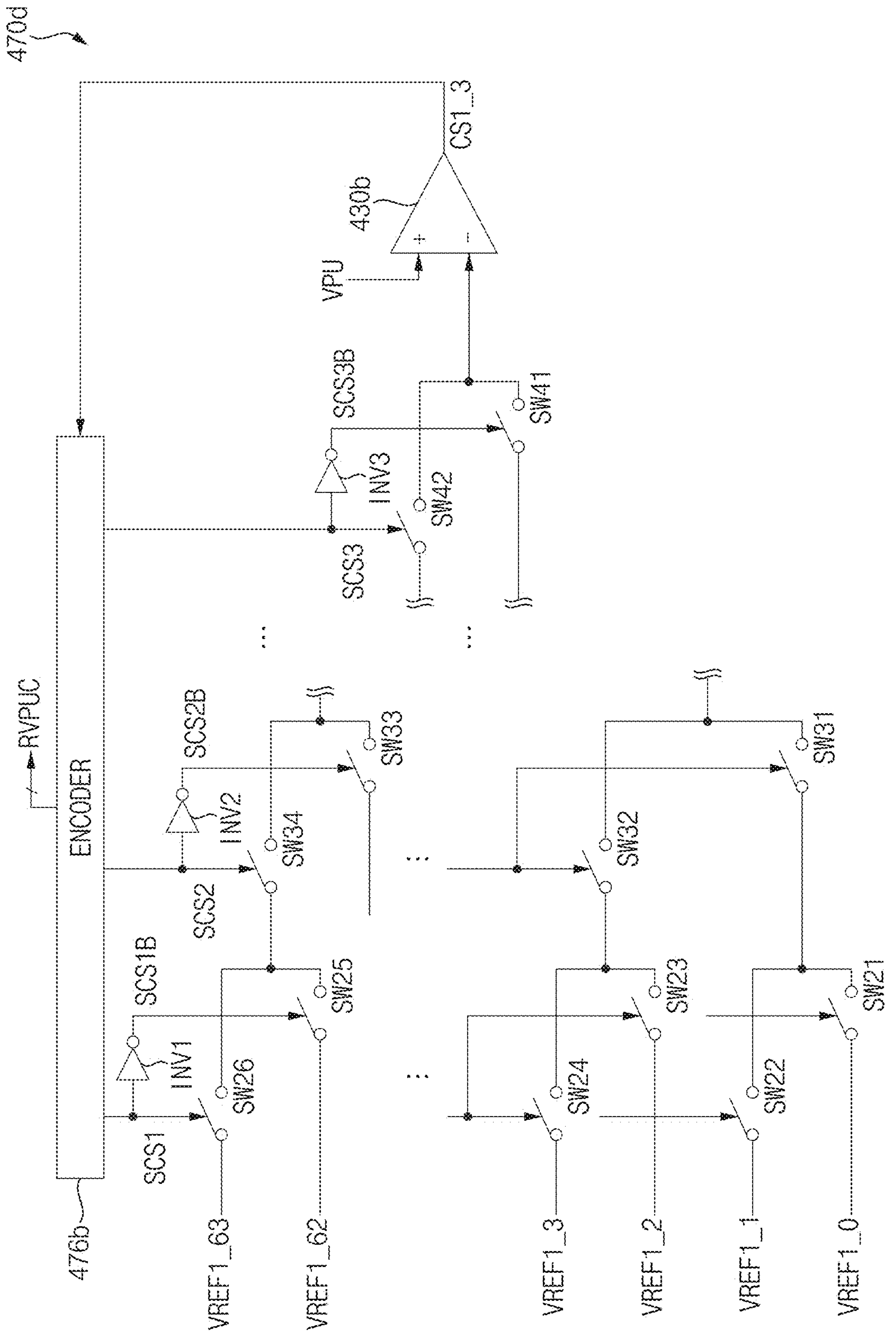
FIG. 20 illustrates examples of a reference voltage selector and a first reference voltage code generator in FIG. 12, according to example implementations.

FIG. 20 illustrates examples of a reference voltage selector and a first reference voltage code generator in FIG. 12, according to example implementations.

Referring to FIG. 20, a reference voltage selector 470d may include a plurality of switches SW21, SW22, SW23, SW24, SW25, SW26, SW31, SW32, SW33, SW34, SW41 and SW42 and a plurality of inverters INV1, INV2 and INV3 and the first reference voltage code generator 475 in FIG. 12 may employ an encoder 476b.

The encoder 476b may generate switching control signals SCS1, SCS2 and SCS3 and the inverters INV1, INV2 and INV3 may output inverted switching control signals SCS1B, SCS2B and SCS3b by inverting the switching control signals SCS1, SCS2 and SCS3.

The plurality of switches SW21, SW22, SW23, SW24, SW25 and SW26 may complementarily switch adjacent two reference voltages VREF1_0 and VREF1_1, VREF1_2 and VREF1_3, . . . , VREF1_62 and VREF1_63 from among the plurality of reference voltages VREF1_0, VREF1_1, VREF1_2, VREF1_3, . . . , VREF1_62, VREF1_63 in response to the switching control signal SCS1 and the inverted switching control signal SCS1B, the plurality of switches SW31, SW32, SW33 and SW34 may complementarily switch outputs of the switches SW21, SW22, SW23, SW24, SW25 and SW26 in response to the switching control signal SCS2 and the inverted switching control signal SCS2B and the switches SW41 and SW42 may complementarily switch outputs of the switches in the previous stage in response to the switching control signal SCS3 and the inverted switching control signal SCS3B.

A comparator 430b may correspond to the first comparator circuit 430 in FIG. 11, may generate a first comparison signal CS1_3 by comparing the first voltage VPU with the outputs of the switches SW41 and SW42 and may provide the first comparison signal CS1_3 to the encoder 476b. The encoder 476b may generate the first reference voltage code RVPUC by encoding the first comparison signal CS1_3.

The reference voltage selector 470d, the comparator 430b and the encoder 476b in FIG. 20 may convert a portion of the plurality of reference voltages VREF1_0, VREF1_1, VREF1_2, VREF1_3, . . . , VREF1_62, VREF1_63 to the first reference voltage code RVPUC by a successive approximation scheme, the reference voltage selector 470d, the comparator 430b and the encoder 476b may be referred to as a successive approximation register (SAR) ADC.

Figure 21:
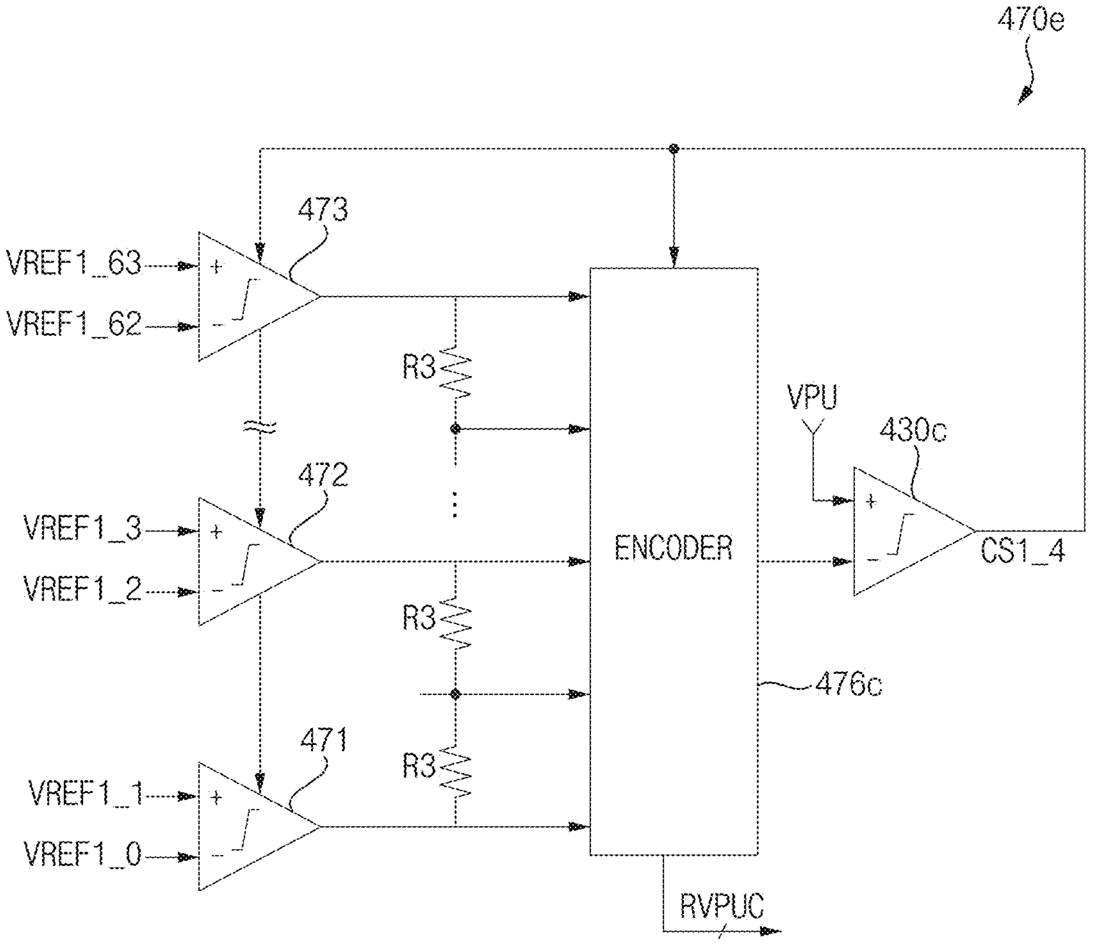
FIG. 21 illustrates examples of a reference voltage selector and a first reference voltage code generator in FIG. 12, according to example implementations.

FIG. 21 illustrates examples of a reference voltage selector and a first reference voltage code generator in FIG. 12, according to example implementations.

Referring to FIG. 21, a reference voltage selector 470e may include a plurality of comparators 471, 472 and 473 and resistors R3 and the first reference voltage code generator 475 in FIG. 12 may employ an encoder 476c.

Each of the plurality of comparators 471, 472 and 473 may compare adjacent two reference voltages VREF1_0 and VREF1_1, VREF1_2 and VREF1_3, . . . , VREF1_62 and VREF1_63 from among the plurality of reference voltages VREF1_0, VREF1_1, VREF1_2, VREF1_3, . . . , VREF1_62, VREF1_63 and the resistors R3 may divide outputs of the plurality of comparators 471, 472 and 473 with a specific ratio and may provide the divided outputs to the encoder 476c, and the encoder 476c may output an interpolated value by interpolating the divided outputs.

A comparator 430c may correspond to the first comparator circuit 430 in FIG. 11, may generate a first comparison signal CS1_4 by comparing the first voltage VPU with the interpolated value and may provide the first comparison signal CS1_4 to the encoder 476c. The encoder 476c may generate the first reference voltage code RVPUC by encoding the first comparison signal CS1_4.

The reference voltage selector 470e, the comparator 430c and the encoder 476c may convert a portion of the plurality of reference voltages VREF1_0, VREF1_1, VREF1_2, VREF1_3, . . . . VREF1_62, VREF1_63 to the first reference voltage code RVPUC by interpolating divided outputs of the comparators 471, 472 and 473 and the reference voltage selector 470e, the comparator 430c and the encoder 476c may be referred to as an interpolating ADC.

Figure 22:
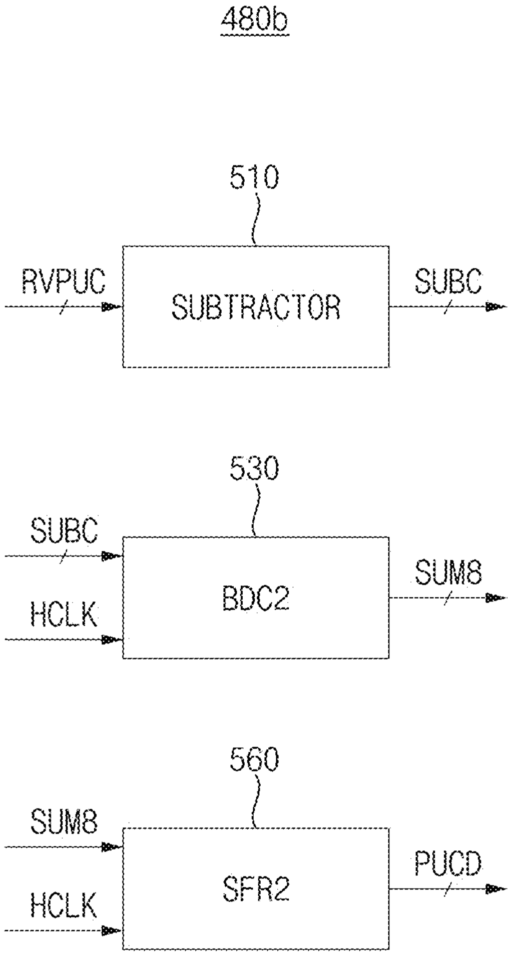
FIG. 22 is circuit diagram illustrating an example of a pull-up code generator in the control/code generation circuit of FIG. 12 according to example implementations.

FIG. 22 is circuit diagram illustrating an example of a pull-up code generator in the control/code generation circuit of FIG. 12 according to example implementations.

Referring to FIG. 22, a pull-up code generator 480b may include, a subtractor 510, a binary division circuit BDC2 530 and a shift register SFR2 560.

The subtractor 510 may generate a subtractor code SUBC based on the first reference voltage code RVPUC. The binary division circuit 530 may generate a plurality of summed signals based on the clock signal HCLK and the subtractor code SUBC and may provide a most significant summed signal SUM8 from the plurality of summed signals to the shift register 560.

The shift register 560 may generate the pull-up control code PUCD based on the clock signal HCLK and the most significant summed signal SUM8.

Figure 23:
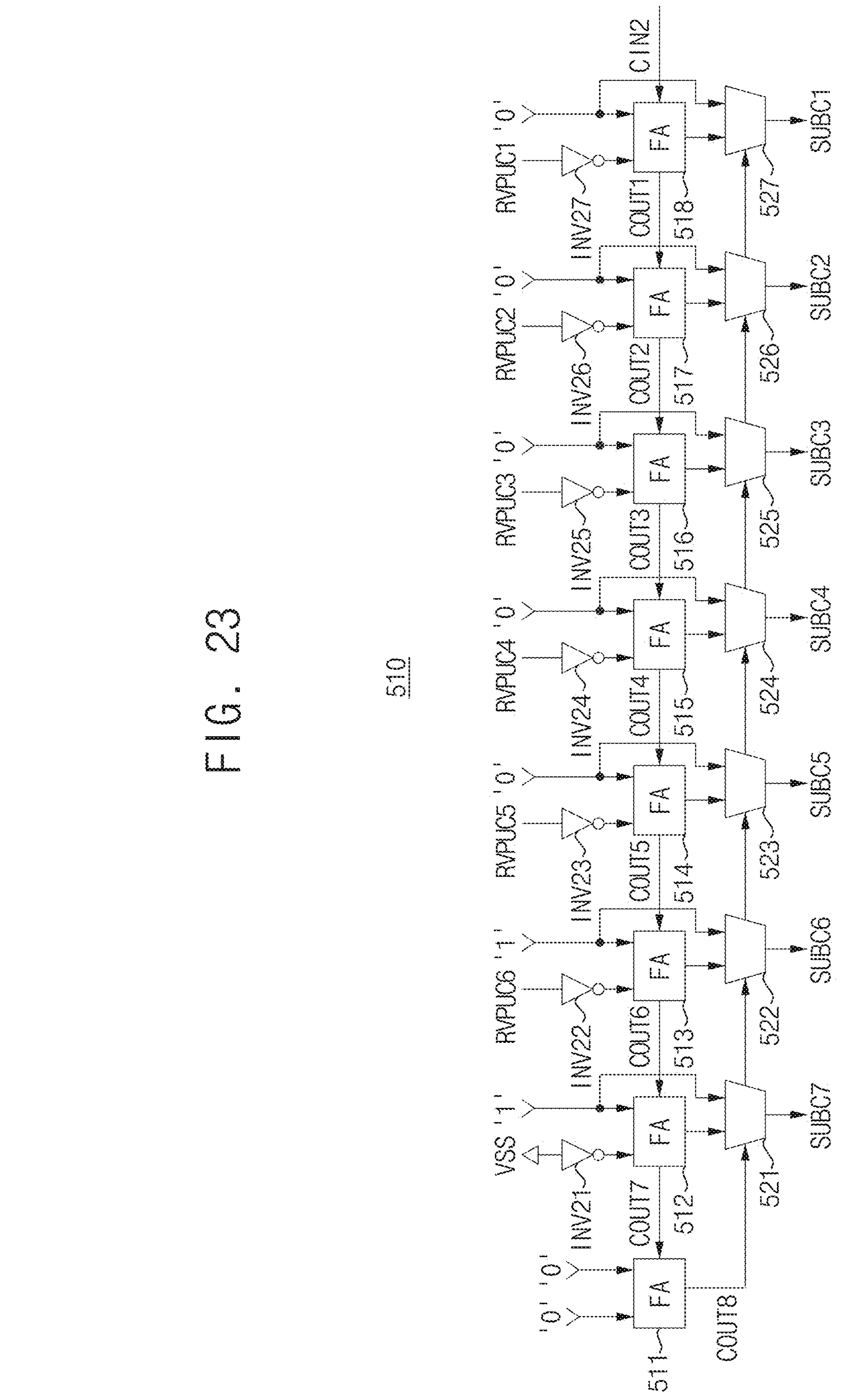
FIG. 23 is circuit diagram illustrating an example of a subtractor in the pull-up code generator of FIG. 22 according to example implementations.

FIG. 23 is circuit diagram illustrating an example of a subtractor in the pull-up code generator of FIG. 22 according to example implementations.

Referring to FIG. 23, the subtractor 510 may include a plurality of full adders 511, 512, 513, 514, 151, 516, 517 and 518, a plurality of inverters INV21, INV22, INV23, INV24, INV25, INV26 and INV27 and a plurality of multiplexers 521, 522, 523, 524, 525, 526 and 527.

The inverter INV21 may invert the ground voltage VSS and may provide an inverted version of the ground voltage VSS to the full adder 512. Each of the plurality of inverters INV22, INV23, INV24, INV25, INV26 and INV27 may invert respective ones of bits RVPUC6, RVPUC5, RVPUC4, RVPUC3, RVPUC2 and RVPUC1 of the first reference voltage code RVPUC and may provide respective inverted versions of the bits RVPUC6, RVPUC5, RVPUC4, RVPUC3, RVPUC2 and RVPUC1 to respective ones of the plurality of full adders 513, 514, 151, 516, 517 and 518.

The full adder 518 may output a summed value by summing an output of the inverter INV27 and '0', and the multiplexer 527 may output one of an output of the full adder 518 and '0' as a bit SUBC1 of the subtractor code SUBC based on a carry-out signal COUT8.

The full adder 517 may output a summed value by summing an output of the inverter INV26 and '0', and the multiplexer 526 may output one of an output of the full adder 517 and '0' as a bit SUBC2 of the subtractor code SUBC based on the carry-out signal COUT8. The full adder 516 may output a summed value by summing an output of the inverter INV25 and '0', and the multiplexer 525 may output one of an output of the full adder 516 and '0' as a bit SUBC3 of the subtractor code SUBC based on the carry-out signal COUT8.

The full adder 515 may output a summed value by summing an output of the inverter INV24 and '0', and the multiplexer 524 may output one of an output of the full adder 515 and '0' as a bit SUBC4 of the subtractor code SUBC based on the carry-out signal COUT8. The full adder 514 may output a summed value by summing an output of the inverter INV23 and '0', and the multiplexer 523 may output one of an output of the full adder 514 and '0' as a bit SUBC5 of the subtractor code SUBC based on the carry-out signal COUT8.

The full adder 513 may output a summed value by summing an output of the inverter INV22 and '1', and the multiplexer 522 may output one of an output of the full adder 513 and '1' as a bit SUBC6 of the subtractor code SUBC based on the carry-out signal COUT8. The full adder 512 may output a summed value by summing an output of the inverter INV21 and '1', and the multiplexer 521 may output one of an output of the full adder 512 and '1' as a bit SUBC7 of the subtractor code SUBC based on the carry-out signal COUT8. The full adder 511 may output the carry-out signal COUT8 by summing '0' and '0'.

The full adder 518 may provide a carry-out signal COUT1 to the full adder 517 based on a carry-in signal CIN2, the full adder 517 may provide a carry-out signal COUT2 to the full adder 516, the full adder 516 may provide a carry-out signal COUT3 to the full adder 515, the full adder 515 may provide a carry-out signal COUT4 to the full adder 514, the full adder 514 may provide a carry-out signal COUT5 to the full adder 513, the full adder 513 may provide a carry-out signal COUT6 to the full adder 512, the full adder 512 may provide a carry-out signal COUT7 to the full adder 511 and the full adder 511 may output the carry-out signal COUT8.

Therefore, the subtractor 510 may generate the subtractor code SUBC based on the first reference voltage code RVPUC and the two's complement of the first reference voltage code RVPUC.

Figure 24:
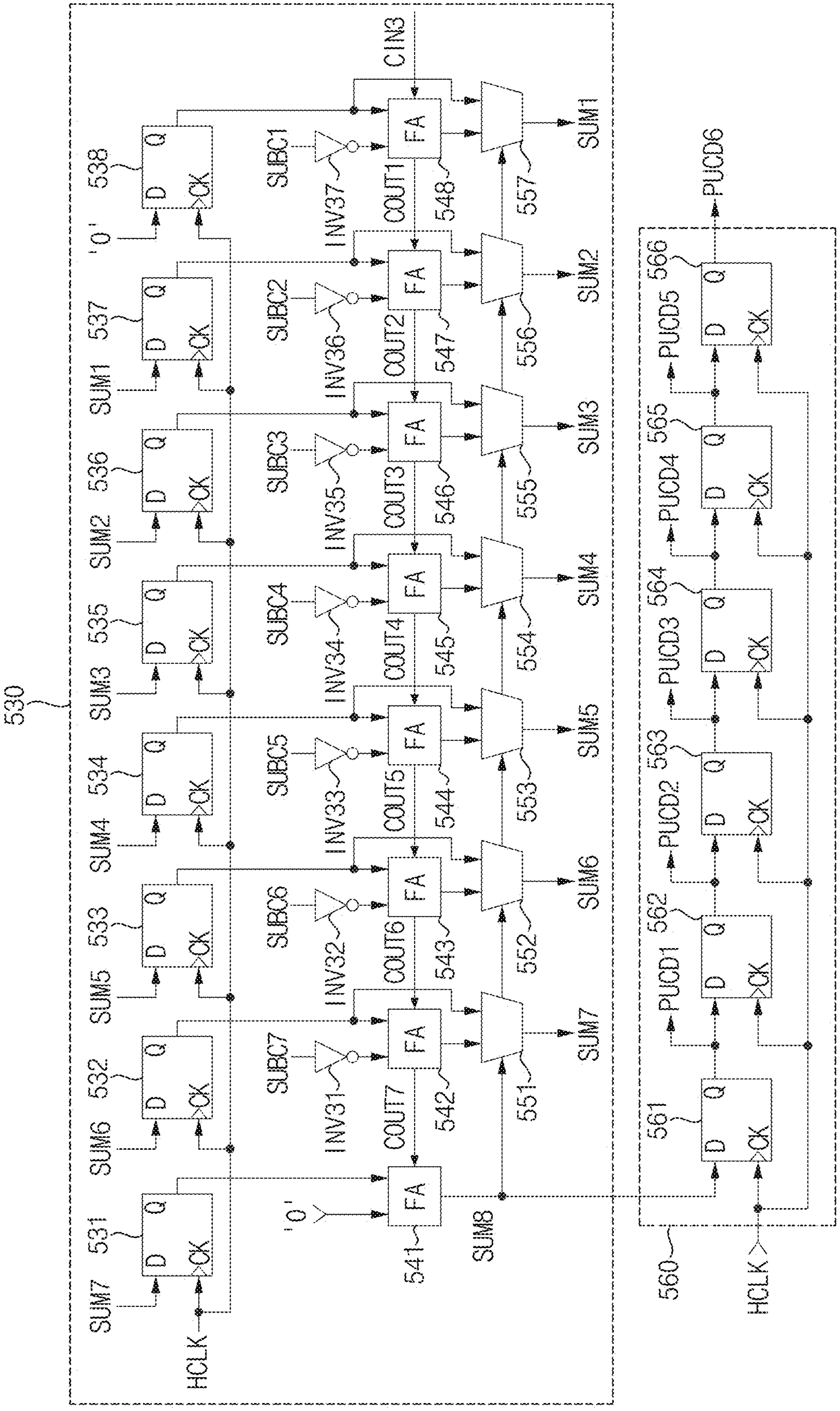
FIG. 24 is circuit diagram illustrating examples of a binary division circuit and a shift register in the pull-up code generator of FIG. 22 according to example implementations.

FIG. 24 is circuit diagram illustrating examples of a binary division circuit and a shift register in the pull-up code generator of FIG. 22 according to example implementations.

Referring to FIG. 24, the binary division circuit 530 may generate a plurality of summed signals SUM8, SUM7, SUM6, SUM5, SUM4, SUM3, SUM2 and SUM1 based on the clock signal HCLK and bits SUBC7, SUBC6, SUBC5, SUBC4, SUBC3, SUBC2 and SUBC1 of the subtractor code SUBC.

The shift register 560 may generate bits PUCD1, PUCD2, PUCD3, PUCD4, PUCD5 and PUCD6 of the pull-up control code PUCD sequentially based on the clock signal HCLK and the most significant summed signal SUM8 from the plurality of summed signals SUM8, SUM7, SUM6, SUM5, SUM4, SUM3, SUM2 and SUM1.

The binary division circuit 530 may include a first group of D-flipflops 531, 532, 533, 534, 535, 536, 537 and 538, a plurality of full adders 541, 542, 543, 544, 545, 546, 547 and 548, a plurality of inverters INV31, INV32, INV33, INV34, INV35, INV36 and INV37 and a plurality of multiplexers 551, 552, 553, 554, 555, 556 and 557.

An initial set value of the D-flipflop 531 may be '0', an initial set value of each of the D-flipflops 532, 533, 534, 535, 5363 and 537 may be respective one of '1', '0', '0', '0', '0' and '0' which are the same as respective one of bits of the initial pull-up control code and an initial set value of the D-flipflop 538 may be '0'.

Each of the D-flipflops 531, 532, 533, 534, 535, 536 and 537 may include a data terminal D receiving a respective one of the summed signals SUM7, SUM6, SUM5, SUM4, SUM3, SUM2 and SUM1, a clock terminal CK receiving the clock signal HCLK and an output terminal Q. The D-flipflop 538 may include a data terminal D receiving a logic low level '0', a clock terminal CK receiving the clock signal HCLK and an output terminal Q. Therefore, each of the first group of D-flipflops 531, 532, 533, 534, 535, 536, 537 and 538 may output a respective initial set value and then output a respective one of the summed signals SUM7, SUM6, SUM5, SUM4, SUM3, SUM2 and SUM1 and a logic low level '0' in synchronization of the clock signal HCLK.

Therefore, the first group of D-flipflops 531, 532, 533, 534, 535, 536, 537 and 538 may use the clock signal HCLK and the initial set values which are the same as the bits of the initial pull-up control code.

Each of the plurality of inverters INV31, INV32, INV33, INV34, INV35, INV36 and INV37 may invert respective one of bits SUBC7, SUBC6, SUBC5, SUBC4, SUBC3, SUBC2 and SUBC1 of the subtractor code SUBC and may provide respective inverted version of the bits SUBC7, SUBC6, SUBC5, SUBC4, SUBC3, SUBC2 and SUBC1 to respective one of the plurality of full adders 542, 543, 544, 545, 546, 547 and 548.

The full adder 548 may output a summed value by summing an output of the inverter INV37 and an output of the D-flipflop 538, and the multiplexer 557 may output one of an output of the full adder 548 and the output of the D-flipflop 538 as the summed signal SUM1 based on the most significant summed signal SUM8. The full adder 547 may output a summed value by summing an output of the inverter INV36 and an output of the D-flipflop 537, and the multiplexer 556 may output one of an output of the full adder 547 and the output of the D-flipflop 537 as the summed signal SUM2 based on the most significant summed signal SUM8.

The full adder 546 may output a summed value by summing an output of the inverter INV35 and an output of the D-flipflop 536, and the multiplexer 555 may output one of an output of the full adder 546 and the output of the D-flipflop 536 as the summed signal SUM3 based on the most significant summed signal SUM8. The full adder 545 may output a summed value by summing an output of the inverter INV34 and an output of the D-flipflop 535, and the multiplexer 554 may output one of an output of the full adder 545 and the output of the D-flipflop 535 as the summed signal SUM4 based on the most significant summed signal SUM8.

The full adder 544 may output a summed value by summing an output of the inverter INV33 and an output of the D-flipflop 534, and the multiplexer 553 may output one of an output of the full adder 544 and the output of the D-flipflop 534 as the summed signal SUM5 based on the most significant summed signal SUM8. The full adder 543 may output a summed value by summing an output of the inverter INV32 and an output of the D-flipflop 533, and the multiplexer 552 may output one of an output of the full adder 543 and the output of the D-flipflop 533 as the summed signal SUM6 based on the most significant summed signal SUM8.

The full adder 542 may output a summed value by summing an output of the inverter INV31 and an output of the D-flipflop 532, and the multiplexer 551 may output one of an output of the full adder 542 and the output of the D-flipflop 532 as the summed signal SUM7 based on the most significant summed signal SUM8. The full adder 541 may output most significant summed signal SUM8 by summing '0' and an output of the D-flipflop 531.

The full adder 548 may provide a carry-out signal COUT1 to the full adder 547 based on a carry-in signal CIN3, the full adder 547 may provide a carry-out signal COUT2 to the full adder 546, the full adder 546 may provide a carry-out signal COUT3 to the full adder 545, the full adder 545 may provide a carry-out signal COUT4 to the full adder 544, the full adder 544 may provide a carry-out signal COUT5 to the full adder 543, the full adder 543 may provide a carry-out signal COUT6 to the full adder 542, the full adder 542 may provide a carry-out signal COUT7 to the full adder 541.

Therefore, the plurality of full adders 541, 542, 543, 544, 545, 546, 547 and 548 and the plurality of multiplexers 551, 552, 553, 554, 555, 556 and 557 may generate the plurality of summed signals SUM8, SUM7, SUM6, SUM5, SUM4, SUM3, SUM2 and SUM1 based on the bits SUBC7, SUBC6, SUBC5, SUBC4, SUBC3, SUBC2 and SUBC1 of the subtractor code SUBC and the outputs of the first group of D-flipflops 531, 532, 533, 534, 535, 536, 537 and 538.

The shift register 560 may include a second group of D flipflops 561, 562, 563, 564, 565 and 566 which are connected in series. An initial set value of each of the second group of D-flipflops 561, 562, 563, 564, 565 and 566 may be '0'

The D-flipflop 561 may include a data terminal D receiving the most significant summed signal SUM8, a clock terminal CK receiving the clock signal HCLK and an output terminal Q outputting a bit PUCD1 of the pull-up control code PUCD. The D-flipflop 562 may include a data terminal D connected to the output terminal Q of the D-flipflop 561, a clock terminal CK receiving the clock signal HCLK and an output terminal Q outputting a bit PUCD2 of the pull-up control code PUCD.

The D-flipflop 563 may include a data terminal D connected to the output terminal Q of the D-flipflop 562, a clock terminal CK receiving the clock signal HCLK and an output terminal Q outputting a bit PUCD3 of the pull-up control code PUCD. The D-flipflop 564 may include a data terminal D connected to the output terminal Q of the D-flipflop 563, a clock terminal CK receiving the clock signal HCLK and an output terminal Q outputting a bit PUCD4 of the pull-up control code PUCD.

The D-flipflop 565 may include a data terminal D connected to the output terminal Q of the D-flipflop 564, a clock terminal CK receiving the clock signal HCLK and an output terminal Q outputting a bit PUCD5 of the pull-up control code PUCD. The D-flipflop 566 may include a data terminal D connected to the output terminal Q of the D-flipflop 565, a clock terminal CK receiving the clock signal HCLK and an output terminal Q outputting a bit PUCD6 of the pull-up control code PUCD.

The D-flipflop 561 from among the second group of D-flipflops 561, 562, 563, 564, 565 and 566 may output a first bit PUCD1 of the pull-up control code PUCD at the output terminal Q based in the clock signal HCLK and the most significant summed signal SUM8, and each of rest D-flipflops 562, 563, 564, 565 and 566 may have the data terminal D connected to the output terminal Q of a previous D-flipflop and may output corresponding one of the bits PUCD2, PUCD3, PUCD4, PUCD5 and PUCD6 of the pull-up control code PUCD.

The pull-up code generator 480*b* in FIG. 22 is a configuration in a case when the output driver 360 in FIG. 4 drives the data I/O pad 301 by low tap termination (LTT) scheme.

When the reference voltage generator 420 in FIG. 11 employs the reference voltage generator 420*a* in FIG. 15 and the pull-up driver 411 is set with an initial pull-up control code of '100000', the reference voltage generator 420*a* may generate a plurality of reference voltages corresponding to K*VCCQ/64. Here, K may be one of 0 to 63. Therefore, the pull-up control code PUCD to be provided to the pull-up driver 411 may be represented by the initial pull-up control code+$(2^6/(3*2^5-K))*2^5$.

A configuration of the pull-down code generator 480_1 may be substantially the same as a configuration of the pull-up code generator 480*b* of FIG. 22.

Figure 25:
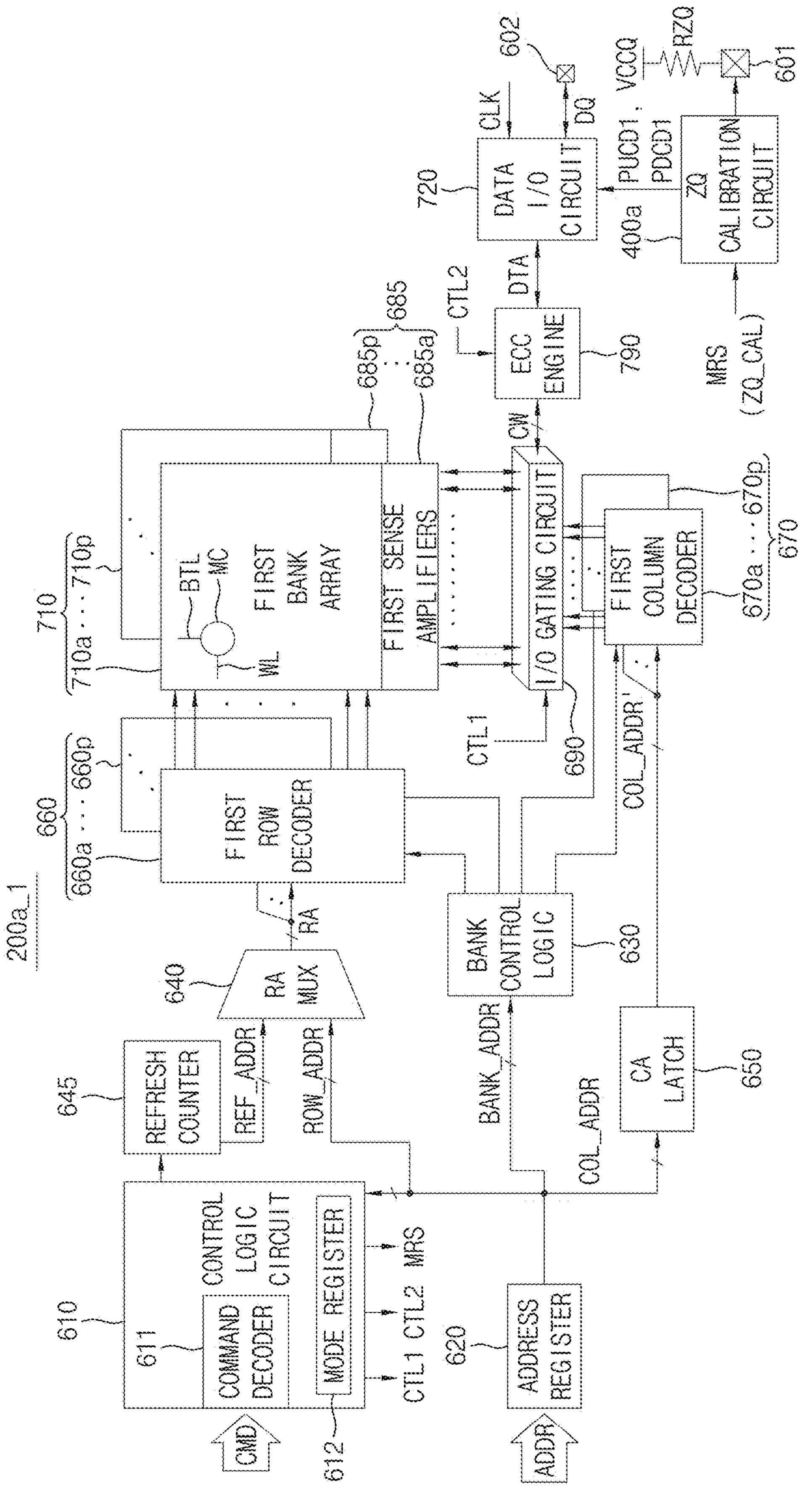
FIG. 25 is a block diagram illustrating an example of one of the memory dies in the memory system of FIG. 1 according to example implementations.

FIG. 25 is a block diagram illustrating an example of one of the memory dies in the memory system of FIG. 1 according to example implementations.

Although FIG. 25 illustrates a configuration of a memory die 200*a*_1 corresponding to the memory die 200*a*, each configuration of the memory die 200*a*~200*k* may be substantially the same as the configuration of the memory die 200*a*_1.

In FIG. 25, assuming that the memory die 200*a*_1 is a volatile memory device.

Referring to FIG. 25, the memory die 200*a*_1 may include a control logic circuit 610, an address register 620, a bank control logic 630, a row address multiplexer 640, a column address latch 650, a row decoder 660, a column decoder 670, a memory cell array 710, a sense amplifier unit 685, an I/O gating circuit 690, a refresh counter 645, a data I/O circuit 720, an error correction code (ECC) engine 790 and an impedance (ZQ) calibration circuit 400*a*.

The memory cell array 710 may include first through sixteenth bank arrays 710*a*~710*p*. The row decoder 660 may include first through sixteenth row decoders 660*a*~660*p* respectively coupled to the first through sixteenth bank arrays 710*a*~710*p*. The column decoder 670 may include first through sixteenth column decoders 670*a*~670*p* respectively coupled to the first through sixteenth bank arrays 710*a*~710*p*. The sense amplifier unit 685 may include first through sixteenth sense amplifiers 685*a*~685*p* respectively coupled to the first through sixteenth bank arrays 710*a*~710*p*. The first through sixteenth bank arrays 710*a*~710*p*, the first through sixteenth row decoders 660*a*~660*p*, the first through sixteenth column decoders 670*a*~670*p*, and first through sixteenth sense amplifiers 685*a*~685*p* may form first through sixteenth banks.

Each of the first through eighth bank arrays 710*a*~710*h* may include a plurality of memory cells MC, formed at intersections of a plurality of word-lines WL and a plurality of bit-line BTL.

The address register 620 may receive the address ADDR including a bank address BANK_ADDR, a row address ROW_ADDR, and a column address COL_ADDR from the memory controller 30. The address register 620 may provide the received bank address BANK_ADDR to the bank control logic 630, provide the received row address ROW_ADDR to the row address multiplexer 640, and provide the received column address COL_ADDR to the column address latch 650.

The bank control logic 630 may generate bank control signals in response to the bank address BANK_ADDR. One of the first through sixteenth row decoders 660*a*~660*p* corresponding to the bank address BANK_ADDR may be activated in response to the bank control signals, and one of the first through sixteenth column decoders 670*a*~670*p* corresponding to the bank address BANK_ADDR may be activated in response to the bank control signals.

The row address multiplexer 640 may receive the row address ROW_ADDR from the address register 620, and may receive a refresh row address REF_ADDR from the refresh counter 645. The row address multiplexer 640 may selectively output one of the row address ROW_ADDR and the refresh row address REF_ADDR as a row address RA. The row address RA that is output from the row address multiplexer 640 may be applied to the first through sixteenth row decoders 660*a*~660*p*.

The refresh counter 645 may sequentially increase or decrease the refresh row address REF_ADDR under control of the control logic circuit 610.

The activated one of the first through sixteenth row decoders 660*a*~660*p* may decode the row address RA that is output from the row address multiplexer 640, and may activate a word-line corresponding to the row address RA. For example, the activated bank row decoder may apply a word-line driving voltage to the word-line corresponding to the row address RA.

The column address latch 650 may receive the column address COL_ADDR from the address register 620, and may temporarily store the received column address COL_ADDR. In example implementations, in a burst mode, the column address latch 650 may generate column addresses COL_ADDR' that increment from the received column address COL_ADDR. The column address latch 650 may apply the temporarily stored or generated column address COL_ADDR' to the first through sixteenth column decoders 670*a*~670*p*.

The activated one of the first through sixteenth column decoders 670*a*~670*p* may decode the column address COL_ADDR' that is output from the column address latch 650, and may control the I/O gating circuit 690 to output data corresponding to the column address COL_ADDR.

The I/O gating circuit 690 may include circuitry for gating input/output data. The I/O gating circuit 690 may further include read data latches for storing data that is output from the first through sixteenth bank arrays 710*a*~710*p*, and write drivers for writing data to the first through sixteenth bank arrays 710*a*~710*p*.

A codeword CW that is read from one bank array of the first through sixteenth bank arrays 710*a*~710*p* may be sensed by a sense amplifier coupled to the one bank array from which the data is to be read, and may be stored in the read data latches. The codeword CW stored in the read data latches may be provided to the ECC engine 790. The ECC engine 790 may perform an ECC decoding on the codeword CW to provide the data DTA to the data I/O circuit 720. The data I/O circuit 720 may convert the data DTA to the data signal DQ and may transmit the data signal DQ to the memory controller 30.

The data signal DQ to be written in one bank array of the first through sixteenth bank arrays 710*a*~710*p* may be provided to the data I/O circuit 720 from the memory controller 30. The data I/O circuit 720 may convert the data signal DQ to the data DTA and provide the data DTA to the ECC engine 790. The ECC engine 790 may perform an ECC encoding on the data DTA to generate parity bits and the ECC engine 790 may provide the data DTA and the parity bits to the I/O gating circuit 690. The I/O gating circuit 690 may write the data DTA and the parity bits in a sub-page in one bank array through the write drivers.

The data I/O circuit 720 may drive bits of the data DTA based on a pull-up control code PUCD1 and a pull-down control code PDCD1 from the impedance calibration circuit 400*a* to generate the data signal DQ having a target VOH level and provide the data signal DQ to the memory controller 30 through a data I/O pad 602.

The ECC engine 790 may perform an ECC encoding and an ECC decoding on the data DTA based on a second control signal CTL2 from the control logic circuit 610.

The impedance calibration circuit 400*a* may be connected to the external resistor RZQ through an impedance (ZQ) pad 601*a* and the external resistor RZQ may be coupled to the power supply voltage VCCQ.

The impedance calibration circuit 400*a* may perform a first impedance calibration to generate a pull-up control code PUCD1 and a pull-down control code PDCD1 during an impedance calibration interval, in response to a mode register set signal MRS or an impedance calibration command ZQ_CAL and may provide the pull-up control code PUCD1 and a pull-down control code PDCD1 to a data output circuit in the data I/O circuit 720.

The impedance calibration circuit 400*a*, in response to the impedance calibration command ZQ_CAL, may perform the impedance calibration operation by generating a first reference voltage code when a voltage level of a selected reference voltage becomes the same as a first voltage, which is based on an initial pull-up control code, of a first node coupled to the impedance pad 601 by comparing the first voltage with the selected reference voltage, generating the pull-up control code PUCD1 for driving the first node based on the first reference voltage code, generating a second reference voltage code when the voltage level of the selected reference voltage becomes the same as a second voltage, which is based on the pull-up control code PUCD1, of a second node by comparing the second voltage with the selected reference voltage, and generating the pull-down control code PDCD1 for driving the second node based on the second reference voltage code.

The control logic circuit 610 may control operations of the memory die 200*a*_1. For example, the control logic circuit 610 may generate control signals for the memory die 200*a*_1 in order to perform a write operation, a read operation or an impedance calibration operation. The control logic circuit 610 may include a command decoder 611 that decodes the command CMD received from the memory controller 30, and may include a mode register 612 that sets an operation mode of the memory die 200*a*_1.

The command decoder 611 may generate the control signals corresponding to the command CMD by decoding a write enable signal, a row address strobe signal, a column address strobe signal, a chip select signal, etc. The control logic circuit 610 may generate a first control signal CTL1 to control the I/O gating circuit 690, may generate the second control signal CTL2 to control the ECC engine 790 and may generate the mode register set signal MRS to control the impedance calibration circuit 400*a*.

Figure 26A:
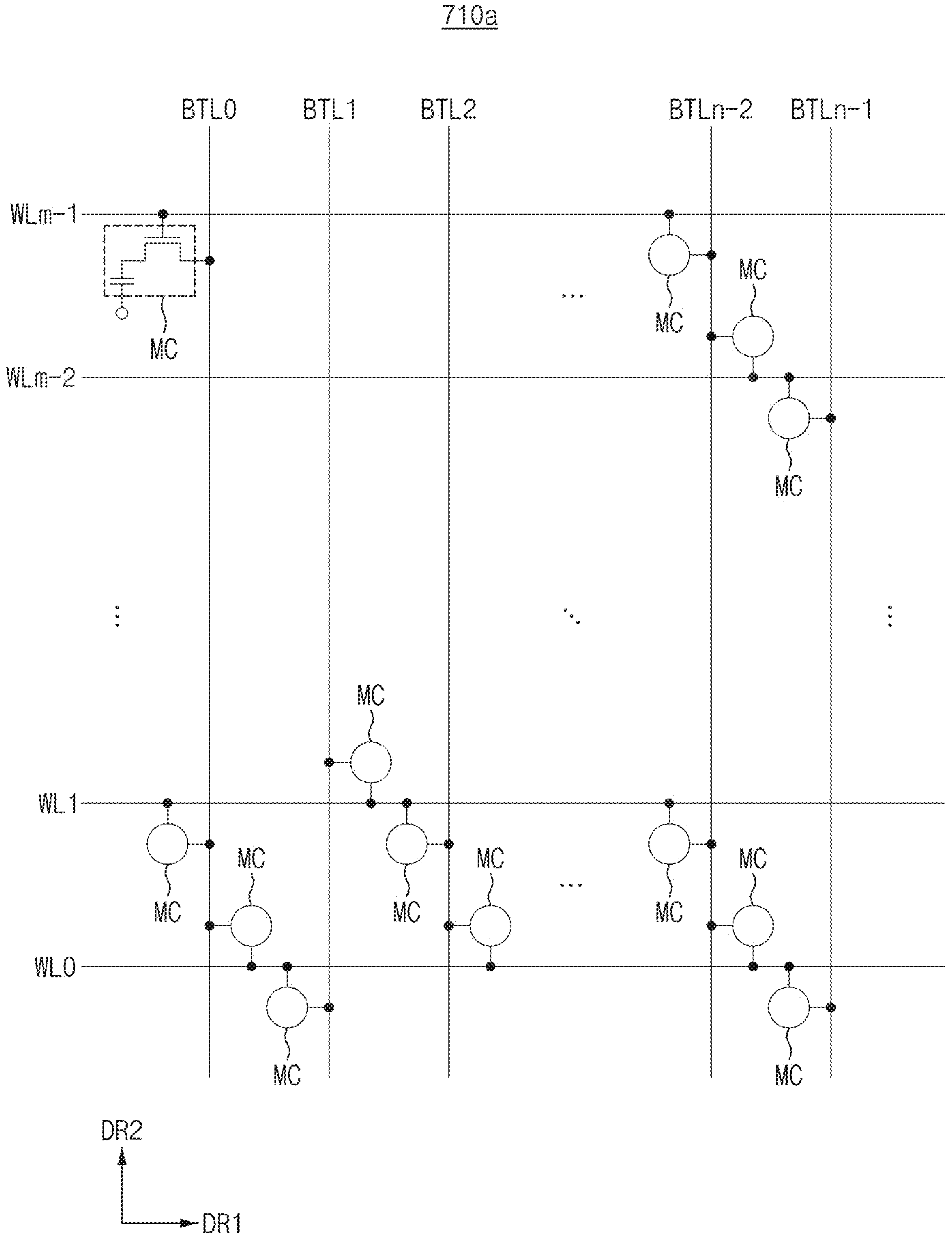
FIG. 26A illustrates an example of a first bank array in the memory die of FIG. 25 according to example implementations.

FIG. 26A illustrates an example of a first bank array in the memory die of FIG. 25 according to example implementations.

Referring to FIG. 26A, the first bank array 710*a* may include a plurality of word-lines WL0~WLm−1 (m is a natural number greater than two), a plurality of bit-lines BTL0~BTLn−1 (n is a natural number greater than two), and a plurality of memory cells MCs disposed at intersections between the word-lines WL0~WLm−1 and the bit-lines BTL0~BTLn−1. Each of the memory cells MCs may include a cell transistor coupled to each of the word-lines WL0~WLm−1 and each of the bit-lines BTL0~BTLn−1 and a cell capacitor coupled to the cell transistor. Each of the memory cells MCs may have a DRAM cell structure. Each of the word-lines WL0~WLm−1 extends in a first direction DR1 and each of the bit-lines BTL1~BTLn−1 extends in a second direction DR2 crossing the first direction DR1.

The word-lines WL0~WLm−1 coupled to the plurality of memory cells MCs may be referred to as rows of the first bank array 710*a* and the bit-lines BTL0~BTLn−1 coupled to the plurality of memory cells MCs may be referred to as columns of the first bank array 710*a*.

Figure 26B:
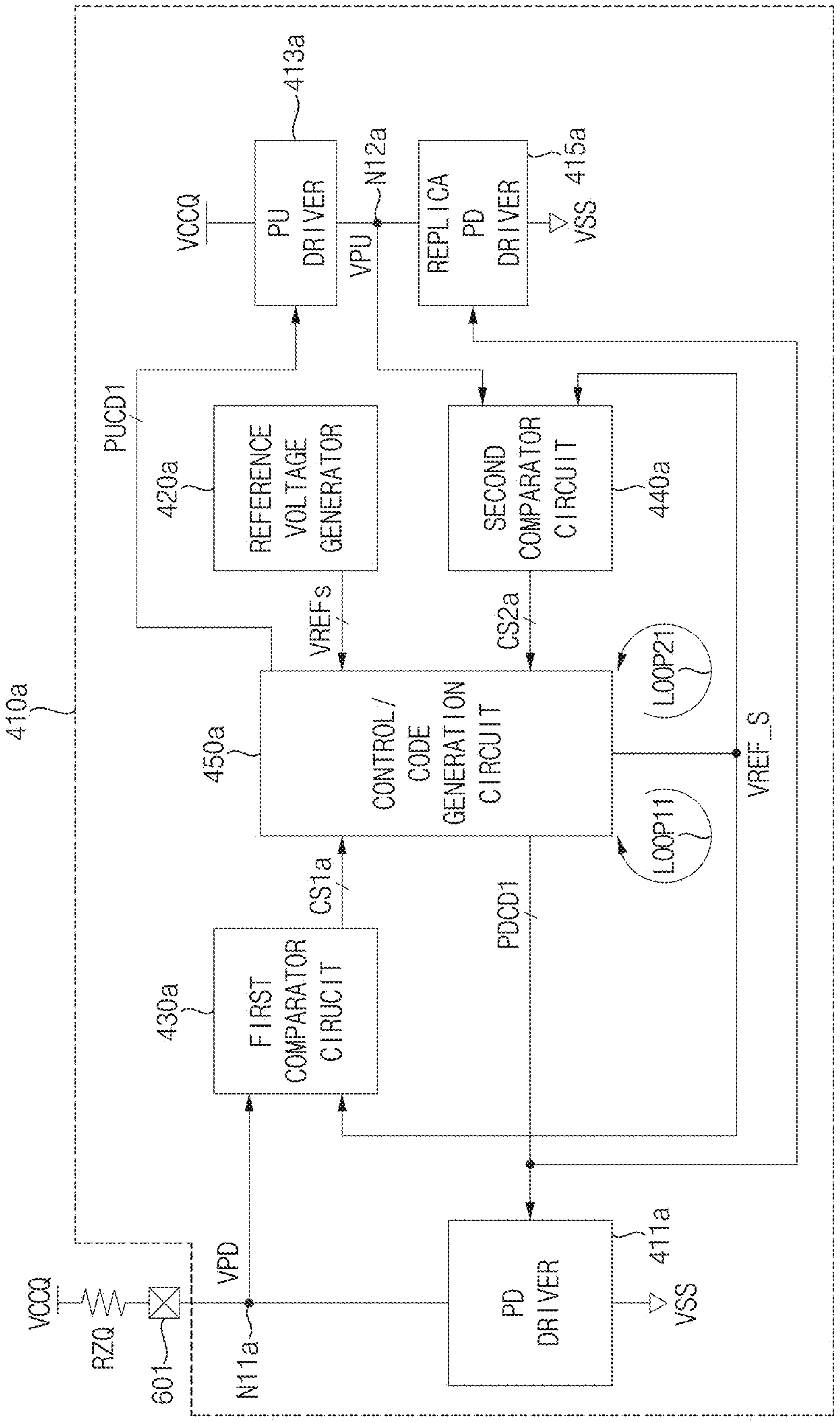
FIG. 26B is a block diagram illustrating an example of a calibration circuit included in the impedance calibration circuit in FIG. 25 according to example implementations.

FIG. 26B is a block diagram illustrating an example of a calibration circuit included in the impedance calibration circuit in FIG. 25 according to example implementations.

Referring to FIG. 26B, a calibration circuit 410*a* may include a pull-down PD driver 411*a*, a pull-up PU driver 413*a*, a replica pull-down PD driver 415*a*, a reference voltage generator 420*a*, a first comparator circuit 430*a*, a second comparator circuit 440*a* and a control/code generation circuit 450*a*. The calibration circuit 410*a* may perform an impedance calibration operation in response to a calibration enable signal ZQEN from an impedance control circuit such as the impedance control circuit 405 in FIG. 10.

The pull-down driver 411*a* may be connected between a first node N11*a* coupled to the impedance pad 601 and the ground voltage VSS, may drive the first node N11*a* with a first voltage VPD based on a preset initial pull-down control code. The impedance pad 601 may be connected to the external resistor RZQ and the external resistor RZQ may be connected to the power supply voltage VCCQ.

The reference voltage generator 420*a* may generate a plurality of reference voltages VREFs and may provide the plurality of reference voltages VREFs to the control/code generation circuit 450*a*.

The control/code generation circuit 450*a* may provide a selected reference voltage VERF_S to the first comparator circuit 430*a* and to the second comparator circuit 440*a* by selecting at least a portion from the plurality of reference voltages VREFs.

The first comparator circuit 430*a* may generate a first comparison signal CS1*a* by comparing the first voltage VPD at the first node N11*a* with the selected reference voltage VREF_S and may provide the first comparison signal CS1*a* to the control/code generation circuit 450*a*.

The control/code generation circuit 450*a* may generate a first reference voltage code when a voltage level of the selected reference voltage VREF_S becomes the same as the first voltage VPD based on the first comparison signal CS1*a*, may generate the pull-down control code PDCD1 based on the first reference voltage code, and may provide the pull-down control code PDCD1 to the pull-down driver 411*a* and the replica pull-down driver 415*a*.

The replica pull-down driver 415*a* may be connected between a second node N12*a* and the ground voltage VSS and may drive the second node N12*a* with a second voltage VPU based on the pull-down control code PUCD1.

The second comparator circuit 440*a* may generate a second comparison signal CS2*a* by comparing the second voltage VPU at the second node N12*a* with the selected reference voltage VREF_S and may provide the second comparison signal CS2*a* to the control/code generation circuit 450*a*.

The control/code generation circuit 450*a* may generate a second reference voltage code when a voltage level of the selected reference voltage VREF_S becomes the same as the second voltage VPU based on the second comparison signal CS2*a*, may generate the pull-up control code PUCD1 based on the second reference voltage code, and may provide the pull-up control code PUCD1 to the pull-up driver 413*a*.

The pull-up driver 413 may drive the second node N12*a* based on the pull-up control code PUCD1.

The control/code generation circuit 450*a* may provide the pull-up control code PUCD1 and the pull-down control code PDCD1 to the output circuit 340 in FIG. 4.

The control/code generation circuit 450*a* and the first comparator circuit 430*a* may constitute a first loop LOOP11, may generate the first reference voltage code when the voltage level of the selected reference voltage VREF_S becomes the same as the first voltage VPD, and may generate the pull-down control code PDCD1 based on the first reference voltage code. In addition, the control/code generation circuit 450*a* and the second comparator circuit 440*a* may constitute a second loop LOOP21, may generate the second reference voltage code when the voltage level of the selected reference voltage VREF_S becomes the same as the second voltage VPU, and may generate the pull-up control code PUCD1 based on the second reference voltage code.

Although, an impedance calibration circuit including the calibration circuit 410*a* is not shown, the impedance calibration circuit including the calibration circuit 410*a* may further include the calibration controller 405 and the oscillator 407 in FIG. 10.

The conventional impedance calibration circuit generates a pull-down control code through a first loop including the pull-down driver 411*a* and the first node N11*a* and generates a pull-up control code through a second loop including the second node N12*a* and the pull-up driver 413*a*. The operating speed of an impedance calibration circuit is determined by an RC load of the first node N11*a* (i.e., ZQ node) and by an RC load of the second node N12*a*. Because, the first node N11*a* included in the first loop is coupled to an impedance pad connected to the external resistor RZQ in the conventional impedance calibration circuit, the RC load of the first node N11*a* increases and thus, the operating speed of the conventional impedance calibration circuit decreases. In addition, the RC load of the first node N11*a* increases as a number of the memory dies increases.

However, in the calibration circuit 410*a*, because the first loop LOOP11 does not include the first node N11*a* and the second loop LOOP21 does not include the second node N12*a*, no RC load is associated with an impedance calibration operation. Therefore, the operating speed of the impedance calibration circuit does not decrease even when a number of the memory dies increases.

Each of the reference voltage generator 420*a*, the first comparator circuit 430*a*, the second comparator circuit 440*a* and the control/code generation circuit 450*a* may have a same or similar configuration of each of the reference voltage generator 420, the first comparator circuit 430, the second comparator circuit 440 and the control/code generation circuit 450 described with reference to FIGS. 11 through 24.

Figure 27:
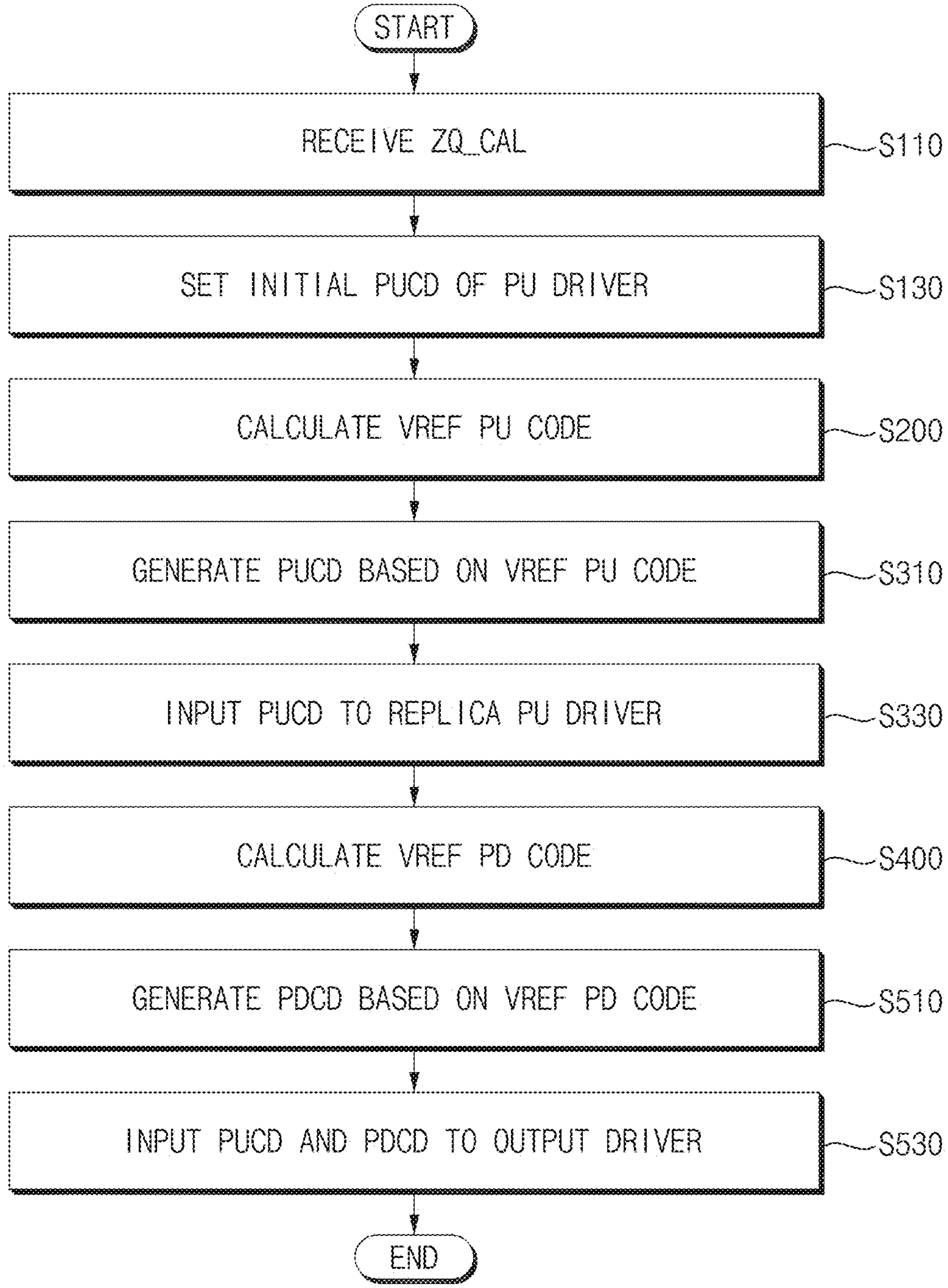
FIG. 27 is a flow chart illustrating a method of operating an impedance calibration circuit according to example implementations.

FIG. 27 is a flow chart illustrating a method of operating an impedance calibration circuit according to example implementations.

Referring to FIGS. 10 through 24 and 27, the impedance controller 405 receives the impedance calibration command ZQ_CAL (operation S110).

Initial pull-up control code of the pull-up driver 411 is set to '100000' (operation S130). The first node N11 is driven based on the initial pull-up control code, the control/code generation circuit 450 calculates (generates) a first reference voltage code VREF PU CODE (i.e., RVPUC) based on comparing the first voltage VPU at the first node N11 with the selected reference voltage VREF_S (operation S200). The control/code generation circuit 450 generates the pull-up control code PUCD based on the first reference voltage code VREF PU CODE (operation S310).

The control/code generation circuit 450 inputs the pull-up control code PUCD to the replica pull-up driver 413 (operation S330). The second node N12 is driven based on the pull-up control code PUCD, the control/code generation circuit 450 calculates (generates) a second reference voltage code VREF PD CODE (i.e., RVPDC) based on comparing the second voltage VPD at the second node N12 with the selected reference voltage VREF_S (operation S400). The control/code generation circuit 450 generates the pull-down control code PDCD based on the second reference voltage code VREF PD CODE (operation S510). The control/code generation circuit 450 inputs the pull-up control code PUCD and the pull-down control code PDCD to the output driver 360 (operation S530).

Figure 28:
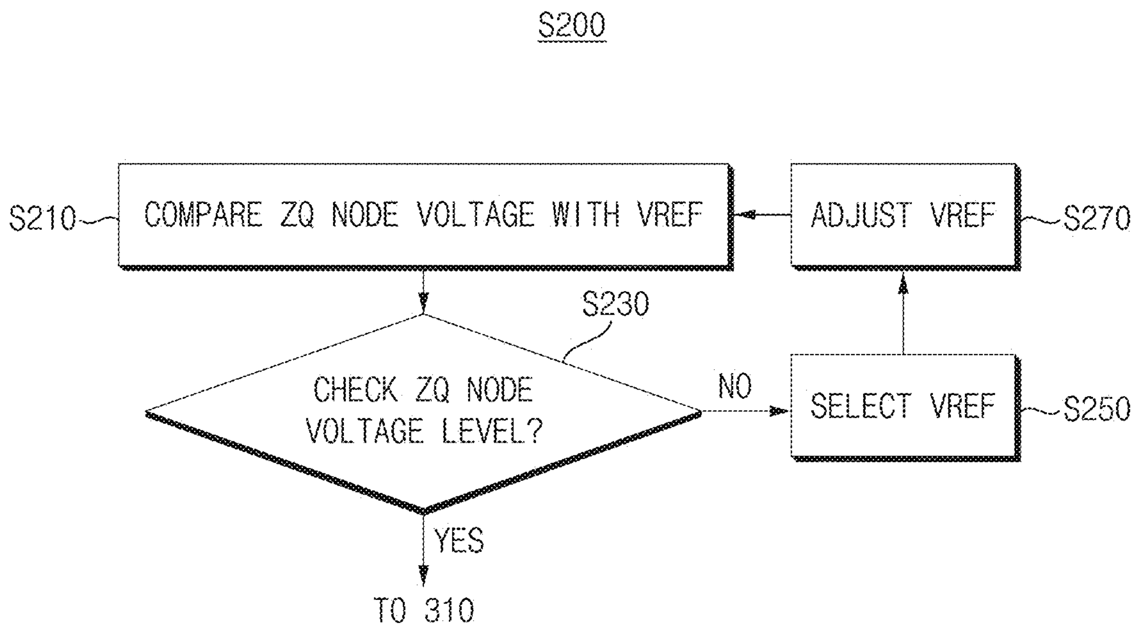
FIG. 28 is a flow chart illustrating an operation of generating the first reference voltage code in FIG. 27 according to example implementations.

FIG. 28 is a flow chart illustrating an operation of generating the first reference voltage code in FIG. 27 according to example implementations.

Referring to FIGS. 11, 12 and 28, for calculating the first reference voltage code VREF PU CODE (operation S200), the first comparator circuit 430 compares the first voltage VPU at the first node N11 (i.e. ZQ node) with the selected reference voltage VREF_S (operation S210) and the control/code generation circuit 450 determines whether the first voltage VPU is the same as the selected reference voltage VREF_S based on the first comparison signal CS1 (operation S230). That is, a voltage level of the ZQ node is checked. When the first voltage VPU is the same as the selected reference voltage VREF_S (YES in S230), the pull-up control code PUCD is generated (operation S310). When the first voltage VPU is not the same as the selected reference voltage VREF_S (NO in S230), the control/code generation circuit 450 selects a portion of a plurality of reference voltages (i.e., VREF) (operation S250), the control/code generation circuit 450 adjusts a voltage level of the selected reference voltage (operation S270) and the first comparator circuit 430 compares the first voltage VPU with level-adjusted selected reference voltage VREF_S (operation S210).

Figure 29:
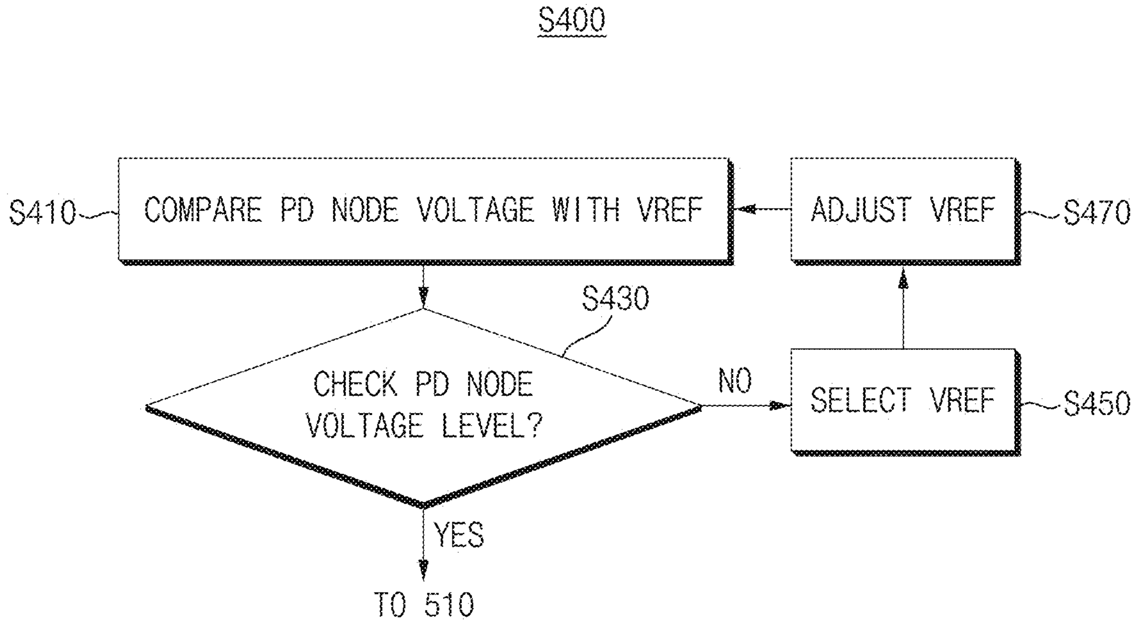
FIG. 29 is a flow chart illustrating an operation of generating the first reference voltage code in FIG. 27 according to example implementations.

FIG. 29 is a flow chart illustrating an operation of generating the first reference voltage code in FIG. 27 according to example implementations.

Referring to FIGS. 11, 12 and 29, for calculating the second reference voltage code VREF PS CODE (operation S400), the second comparator circuit 440 compares the second voltage VPD at the second node N12 (i.e. PD node) with the selected reference voltage VREF_S (operation S410) and the control/code generation circuit 450 determines whether the second voltage VPD is the same as the selected reference voltage VREF_S based on the second comparison signal CS2 (operation S430). That is, a voltage level of the PD node is checked. When the second voltage VPD is the same as the selected reference voltage VREF_S (YES in S430), the pull-down control code PDCD is generated (operation S510). When the second voltage VPD is not the same as the selected reference voltage VREF_S (NO in S430), the control/code generation circuit 450 selects a portion of a plurality of reference voltages (i.e., VREF) (operation S450), the control/code generation circuit 450 adjusts a voltage level of the selected reference voltage (operation S570) and the second comparator circuit 440 compares the second voltage VPD with level-adjusted selected reference voltage VREF_S (operation S410).

Figure 30:
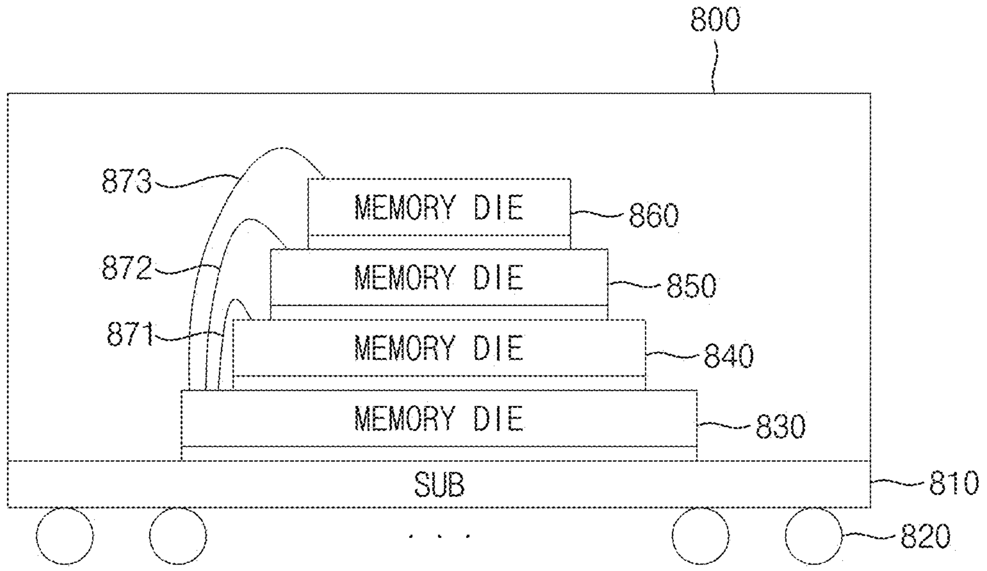
FIG. 30 is a schematic diagram of a multi-chip package including a semiconductor memory device according to example implementations.

FIG. 30 is a schematic diagram of a multi-chip package including a semiconductor memory device according to example implementations.

Referring to FIG. 30, a multi-chip package 800 may include a plurality of memory dies 830, 840, 850 and 860 which are sequentially stacked on a package substrate 810. The memory die 830 may be designated as a master die and the memory dies 840, 850 and 860 may be designated as slave dies. Each of the memory dies 830, 840, 850 and 860 may have substantially the same configuration of the memory die 200*a* in FIG. 3 or the memory die 200*a*_1 of FIG. 25.

A through-silicon via (TSV) (not shown), a bonding wire (not shown), a bump (not shown), or a solder ball 820 may be used to electrically connect the memory dies 830, 840, 850 and 860 with one other.

Each of the memory dies 830, 840, 850 and 860 may employ an above-described impedance calibration circuit. The master die 830 may be connected to the slave die 840 through a wire 871, may be connected to the slave die 850 through a wire 872 and may be connected to the slave die 860 through a wire 873.

Figure 31:
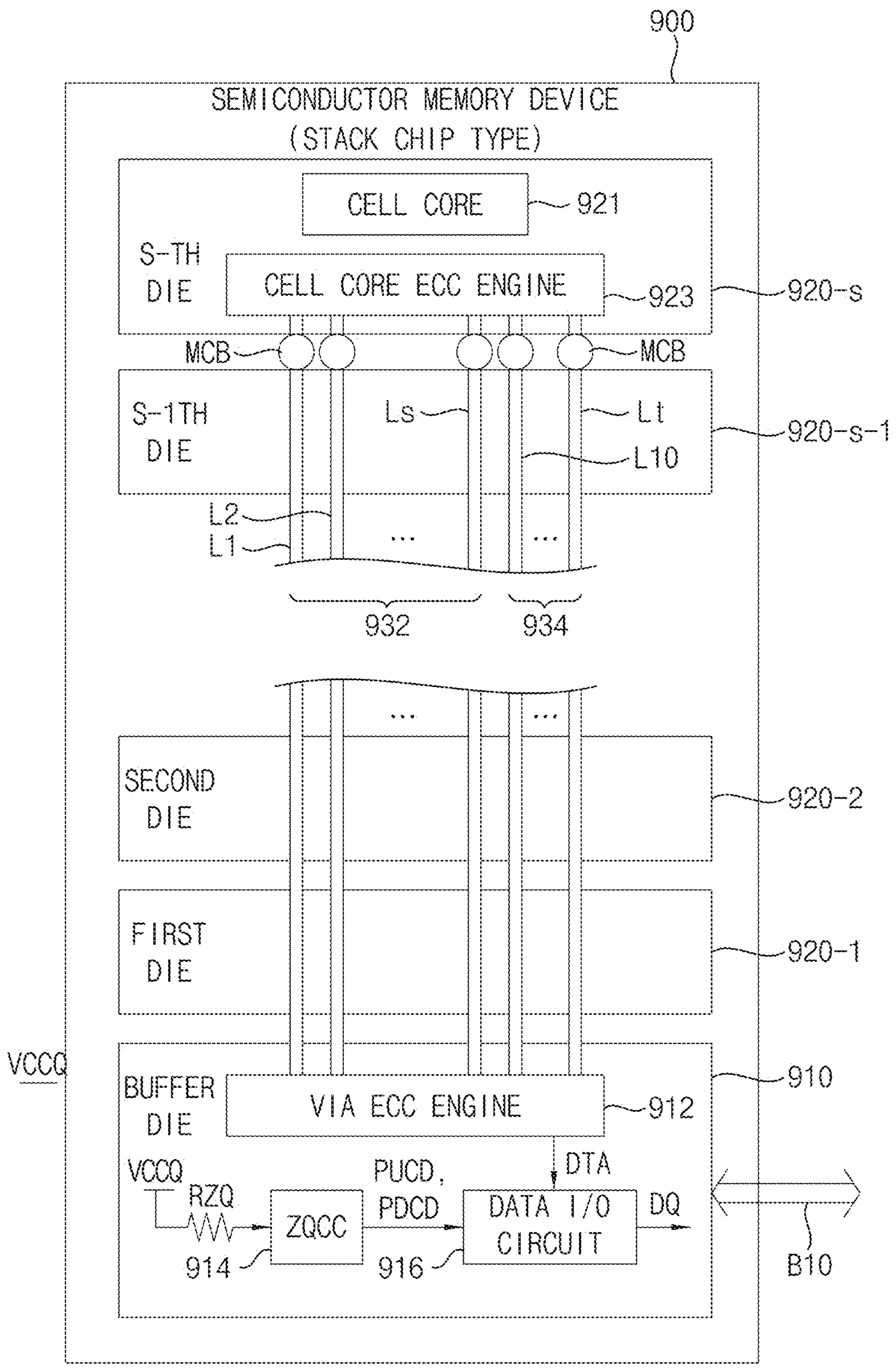
FIG. 31 is a block diagram illustrating a semiconductor memory device according to example implementations.

FIG. 31 is a block diagram illustrating a semiconductor memory device according to example implementations.

Referring to FIG. 31, a semiconductor memory device 900 may include at least one buffer die 910 and a plurality of memory dies 920-1 to 920-*s* (s is a natural number equal to or greater than three) providing a soft error analyzing and correcting function in a stacked chip structure.

The plurality of memory dies 920-1 to 920-*s* may be stacked on the buffer die 910, and may convey data through a plurality of through silicon via (TSV) lines.

Each of the memory dies 920-1 to 920-*s* may include cell core 921 to store data and a cell core ECC engine 923 to generate transmission parity bits (e.g., transmission parity data) based on transmission data to be sent to the at least one buffer die 910. The cell core 921 may include a plurality of memory cells having DRAM cell structure.

The buffer die 910 may include a via ECC engine 912, which may correct a transmission error using the transmission parity bits when a transmission error is detected from the transmission data received through the TSV lines, and generate error-corrected data.

The buffer die 910 may further include an impedance calibration circuit (ZQCC) 914 and a data I/O circuit 916. The impedance calibration circuit 914 may be connected to an external resistor RZQ coupled to the power supply voltage VCCQ.

The impedance calibration circuit 914 may employ an impedance calibration circuit including the calibration circuit 410*a* of FIG. 26B. The impedance calibration circuit 914 may provide a pull-up control code PUCD and a pull-down control code PDCD to the data I/O circuit 916. The data I/O circuit 916 may drive a data DTA provided from the via ECC engine 912 based on the pull-up control code PUCD and the pull-down control code PDCD to transmit a data signal DQ having a target VOH voltage to an external memory controller (for example, the memory controller 30).

The semiconductor memory device 900 may be, e.g., a stack chip type memory device or a stacked memory device that conveys data and control signals through the TSV lines. The TSV lines may be also called 'through electrodes'.

The cell core ECC engine 923 may perform error correction on data that is output from the memory die 920-*s* before the transmission data is sent.

A transmission error that occurs at the transmission data may be due to, e.g., noise that occurs at the TSV lines. Since a data failure due to the noise occurring at the TSV lines may be distinguishable from a data failure due to a false operation of the memory die, it may be regarded as soft data failure (or a soft error). The soft data failure may be generated due to a transmission failure on a transmission path and may be detected and remedied by an ECC operation.

A data TSV line group 932, which is formed at one memory die 920-*p*, may include TSV lines L1, L2 to Lt, and a parity TSV line group 934 may include TSV lines L10 to Ls.

The TSV lines L1, L2 to Lt of the data TSV line group 932 and the parity TSV lines L10 to Ls of the parity TSV line group 934 may be connected to micro bumps MCB, which are correspondingly formed among the memory dies 920-1 to 920-*s*.

The semiconductor memory device 900 may have a three-dimensional (3D) chip structure or a 2.5D chip structure to communicate with the host through a data bus B10. The buffer die 910 may be connected with the external memory controller through the data bus B10.

The cell core ECC engine 922 may output transmission parity bits as well as the transmission data through the parity TSV line group 934 and the data TSV line group 932 respectively. The output transmission data may be data that is error-corrected by the cell core ECC engine 923.

The via ECC engine 912 may determine whether a transmission error occurs at the transmission data received through the data TSV line group 932, based on the transmission parity bits received through the parity TSV line group 934. When a transmission error is detected, the via ECC engine 912 may correct the transmission error on the transmission data using the transmission parity bits. When the transmission error is uncorrectable, the via ECC engine 912 may output information indicating occurrence of an uncorrectable data error. When an error is detected from read data in a high bandwidth memory (HBM) or the stacked memory structure, the error may be an error occurring due to noise while data is transmitted through the TSV.

According to example implementations, as illustrated in FIG. 31, the cell core ECC engine 923 may be included in the memory die 920-*s*, and the via ECC engine 912 may be included in the buffer die 910. Accordingly, it may be possible to detect and correct a soft data failure. The soft data failure may include a transmission error that is generated due to noise when data is transmitted through TSV lines.

Figure 32:
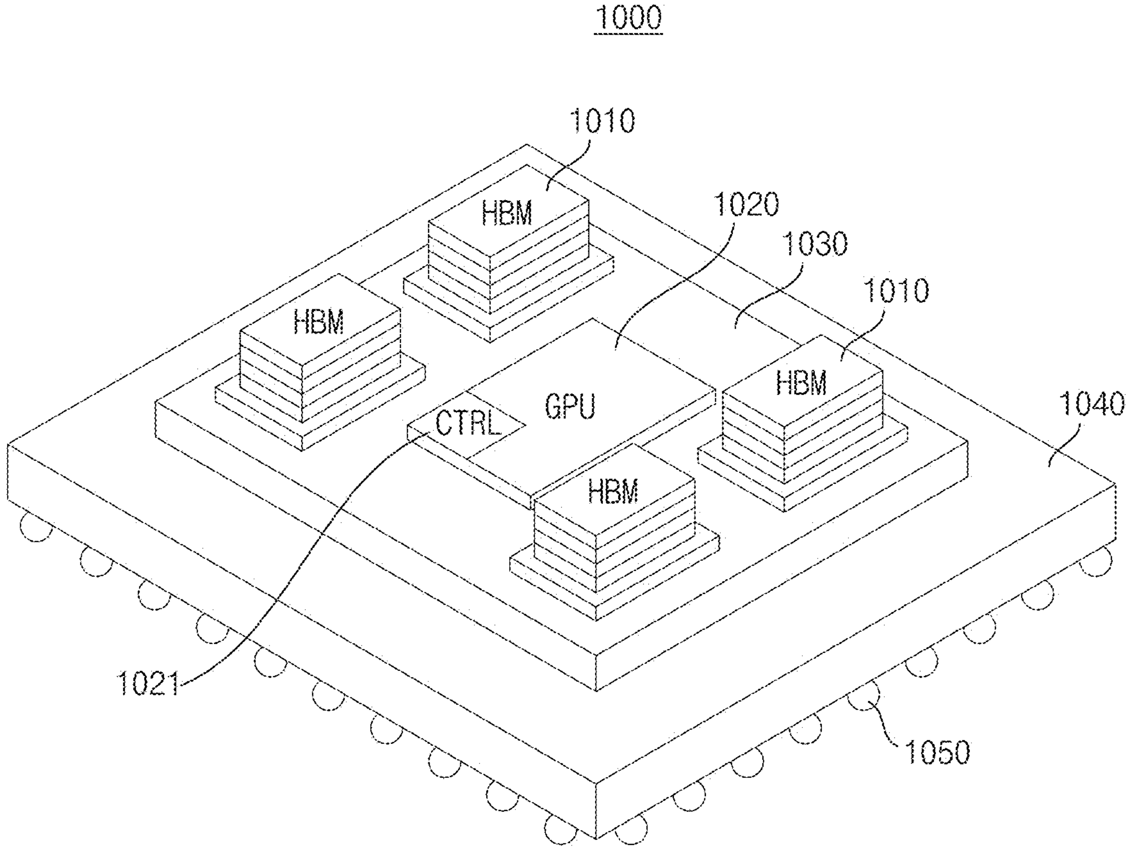
FIG. 32 is a configuration diagram illustrating a semiconductor package including the stacked memory device according to example implementations.

FIG. 32 is a configuration diagram illustrating a semiconductor package including the stacked memory device according to example implementations.

Referring to FIG. 32, a semiconductor package 1000 may include one or more stacked memory devices 1010 and a graphic processing unit (GPU) 1020.

The stacked memory devices 1010 and the GPU 1020 may be mounted on an interposer 1030, and the interposer on which the stacked memory device 1010 and the GPU 1020 are mounted may be mounted on a package substrate 1040 mounted on solder balls 1050. The GPU 1020 may correspond to a semiconductor device which may perform a memory control function, and for example, the GPU 1020 may be implemented as an application processor (AP). The GPU 1020 may include a memory controller CTRL 1021.

The stacked memory device 1010 may be implemented in various forms, and the stacked memory device 1010 may be a memory device in a high bandwidth memory (HBM) form in which a plurality of layers are stacked. Accordingly, the stacked memory device 1010 may include a buffer die and a plurality of memory dies and each of the plurality of memory dies include a cell core and a cell core ECC engine.

The plurality of stacked memory devices 1010 may be mounted on the interposer 1030, and the GPU 1020 may communicate with the plurality of stacked memory devices 1010. For example, each of the stacked memory devices 1010 and the GPU 1020 may include a physical region, and communication may be performed between the stacked memory devices 1010 and the GPU 1020 through the physical regions. Meanwhile, when the stacked memory device 1010 includes a direct access region, a test signal may be provided into the stacked memory device 1010 through conductive means (e.g., solder balls 1050) mounted under package substrate 1040 and the direct access region.

Figure 33:
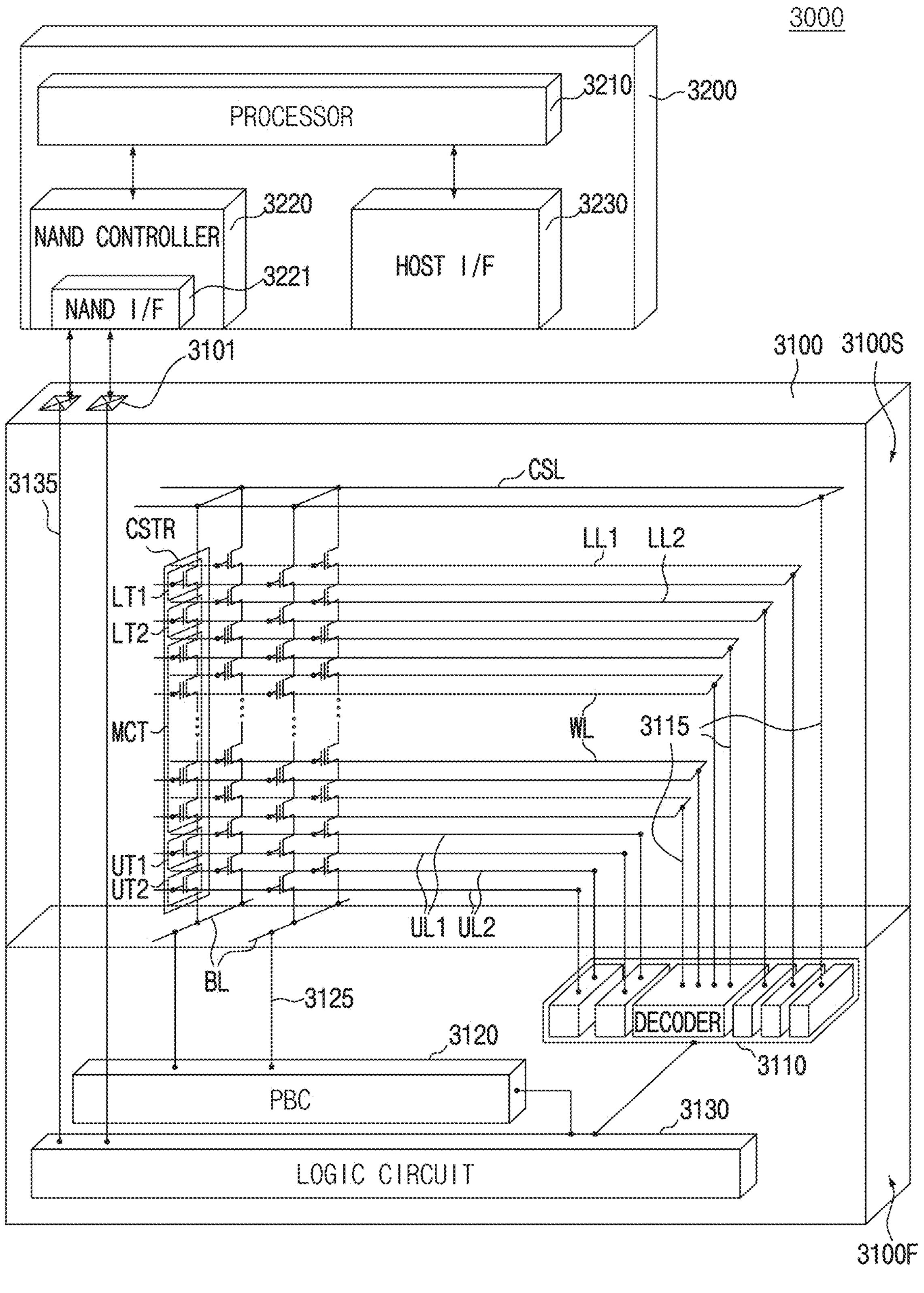
FIG. 33 is a block diagram illustrating an electronic system including a semiconductor device according to some example implementations.

FIG. 33 is a block diagram illustrating an electronic system including a semiconductor device according to some example implementations.

Referring to FIG. 33, an electronic system 3000 may include a semiconductor device 3100 and a controller 3200 electrically connected to the semiconductor device 3100. The electronic system 3000 may be a storage device including one or a plurality of semiconductor devices 3100 or an electronic device including a storage device. For example, the electronic system 3000 may be a solid state drive (SSD) device, a universal serial bus (USB), a computing system, a medical device, or a communication device that may include one or a plurality of semiconductor devices 3100.

The semiconductor device 3100 may be or may include a non-volatile memory device, for example, a nonvolatile memory device that is illustrated with reference to FIGS. 3 to 24. The semiconductor device 3100 may include a first structure 3100F and a second structure 3100S on the first structure 3100F. The first structure 3100F may be a peripheral circuit structure including a decoder circuit 3110, a page buffer circuit (PBC) 3120, and a logic circuit 3130. The second structure 3100S may be a memory cell structure including a bit-line BL, a common source line CSL, wordlines WL, first and second upper gate lines UL1 and UL2, first and second lower gate lines LL1 and LL2, and memory cell strings CSTR between the bit line BL and the common source line CSL.

In the second structure 3100S, each of the memory cell strings CSTR may include lower transistors LT1 and LT2 adjacent to the common source line CSL, upper transistors UT1 and UT2 adjacent to the bit-line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with example implementations.

In some example implementations, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In some example implementations, the lower transistors LT1 and LT2 may include a lower erase control transistor LT1 and a ground selection transistor LT2 that may be connected with each other in series. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 3110 through first connection wirings 3115 extending to the second structure 3110S from the first structure 3100F. The bit-lines BL may be electrically connected to the page buffer circuit 3120 through second connection wirings 3125 extending to the second structure 3100S from the first structure 3100F.

In the first structure 3100F, the decoder circuit 3110 and the page buffer circuit 3120 may perform a control operation for at least one selected memory cell transistor among the plurality of memory cell transistors MCT. The decoder circuit 3110 and the page buffer circuit 3120 may be controlled by the logic circuit 3130. The semiconductor device 3100 may communicate with the controller 3200 through an input/output pad 3101 electrically connected to the logic circuit 3130. The input/output pad 3101 may be electrically connected to the logic circuit 3130 through an input/output connection wiring 3135 extending to the second structure 3100S from the first structure 3100F.

The controller 3200 may include a processor 3210, a NAND controller 3220, and a host interface (I/F) 3230. The electronic system 3000 may include a plurality of semiconductor devices 3100, and in this case, the controller 3200 may control the plurality of semiconductor devices 3100.

The processor 3210 may control operations of the electronic system 3000 including the controller 3200. The processor 3210 may be operated by firmware, and may control the NAND controller 3220 to access the semiconductor device 3100. The NAND controller 3220 may include a NAND interface 3221 for communicating with the semiconductor device 3100. Through the NAND interface 3221, control commands for controlling the semiconductor device 3100, data to be written in the memory cell transistors MCT of the semiconductor device 3100, data to be read from the memory cell transistors MCT of the semiconductor device 3100, etc., may be transferred. The host interface 3230 may provide communication between the electronic system 3000 and an outside host. When a control command is received from the outside host through the host interface 3230, the processor 3210 may control the semiconductor device 3100 in response to the control command.

Example implementations may be applied to systems using semiconductor memory devices that include multi-dies. For example, implementations may be applied to systems such as be a smart phone, a navigation system, a notebook computer, a desk top computer, and a game console that use the semiconductor memory device as a working memory.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

While the present disclosure has been shown and described with reference to example implementations thereof, it will be apparent to those of ordinary skill in the art that many modifications in form and details may be made thereto without materially departing from the spirit and scope of the present disclosure as set forth by the following claims.

What is claimed is:

1. An impedance calibration circuit, comprising:

a calibration controller configured to receive an impedance calibration command and generate a calibration enable signal based on the impedance calibration command;

an oscillator configured to generate a clock signal in response to the calibration enable signal; and a calibration circuit connected to an external resistor provided in a board through an impedance pad, the calibration circuit being configured to, in response to the calibration enable signal:

generate a first reference voltage code based on a voltage level of a selected reference voltage becoming the same as a first voltage of a first node coupled to the impedance pad, the first voltage being based on an initial pull-up control code;

generate a pull-up control code for driving the first node based on the first reference voltage code;

generate a second reference voltage code based on the voltage level of the selected reference voltage becoming the same as a second voltage of a second node, the second voltage being based on the pull-up control code; and generate a pull-down control code for driving the second node based on the second reference voltage code, wherein the calibration circuit includes a pull-up driver coupled between a power supply voltage and the first node, the pull-up driver configured to drive the first node with the first voltage based on the initial pull-up control code, a first comparator circuit configured to generate a first comparison signal by comparing the first voltage with the selected reference voltage, a reference voltage generator configured to generate a plurality of reference voltages, a replica pull-up driver coupled between the power supply voltage and the second node, the replica pull-up driver configured to drive the second node with the second voltage based on the pull-up control code, a pull-down driver coupled between the second node and a ground voltage, a second comparator circuit configured to generate a second comparison signal by comparing the second voltage with the selected reference voltage, and a control/code generation circuit configured to select the selected reference voltage from among the plurality of reference voltages, generate the first reference voltage code based on the first comparison signal, generate the pull-up control code based on the first reference voltage code, generate the second reference voltage code based on the second comparison signal, generate the pull-down control code based on the second reference voltage code, and provide the pull-down control code to the pull-down driver, wherein the control/code generation circuit includes a selection signal generator configured to generate selection signals and inverted selection signals based on the clock signal, and a reference voltage selector configured to output the selected reference voltage by selecting at least a portion of the plurality of reference voltages based on the selection signals and the inverted selection signals during each of a plurality of cycles.

2. The impedance calibration circuit of claim 1, wherein the control/code generation circuit and the first comparator circuit constitute a first loop, the control/code generation circuit and the first comparator circuit being configured to generate the first reference voltage code and generate the pull-up control code based on the first reference voltage code, and wherein the control/code generation circuit and the second comparator circuit constitute a second loop, the control/code generation circuit and the second comparator circuit being configured to generate the second reference voltage code and generate the pull-down control code based on the second reference voltage code.

3. The impedance calibration circuit of claim 1, wherein the control/code generation circuit includes:

a first reference voltage code generator configured to generate the first reference voltage code when the voltage level of the selected reference voltage becomes the same as the first voltage based on the first comparison signal;

a pull-up code generator configured to generate the pull-up control code based on the clock signal and the first reference voltage code;

a second reference voltage code generator configured to generate the second reference voltage code when the voltage level of the selected reference voltage becomes the same as the second voltage based on the second comparison signal; and a pull-down code generator configured to generate the pull-down control code based on the clock signal and the second reference voltage code.

4. The impedance calibration circuit of claim 3, wherein the selection signal generator includes:

a sequence generator configured to, based on the clock signal, generate a plurality of sequence signals that are sequentially activated;

a cycle information generator configured to, based on the plurality of sequence signals, generate a plurality of cycle signals associated with the plurality of cycles;

a signal generator configured to generate the selection signals based on the plurality of cycle signals; and an inverter configured to generate the inverted selection signals by inverting the selection signals.

5. The impedance calibration circuit of claim 3:

wherein the reference voltage generator is a resistor-ladder type that includes a plurality of resistors connected in series between the power supply voltage and the ground voltage;

wherein the first comparator circuit includes a plurality of comparators and the plurality of comparators are configured to output a plurality of comparison signals as the first comparison signal by comparing the first voltage with a portion of the plurality of reference voltages; and wherein the first reference voltage code generator is configured to generate the first reference voltage code by encoding the plurality of comparison signals.

6. The impedance calibration circuit of claim 3, wherein the pull-up code generator includes:

a binary division circuit configured to generate a plurality of summed signals based on the clock signal and the first reference voltage code; and a shift register configured to generate bits of the pull-up control code sequentially based on the clock signal and a most significant summed signal from the plurality of summed signals.

7. The impedance calibration circuit of claim 6, wherein the binary division circuit includes:

a first group of D-flipflops that uses the clock signal and also uses first initial set values that are the same as the initial pull-up control code; and a plurality of full adders configured to generate the plurality of summed signals based on bits of the first reference voltage code and outputs of the first group of D-flipflops.

8. The impedance calibration circuit of claim 7, wherein the shift register includes a second group of D-flipflops being connected in series, wherein a first D-flipflop from the second group of D-flipflops is configured to output a first bit of the bits of the pull-up control code at an output terminal, based on the clock signal and the most significant summed signal, wherein one or more remaining D-flipflops from the second group of D-flipflops include a clock terminal receiving the clock signal, a data terminal and an output terminal, the data terminal of a D-flipflop of the one or more remaining D-flipflops being connected to the output terminal of an adjacent D-flipflop of the one or more remaining D-flipflops, and wherein each of the one or more remaining D-flipflops is configured to output a corresponding bit of the bits of the pull-up control code at respective one of the output terminals.

9. The impedance calibration circuit of claim 3, wherein the pull-up code generator includes:

a subtractor configured to generate a subtractor code based on the first reference voltage code;

a binary division circuit configured to generate a plurality of summed signals based on the clock signal and the subtractor code and provide a most significant summed signal from the plurality of summed signals; and a shift register configured to generate bits of the pull-up control code sequentially based on the clock signal and the most significant summed signal.

10. The impedance calibration circuit of claim 9, wherein the subtractor is configured to generate the subtractor code based on the first reference voltage code and two's complement of the first reference voltage code, and wherein the binary division circuit includes:

a first group of D-flipflops configured to use the clock signal and a first initial set value that is the same as the initial pull-up control code; and a plurality of full adders configured to generate the plurality of summed signals based on bits of the subtractor code and outputs of the first group of D-flipflops.

11. The impedance calibration circuit of claim 10, wherein the shift register includes a second group of D-flipflops that are serially connected, wherein a first D-flipflop from the second group of D-flipflops is configured to output a first bit of the bits of the pull-up control code at an output terminal, based on the clock signal and the most significant summed signal, wherein one or more remaining D-flipflops from the second group of D-flipflops include a clock terminal receiving the clock signal, a data terminal and an output terminal, the data terminal of a D-flipflop of the one or more remaining D-flipflops being connected to the output terminal of an adjacent D-flipflop of the one or more remaining the D-flipflops, and wherein each of the one or more remaining D-flipflops from the second group of D-flipflops is configured to output a corresponding bit of the bits of the pull-up control code at respective ones of the output terminals.

12. The impedance calibration circuit of claim 3, wherein the reference voltage generator includes a plurality of first resistors connected to the reference voltage selector in parallel with respect to each other and a plurality of second resistors, each of the plurality of second resistors being connected between the plurality of first resistors, and wherein a first resistance value of each of the plurality of first resistors is twice a second resistance value of each of the plurality of second resistors.

13. The impedance calibration circuit of claim 3, wherein the reference voltage selector includes a plurality of switches configured to output the selected reference voltage by selecting at least the portion of the plurality of reference voltages based on a plurality of switching signals and a plurality of inverted switching signals, wherein the first comparator circuit includes a first comparator configured to output the first comparison signal by comparing the first voltage with the selected reference voltage, and wherein the first reference voltage code generator includes an encoder configured to generate the plurality of switching signals, the plurality of inverted switching signals and the first reference voltage code, based on the first comparison signal.

14. A semiconductor memory device comprising:

an external resistor provided in a board; and a plurality of memory dies mounted on the board and commonly connected to the external resistor, wherein each of the plurality of memory dies includes an impedance calibration circuit connected to the external resistor through an impedance pad, wherein the impedance calibration circuit, in response to an impedance calibration command, is configured to perform an impedance calibration operation by:

generating a first reference voltage code based on a voltage level of a selected reference voltage becoming the same as a first voltage of a first node coupled to the impedance pad, the first voltage being based on an initial pull-up control code;

generating a pull-up control code for driving the first node based on the first reference voltage code;

generating a second reference voltage code based on the voltage level of the selected reference voltage becoming the same as a second voltage of a second node, the second voltage being based on the pull-up control code; and generating a pull-down control code for driving the second node based on the second reference voltage code, wherein the impedance calibration circuit includes a calibration controller configured to receive the impedance calibration command and generate a calibration enable signal based on the impedance calibration command;

an oscillator configured to generate a clock signal in response to the calibration enable signal; and a calibration circuit connected to the external resistor through the impedance pad, the calibration circuit configured to perform the impedance calibration operation in response to the calibration enable signal, wherein the calibration circuit includes a pull-up driver coupled between a power supply voltage and the first node, the pull-up driver configured to drive the first node with the first voltage based on the initial pull-up control code;

a first comparator circuit configured to generate a first comparison signal by comparing the first voltage with the selected reference voltage;

a reference voltage generator configured to generate a plurality of reference voltages;

a replica pull-up driver coupled between the power supply voltage and the second node, the replica pull-up driver configured to drive the second node with the second voltage based on the pull-up control code;

a pull-down driver coupled between the second node and a ground voltage;

a second comparator circuit configured to generate a second comparison signal by comparing the second voltage with the selected reference voltage; and a control/code generation circuit configured to select the selected reference voltage from among the plurality of reference voltages;

generate the first reference voltage code based on the first comparison signal;

generate the pull-up control code based on the first reference voltage code;

generate the second reference voltage code based on the second comparison signal;

generate the pull-down control code based on the second reference voltage code; and provide the pull-down control code to the pull-down driver, wherein the control/code generation circuit includes a selection signal generator configured to generate selection signals and inverted selection signals based on the clock signal, and a reference voltage selector configured to output the selected reference voltage by selecting at least a portion of the plurality of reference voltages based on the selection signals and the inverted selection signals during each of a plurality of cycles.

15. The semiconductor memory device of claim 14, wherein each of the plurality of memory dies is a nonvolatile memory device, wherein the nonvolatile memory device includes:

a memory cell array includes a plurality of nonvolatile memory cells;

a page buffer circuit connected to the memory cell array through a plurality of bit-lines; and a data input/output (I/O) circuit connected to the page buffer circuit, the data I/O circuit including an output driver, and wherein the impedance calibration circuit is configured to apply the pull-up control code and the pull-down control code to the output driver.

16. The semiconductor memory device of claim 14, wherein each of the plurality of memory dies is a volatile memory device, wherein the volatile memory device includes:

a memory cell array including a plurality of volatile memory cells;

an input/output (I/O) gating circuit connected to the memory cell array through a plurality of bit-lines; and a data I/O circuit connected to the I/O gating circuit, the data I/O circuit including an output driver, and wherein the impedance calibration circuit is configured to apply the pull-up control code and the pull-down control code to the output driver.

17. The semiconductor memory device of claim 14, wherein, one of the plurality of memory dies is designated as a master die and a rest of the plurality of memory dies except the master die is designated as a plurality of slave dies, the master die is mounted on the board;

the plurality of slave dies are stacked on the master die; and the master die is connected to respective ones of the plurality of slave dies through respective ones of a plurality of wires.

18. An impedance calibration circuit, comprising:

a calibration controller configured to receive an impedance calibration command and generate a calibration enable signal based on the impedance calibration command;

an oscillator configured to generate a clock signal in response to the calibration enable signal; and a calibration circuit connected to an external resistor provided in a board through an impedance pad, the calibration circuit, in response to the calibration enable signal, configured to:

generate a first reference voltage code based on a voltage level of a selected reference voltage becoming the same as a first voltage of a first node coupled to the impedance pad, the first voltage being based on an initial pull-down control code;

generate a pull-down control code for driving the first node based on the first reference voltage code;

generate a second reference voltage code based on the voltage level of the selected reference voltage becoming the same as a second voltage of a second node, the second voltage being based on the pull-down control code; and generate a pull-up control code for driving the second node based on the second reference voltage code, and wherein the calibration circuit includes:

a pull-down driver coupled between the first node and a ground voltage, the pull-down driver configured to drive the first node with the first voltage based on the initial pull-down control code;

a first comparator circuit configured to generate a comparison signal by comparing the first voltage with the selected reference voltage;

a reference voltage generator configured to generate a plurality of reference voltages; and a control/code generation circuit configured to:

select the selected reference voltage from among the plurality of reference voltages;

generate the first reference voltage code based on the first comparison signal;

generate the pull-down control code based on the first reference voltage code; and provide the pull-down control code to the pull-down driver, wherein the control/code generation circuit includes a selection signal generator configured to generate selection signals and inverted selection signals based on the clock signal, and a reference voltage selector configured to output the selected reference voltage by selecting at least a portion of the plurality of reference voltages based on the selection signals and the inverted selection signals during each of a plurality of cycles.

* * * * *